United States Patent [19]

Ogawa et al.

[11] 4,381,469
[45] Apr. 26, 1983

[54] TEMPERATURE STABLE PIEZOELECTRIC DEVICE

[75] Inventors: Toshio Ogawa, Kyoto; Kikuo Wakino, Muko, both of Japan

[73] Assignee: Murata Manufacturing Company, Ltd., Japan

[21] Appl. No.: 169,165

[22] Filed: Jul. 15, 1980

[30] Foreign Application Priority Data

| Jul. 20, 1979 [JP] | Japan | 54/92803 |
| Sep. 3, 1979 [JP] | Japan | 54/113412 |
| Oct. 2, 1979 [JP] | Japan | 54/137176[U] |

[51] Int. Cl.³ .................................. H01L 41/08
[52] U.S. Cl. ........................... 310/313 R; 310/346; 333/155; 357/26
[58] Field of Search ............. 310/315, 334, 346, 363, 310/364, 366, 313 R, 313 A–313 D, 318, 319; 357/26, 28; 333/155; 331/107 A, 116 R, 116 FE, 158, 176

[56] References Cited

U.S. PATENT DOCUMENTS

| 3,176,244 | 3/1965 | Newell et al. | 310/315 |
| 3,397,329 | 8/1968 | Riedel | 310/315 |
| 4,021,657 | 5/1977 | Auld | 310/313 B |

FOREIGN PATENT DOCUMENTS 55-141814 11/1980 Japan .................. 333/155

*Primary Examiner*—J. D. Miller
*Assistant Examiner*—D. L. Rebschi
*Attorney, Agent, or Firm*—Ostrolenk, Faber, Gerb & Soffen

[57] ABSTRACT

A piezoelectric device comprises a ferroelectric ceramic plate as polarized, and electrodes formed on two main surfaces thereof, respectively, intersecting the polarization axis direction. The electrodes are connected to each other by means of an external resistance having a predetermined resistance value. The resistance value is selected to be smaller than the inherent resistance value of the ferroelectric ceramic plate between the two main surfaces. The positive and negative electric charges are stored on the two electrodes due to the pyroelectric effect responsive to a change of the temperature of the ferroelectric ceramic plate. The potential difference caused by the electric charges thus stored is rapidly decreased through the external resistance.

17 Claims, 98 Drawing Figures

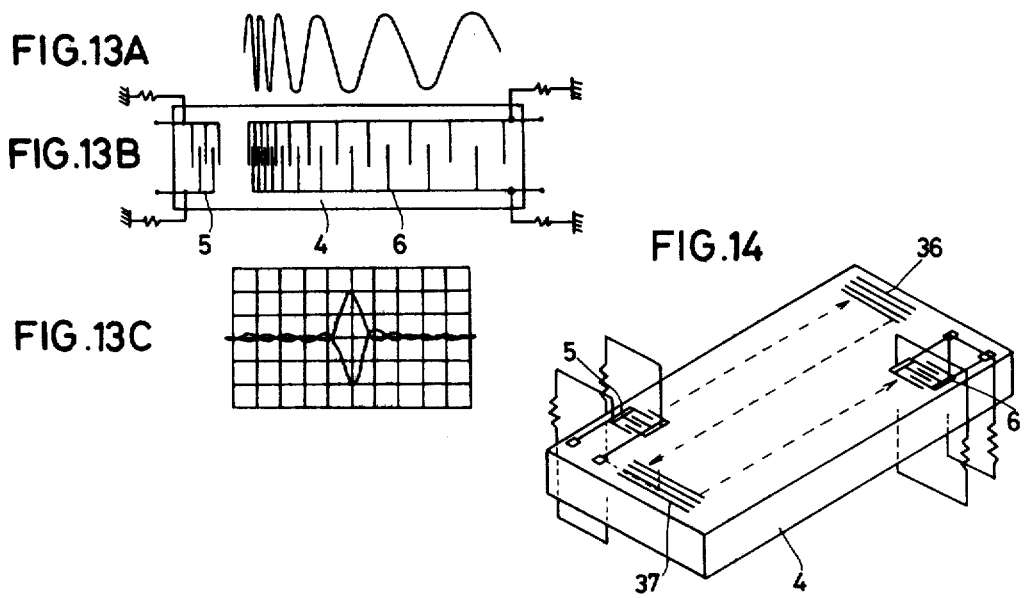
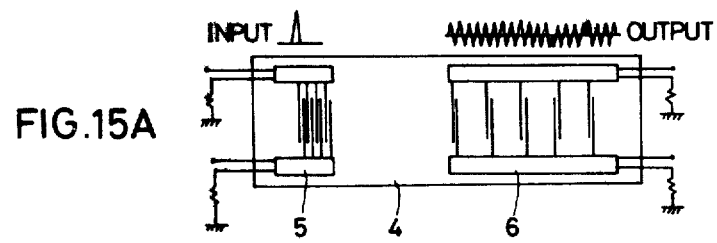
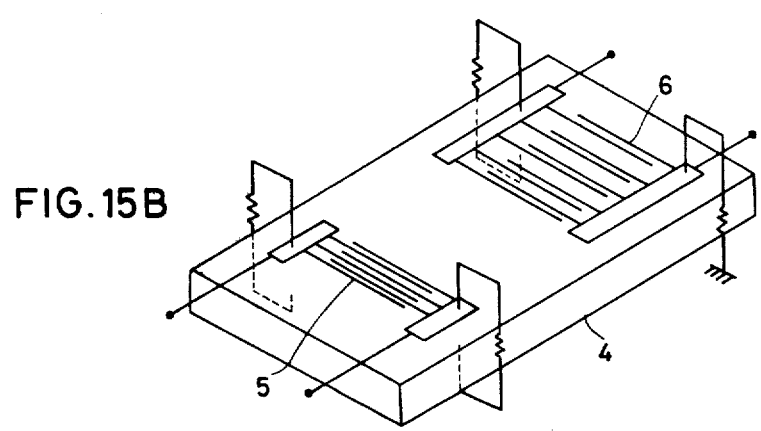

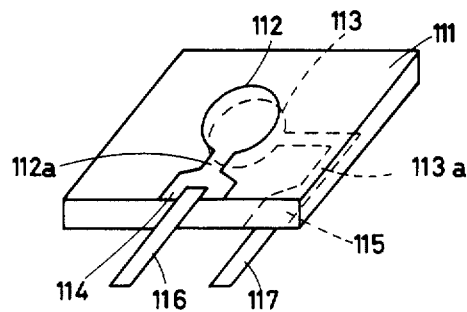
FIG.57
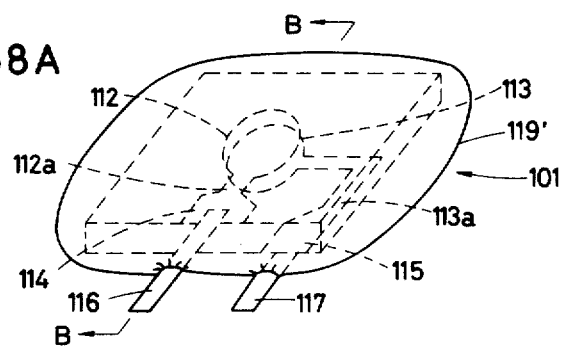
FIG.58A
FIG.58B
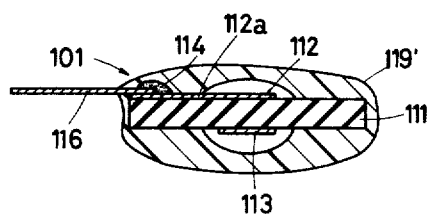
FIG.59
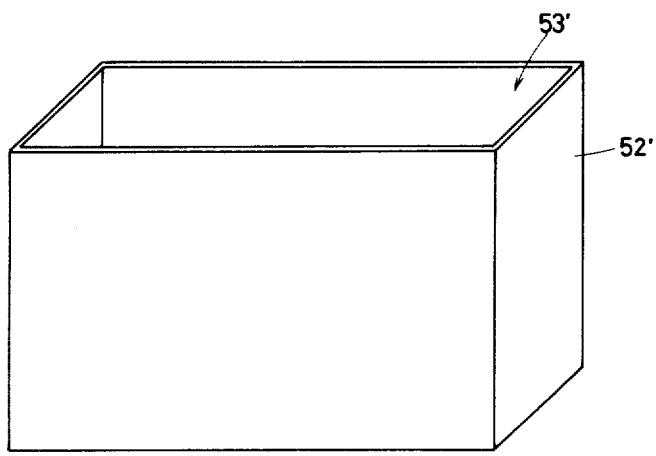

TEMPERATURE STABLE PIEZOELECTRIC DEVICE

BACKGROUND OF THE INVENTION

1. Field of the Invention

The present invention relates to a piezoelectric device. More specifically, the present invention relates to a piezoelectric device utilizing a characteristic of a piezoelectric member as polarized, such as a surface acoustic wave device, a bulk wave piezoelectric resonator device, a piezoelectric transducer, a mechanical resonator device including a piezoelectric transducer and an electroacoustic transducer and the like.

2. Description of the Prior Art

A surface acoustic wave device comprising a surface acoustic wave filter, a surface acoustic wave resonator, a surface acoustic wave delay line and so on is typically composed of a ceramic material having a piezoelectric effect. A typical material comprises ceramics of a barium titanate group, a lead titanate group, a lead titanate zirconate group and the like. Likewise, a bulk wave piezoelectric resonator device is comprised of a ceramic material having a piezoelectric effect. A typical material comprises ceramics of a barium titanate group, a lead titanate group, a lead titanate zirconate group and the like. Of late, a bulk wave piezoelectric resonator device has been used as various kinds of filters, traps, discriminators, oscillators and the like. A piezoelectric device further comprises a piezoelectric transducer, and a mechanical resonator device and an electroacoustic transducer employing such piezoelectric transducer. A piezoelectric transducer also employs, as a typical material, ceramics of a barium titanate group, a lead titanate group, a lead titanate zirconate group and the like. A piezoelectric tuning fork and an electrochemical filter are known as typical examples of a mechanical resonator using a piezoelectric transducer and are used as a selecting device or used as an oscillator in receivers, remote control systems, pocket bells and the like. An electroacoustic transducer employing a piezoelectric ceramic transducer is typically used in a microphone, a pickup, a cartridge, a speaker, a buzzer, a sonar, a ultrasonic cleaner, an ultrasonic machinery, a remote control apparatus and the like, depending upon classifications in terms of applications and the frequency being used ranges from several Hz to several hundreds kHz, with diversification of a vibration wave format from a very low frequency vibration to an audible sound and ultrasonic wave.

A device of high reliability is required in such types of piezoelectric devices and particularly a device of a stabilized characteristic with respect to the environment, particularly an environmental temperature and an elevated temperature.

However, according to a conventional device, a phenomenon often occurred in which a piezoelectric characteristic is degraded when the device is placed in a severe temperature environment and an elevated temperature environment, which was observed by a test called as a special test such as a heat shock test and a high temperature test. Therefore, conventionally various kinds of improvements were proposed; however, a most appropriate approach has not yet been found.

Generally, a ferroelectric plate used in a piezoelectric device must meet the following requirements as important characteristics, i.e. (1) in the case of a filter, for example, an insertion loss, a center frequency and the like will not change depending on the temperature variation, and (2) in the case of a transducer, for example, an electromechanical coupling coefficient is large, and so on. For example, it has been proposed that various kinds of additives are added to a main constituent of ceramics of a lead titanate zirconate group, for example, with an attempt to improve the characteristic by selection of the materials per se. In fact an improvement can be seen to some extent in a heat shock test and a high temperature aging test by thus changing the materials per se, whereby the above described characteristic (1) might be fulfilled; however, conversely a phenomenon was observed in which the above described characteristic (2) is degraded.

Furthermore, attempts have been made to improve the above described characteristic (1) by selecting the firing conditions; however, a disadvantage is brought about that the above described characteristic (2) is diversified or degraded, while a control of such firing conditions is difficult and the approach is not suited for production on an industrial basis.

SUMMARY OF THE INVENTION

A piezoelectric device in accordance with the present invention comprises a ferroelectric plate as polarized, and two members formed on and in electrical contact with the surfaces thereof intersecting the polarization axis direction of the ferroelectric plate. A kind of electric charge is caused and stored on the two members due to a change of the temperature of the ferroelectric plate, whereby a potential difference is generated. According to the present invention, potential difference decreasing means is provided in electrical contact with at least one of the two members for the purpose of decreasing the above described potential difference.

According to the present invention, a counterelectric field developed across the ferroelectric plate due to the electric charges caused by the pyroelectric effect is rapidly decreased. Therefore, degradation of the piezoelectric characteristic such as a depolarization of the ferroelectric plate as polarized caused by a change of the temperature of the ferroelectric plate is prevented. More specifically, according to the present invention, the electric charges generated on the ferroelectric plate due to a change of the temperature thereof are discharged through an external electric circuit. Accordingly, the inventive piezoelectric device is free from necessity of changing the composition of the material per se of the ferroelectric plate for the purpose of eliminating the above described piezoelectric characteristic and as a result a piezoelectric device having a stabilized piezoelectric characteristic with respect to a change of the temperature is provided with a simple scheme without adversely affecting the other piezoelectric characteristics. Therefore, in manufacturing piezoelectric devices on an industrial basis, a mass productivity and yield rate can be enhanced. Furthermore, since the inventive piezoelectric device has a stabilized characteristic to a changing temperature environment and a high temperature environment, a piezoelectric device of an extremely high reliability is provided.

In a preferred embodiment of the present invention, the piezoelectric device comprises a surface acoustic wave device comprising an interdigital electrode formed on the ferroelectric plate. A ground electrode or other member is electrically connected to the other surface of the ferroelectric plate. The interdigital electrode and the ground electrode or the other member are electrically connected through a resistive component having a predetermined resistance value. Such resistive component may comprise a resistive paste, a resistive resin material or the like. Therefore, according to the preferred embodiment of the present invention in discussion, a surface acoustic wave device exhibiting a stabilized characteristic, namely, little change or shift of the center frequency, the insertion loss and the like with respect to a changing temperature environment or a high temperature environment can be provided in accordance with a simple scheme. By employing a resistive paste as the resistive component, the resistive component can be formed in accordance with a simple method such as baking, coating or the like. Therefore, the mass productivity and the yield rate are drastically improved. By forming the resistive component with a resistive resin material, a resin outer coating of the surface acoustic wave device may be formed with a resistive resin layer and as a result no particular step is required in addition to a conventional resin outer coating of the surface acoustic wave device. Furthermore, in employing a conventional resin coating, a resin coated surface acoustic wave element may be housed within a metallic casing and a filling or potting meterial made of a resistive resin material may be filled therebetween, without necessity of any particular step.

In another preferred embodiment of the present invention, the interdigital electrode and the ground electrode of the surface acoustic wave device are connected to the ground potential. The interdigital electrode is connected to the ground through a resistive component having a predetermined resistance value. Even by connecting to the ground potential the two electrodes where the electric charges due to a change of the temperature are stored, the above described counterelectric field can be rapidly decreased and a depolarization of the ferroelectric plate can be effectively prevented. Even in accordance with the preferred embodiment in discussion, the manufacturing process and the structure are extremely simple. In particular, the embodiment is advantageous when the surface acoustic wave device is structured as a hermetic seal type.

In a further preferred embodiment of the present invention, the piezoelectric device comprises a pair of vibrating electrodes formed on the ferroelectric plate. The pair of vibrating electrodes are electrically connected through a resistive component having a predetermined resistance value. Such resistive component may comprise a resistive paste, a resistive resin material or the like. According to the further preferred embodiment in discussion, a piezoelectric device of a stabilized characteristic, namely, little change of characteristic in a changing temperature environment or a high temperature environment can be provided in accordance with a simple structure and method. By employing a resistive paste as the resistive component, the resistive component can be formed in accordance with a simple method such as baking, coating or the like. Therefore, the mass productivity and the yield rate are drastically improved. By forming the resistive component with a resistive resin material, a resin outer coating of the piezoelectric device may be formed as a resistive resin layer and no extra step is required in addition to a conventional resin outer coating for the piezoelectric device. In employing a conventional resin material, a resonator element is housed in a metallic casing and a filling or potting material of a resistive resin material may be filled therebetween, without necessity of any particular step.

In still a further preferred embodiment of the present invention, each of the pair of vibrating electrodes of the piezoelectric device is connected through a resistive component having a predetermined resistance value. Even by connecting to the ground potential these two vibrating electrodes in which the electric charges are stored due to a change of the temperature, the above described counterelectric field can be rapidly decreased and depolarization of the ferroelectric plate can be effectively prevented. Even according to the further preferred embodiment in discussion, the manufacturing process and the structure may be extremely simple.

Accordingly, a principal object of the present invention is to provide an improved piezoelectric device.

Another object of the present invention is to provide a piezoelectric device which solves a problem of materials by means of an external circuit.

A further object of the present invention is to provide a piezoelectric device having a stabilized characteristic with respect to a severe changing temperature environment and a high temperature environment.

Still a further object of the present invention is to provide a stabilized piezoelectric device in accordance with a simple manufacturing method and structure.

It is another object of the present invention to provide a piezoelectric device exhibiting no degradation of the characteristic in a severe changing temperature environment or a high temperature environment in accordance with a simple manufacturing process.

It is a further object of the present invention to provide an improved piezoelectric device of a good mass productivity.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a surface acoustic wave filter in accordance with one embodiment of the present invention, wherein

FIGS. 2 and 3 show a modification of the FIG. 1 embodiment, wherein FIG. 2 is a partial enlarged plan view and FIG. 3 is a partial enlarged sectional view;

FIG. 5 shows a schematic diagram of an electrical circuit for a heat shock test, wherein

FIG. 12 shows another implementation of a surface acoustic wave filter in accordance with one embodiment of the present invention, wherein

FIG. 13 is a view showing one example of a pulse compression apparatus in accordance with one embodiment of the present invention, wherein FIG. 13A shows a chirp signal, FIG. 13B shows an outline plan view of a pulse compression device, and FIG. 13C shows an output wave;

FIG. 14 is a perspective view showing one example of a surface acoustic wave delay line in accordance with the present invention;

FIG. 15 is a diagram showing another example of a surface acoustic wave delay line, wherein FIG. 15A is a plan view and FIG. 15B is a perspective view;

FIG. 27 is a view showing a further example of a surface acoustic wave filter in accordance with one embodiment of the present invention, wherein

FIGS. 57 to 61 are views showing in succession the steps of a process for manufacturing one example of an energy trapped piezoelectric ceramic resonator in accordance with one embodiment of the present invention;

FIGS. 62 and 63 are views showing one example of a conventional piezoelectric tuning fork wherein the present invention can be practiced, wherein FIG. 62 is an outline plan view with a casing removed and FIG. 63 is an outline front view with a casing removed;

DESCRIPTION OF THE PREFERRED EMBODIMENTS

The present invention can be applied to any types of piezoelectric devices employing a piezoelectric member as polarized, such as a surface acoustic wave device, a bulk wave piezoelectric resonator device, a piezoelectric transducer, a mechanical resonator device including a piezoelectric transducer and an electroacoustic transformer, and the like. In the following, therefore, various embodiments and modifications will be described in detail.

Figure 1A:
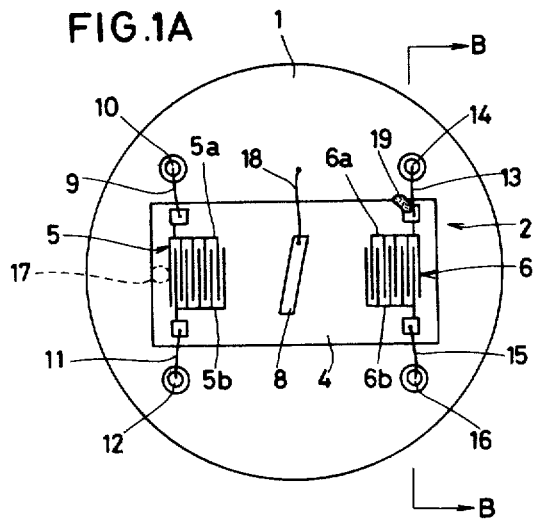
FIG. 1A is an outline plan view of the same and FIG. 1B is a sectional view of the same taken along the line B—B in FIG. 1A.
Figure 1B:
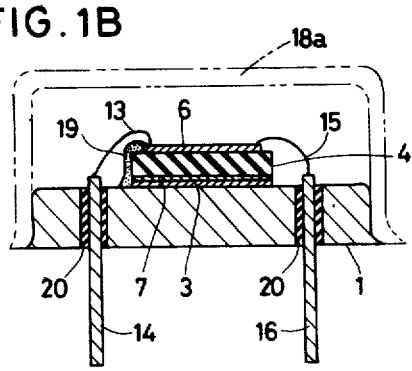

FIGS. 1A and 1B show a hermetic seal type acoustic surface wave filter, which is well-known among various kinds of surface acoustic wave devices. Referring to FIGS. 1A and 1B, a surface acoustic wave filter 2 is fixed on a conductive hermetic base 1 with a conductive adhesive agent 3.

The surface acoustic wave filter 2 comprises a ferroelectric ceramic plate 4 made of a lead titanate zirconate group, for example. The plate 4 is provided with an input interdigital transducer 5 and an output interdigital transducer 6 on one main surface thereof. A ground electrode 7 is formed on the other main surface of the ceramic plate 4 so as to be faced to the input interdigital transducer 5 and the output interdigital transducer 6. The surface of the ground electrode 7 of the ceramic plate 4 is fixed to the hermetic base 1 with the conductive adhesive agent 3. The polarization direction of the ceramic plate 4 is selected in the thickness direction of the ceramic plate 4, i.e. the direction normal to the surfaces where the input interdigital transducer 5, the output interdigital transducer 6 and the ground electrode 7 are formed. A shield electrode 8 may be formed, as necessary, between the input interdigital transducer 5 and the output interdigital transducer 6 on one main surface of the ceramic plate 4.

The input interdigital transducer 5 comprises comb shaped electrodes 5a and 5b interdigitated to each other, the comb shaped electrodes 5a and 5b being electrically connected to pin terminals 10 and 12 through lead wires 9 and 11, respectively. The pin terminals 10 and 12 are electrically isolated from the hermetic base 1 by means of an insulation 20. The output interdigital transducer 6 comprises comb shaped electrodes 6a and 6b interdigitated to each other, the comb shaped electrodes 6a and 6b being electrically connected to pin terminals 14 and 16 through lead wires 13 and 15, respectively. The pin terminals 14 and 16 are electrically isolated from the hermetic base 1 by means of the insulation 20. The ground electrode 7 is electrically connected to the pin terminal 17 through the conductive adhesive agent 3 and the hermetic base 1. The shield electrode 8 is electrically connected to the hermetic base 1 through the lead wire 18.

The hermetic base 1 for fixing the acoustic surface wave filter 2 is covered with a hermetic cap 18, as shown by the dotted line in FIG. 1B.

A characteristic portion of the surface acoustic wave filter shown resides in electrical connection between the comb shaped electrode 6a of the output interdigital transducer 6 and the hermetic base 1 being forced to the ground potential [via resistor 19], as shown in FIG. 1. Referring again to FIGS. 1A and 1B, the comb shaped electrode 6a and the hermetic base 1 are shown electrically connected by means of a resistor 19, as shown. The resistor 19 is formed by painting a resistive paste and by baking the same.

Although not shown in the figure, the comb shaped electrodes 5a and 5b of the input interdigital transducer 5 and the comb shaped electrode 6b of the output interdigital transducer 6 may also be electrically connected to the hermetic base 1 directly or through a resistive component.

Figure 2:
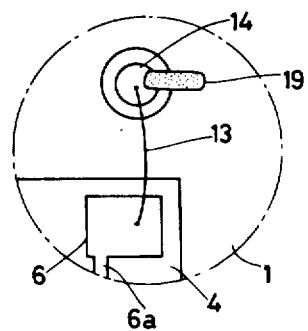
Figure 3:
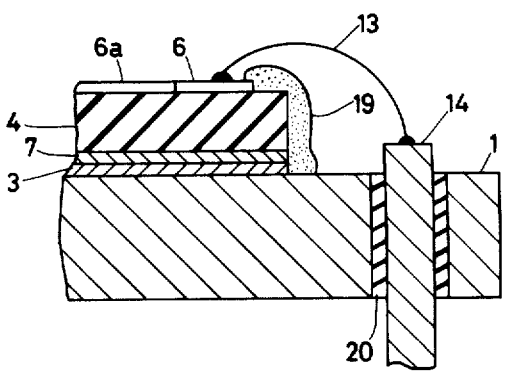

Furthermore, as shown in FIG. 2, the pin terminal 14 and the base 1 may be electrically connected by means of a resistor or a resistive paste 19. In such a case, the electrical connection becomes the same as shown in FIG. 1. Other comb shaped electrodes 5a, 5b and 6b may also be structured as shown in FIG. 3. In other words, the respective pin terminals 10, 12 and 16 and the base 1 may be electrically connected by means of resistors or resistive components.

As shown in FIG. 3, alternatively the comb shaped electrode 6a may be electrically connected to the ground electrode 7 through a resistor or a resistive paste 19. Other comb shaped electrodes 5a, 5b and 6b may also be likewise structured. Referring to FIG. 3, the pin terminal 14 is usually fixed to the hermetic base through an insulation 20, although the invention is not limited to the illustration. By forming the insulation 20 with a resistive material, it follows that the comb shaped electrode 6a is electrically connected to the hermetic base 1 through the lead wire 13, the pin terminal 14 and the above described resistor. The other pin terminals 10, 12 and 16 and the insulation 20 therearound may also be similarly structured.

Figure 4:
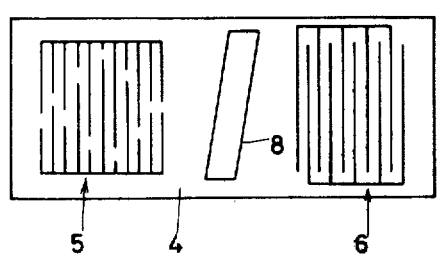
FIG. 4 is a view showing a structure of an interdigital transducer of a surface acoustic wave filter.

A heat shock test was conducted with respect to the thus structured surface acoustive wave filter to evaluate the characteristic thereof. The acoustic surface wave filter of the following structure was employed for that purpose. More specifically, the ceramic plate 4 was made of ceramics of a lead titanate zirconate group including as a main constituent $0.05Pb(Sn_1Sb_1)O_3$-$0.35PbTiO_3$-$0.60PbZrO_3$ and as an additive 0.6 wt% of $MnO_2$. The size of the ceramic plate 4 was 10 mm long, 3 mm wide and 0.5 mm thick. The resistance value of the ceramic plate 4 itself was approximately $5 \times 10^{11} \Omega$ in the thickness direction and the polarization direction was in the thickness direction of the ceramic plate 4. As shown in FIG. 4, the input interdigital transducer 5 was of a weighted electrode in accordance with the apodizing method and the output interdigital transducer 6 was of a normal type electrode. The wave length of the surface acoustic wave was selected to be 56 μm and the central frequency was selected to be 45 MHz.

Now referring again to FIG. 1, the comb shaped electrodes 5a and 5b of the input interdigital transducer 5 and the hermetic base 1 were electrically connected through a resistor and the comb shaped electrodes 6a and 6b of the output interdigital transducer 6 and the hermetic base 1 were electrically connected through a resistor. The resistor corresponding to the resistor "19" in FIG. 1 was formed using a metal oxide material and the resistance value was selected to be 1 kΩ, 100 kΩ, 10 MΩ, and 1000 MΩ. Furthermore, the example of a fixed resistor element of 10 MΩ used for electrical connection in place of the coated and baked thick film resistor was also fabricated. Then a heat shock test was conducted. The conditions for the heat shock test were as follows. More specifically, the heat shock test was conducted by repeating 50 times the cycle of maintaining the temperature at −55° C. and +100° C. for 60 minutes for each thereof and by changing the temperature from −55° C. to +100° C., wherein a temperature shift from −55° C. to +100° C. and vice versa was made within few seconds.

Figure 5A:
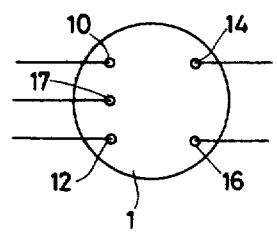
FIG. 5A is a schematic diagram of a conventional circuit and FIG. 5B is a schematic diagram of the FIG. 1 embodiment.
Figure 5B:
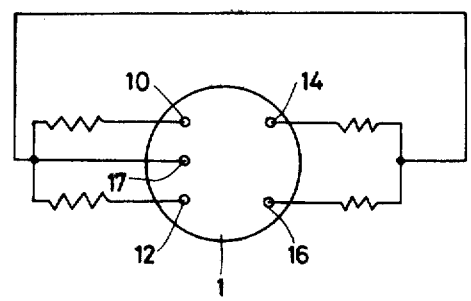

FIGS. 5A and 5B show schematic diagrams of the circuit configuration for conducting the heat shock test, wherein FIG. 5A shows a circuit diagram of a conventional surface acoustic wave filter and FIG. 5B shows a circuit diagram of a surface acoustic wave filter wherein the present invention was employed. Meanwhile, referring to FIGS. 5A and 5B, the same portions of those in FIG. 1 have been denoted by the same reference characters. As seen from FIG. 5A, in the conventional surface acoustic wave filter, the respective pin terminals 10, 12, 14, 16 and 17 have not been electrically connected. By contrast, as shown in FIG. 5B, in the surface acoustic wave filter embodying the present invention, the pin terminal 17 is connected through the resistor to the respective pin terminals 10, 12, 14 and 16, while the input interdigital transducer and the output interdigital transducer are electrically connected to each other.

Table 1 shows the result of measurement of the surface acoustic wave filter characteristic (the insertion loss and the center frequency) with respect to the test cycle numbers, wherein the mean value ($\overline{X}$) and the diversified width (R) are shown with respect to ten samples.

The center frequency in Table 1 shows the value of the center frequency in the bandwidth lower by 10 dB than the minimum attenuation amount of the surface acoustic wave filter. These insertion loss and center frequency were measured using the FIG. 6 circuit configuration. It is pointed out that in FIG. 6 those portions that are the same as those in FIG. 1 are denoted by the same reference characters.

Figure 6:
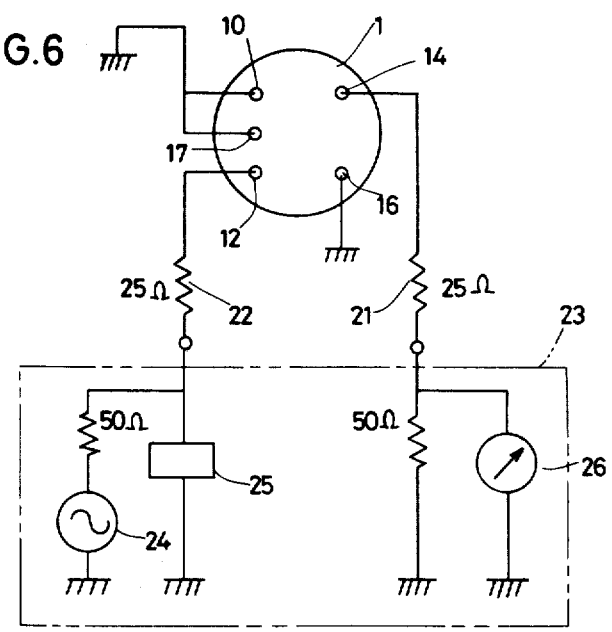
FIG. 6 is a schematic diagram of one example of an electric circuit for measuring the insertion loss and the center frequency.

Referring to FIG. 6, the reference numeral 1 denotes a hermetic base, while an acoustic surface wave filter fixed thereon is omitted. The reference numeral 10 denotes a pin terminal for electrical conduction to the comb shaped electrode 5a in FIG. 1, the reference numeral 17 denotes a pin terminal for electrical connection to a ground electrode 7 of the same ceramic plate 4, the reference numeral 12 denotes a pin terminal for electrical connection to the comb shaped electrode 5b, and the reference numeral 14 denotes a pin terminal for electrical connection to the comb shaped electrode 6a. The reference numeral 16 denotes a pin terminal for electrical connection to the comb shaped electrode 6b. The reference numerals 21 and 22 are resistors having the resistance value 25Ω; however, these are shown as the resistive components proper of the connection terminals used in the embodiment. Encircled with the two dotted line is a network analyzer 23, the input and output impedances thereof being 50Ω. The network analyzer 23 comprises a signal generator 24, a frequency counter 25, a high frequency voltmeter 26 and the like. It is pointed out that the resistors connected between the comb shaped electrodes 5a, 5b, 6a and 6b and the hermetic base 1 are not shown on the circuit.

Figure 7:
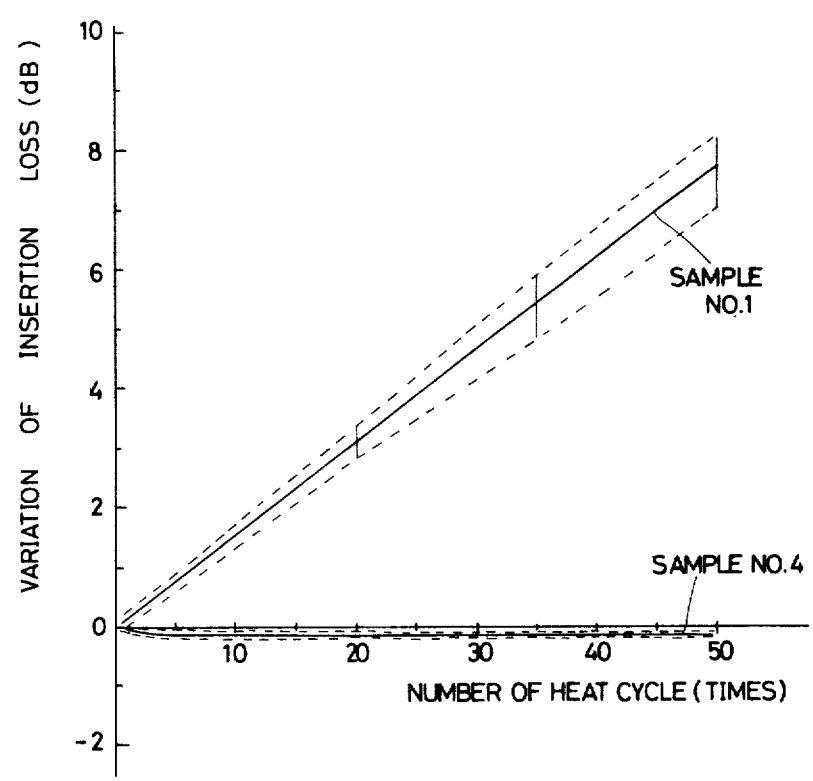
FIG. 7 is a graph showing a variation of the insertion loss by the heat shock test with respect to a surface acoustic wave filter embodying the present invention and a conventional surface acoustic wave filter.
Figure 8:
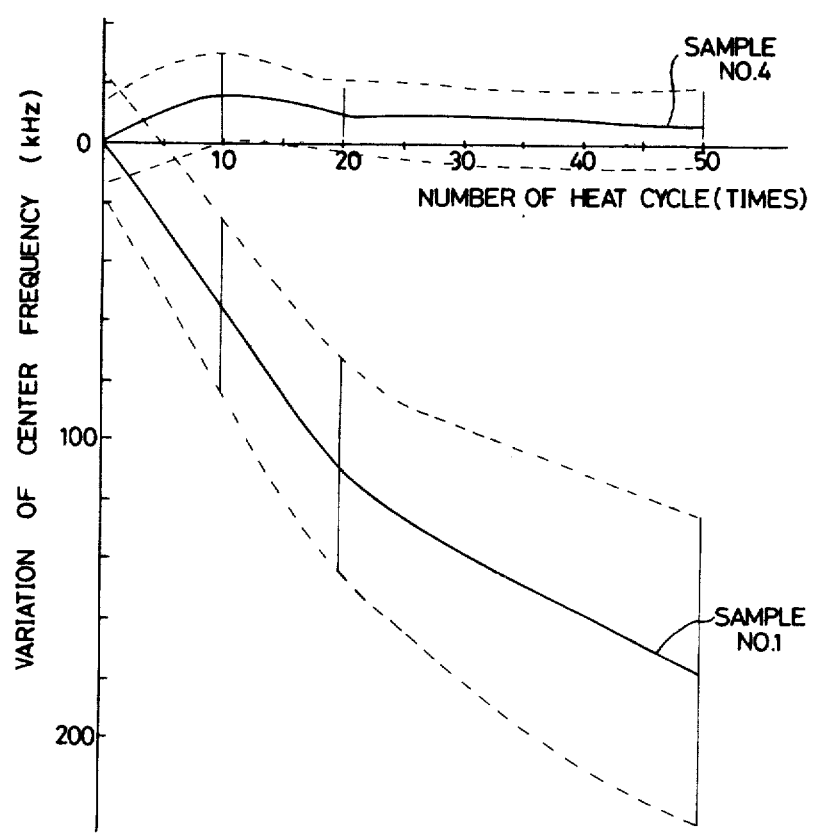
FIG. 8 is a graph showing a variation of the center frequency of the surface acoustic wave filter embodying the present invention and the conventional surface acoustic wave filter.

FIGS. 7 and 8 show a variation (ΔLoss) of the insertion loss and a variation (Δf0) of the central frequency, respectively, when the heat shock test was conducted with respect to the sample Nos. 1-1 to 1-5, and the sample Nos. 4-1 to 4-5 in the Table 1.

As seen from Table 1, and FIGS. 7 and 8, the embodiment having the resistor interposed between the comb shaped electrodes 5a and 5b and 6a and 6b of the input interdigital transducer 5 and the output interdigital transducer 6 and the hermetic base 1 for electrical connection has a characteristic feature that a diversification of the values of the respective characteristics in the heat shock test is small.

Figure 9:
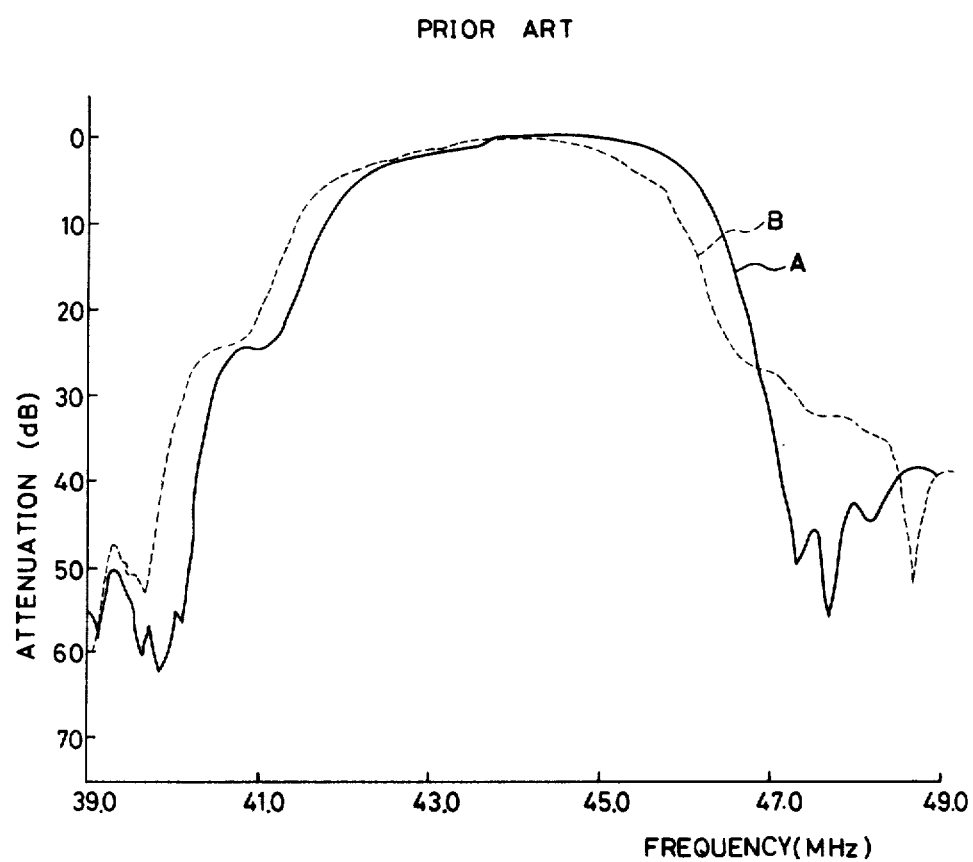
FIG. 9 is a graph showing a frequency response before and after the heat shock test of a conventional surface acoustic wave filter.
Figure 10:
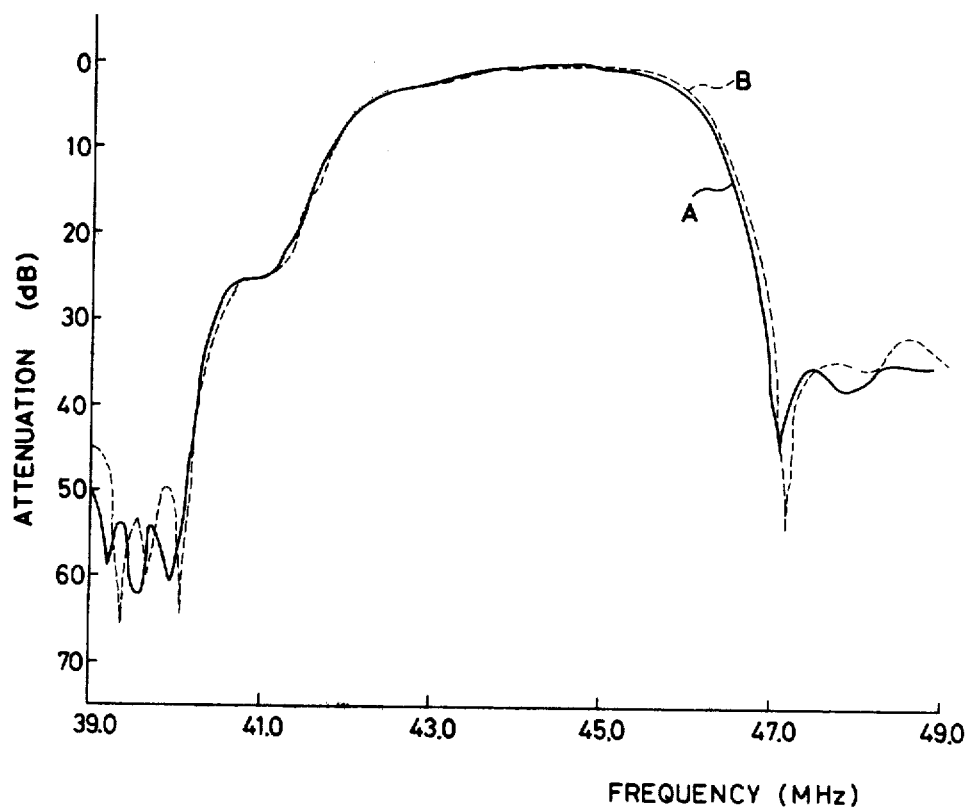
FIG. 10 is a graph showing a frequency response before and after the heat shock test of a surface acoustic wave filter embodying the present invention.

The frequency response of the surface acoustic wave filter before and after the heat shock test is shown in FIGS. 9 and 10. More specifically, FIG. 9 shows the frequency response of the conventional one which corresponds to sample No. 1. The curve A in FIG. 9 shows the frequency response before the test and the curve B in FIG. 9 shows the frequency response after the test.

FIG. 10 shows the frequency response of the filter in accordance with the present invention which corresponds to the sample Nos. 4. The curve A in FIG. 10 shows the frequency response before the test and the curve B in FIG. 10 shows the frequency response after the test.

As apparent from a comparison of the characteristics shown in FIGS. 9 and 10, it is understood that there is no substantial change in the frequency response of the inventive surface acoustic wave filter before and after the heat shock test.

The reason why the stabilized characteristic is attained to the heat shock test by interposing a resistor between the comb shaped electrodes and the ground potential of the hermetic base is presumably accounted for in the following manner. More specifically, in the case of a surface acoustic wave filter having comb shaped electrodes on a ferroelectric ceramic plate of a barium titanate group, a lead titanate zirconate group, a lead titanate group and the like, a change of the ambient temperature causes a pyroelectric effect on the electrode portion due to a spontaneous polarization (Ps), thereby to generate an electric charge on the electrode. The above described electric charge functions as a counterelectric field for deviating the polarization in the direction opposite to the direction of the direct current electric field on the occasion of the polarizing treatment, with the result that the piezoelectric characteristic is degraded in a conventional one wherein the comb shaped electrode is not connected to the ground through a resistor. Meanwhile, according to the experimentation, the above described characteristic degradation became particularly conspicuous when the temperature is shifted from a high temperature to a low temperature. The reason therefor is presumably accounted for in the following manner. On the occasion of a low temperature, the resistivity of the plate 4 itself becomes larger as compared with that on the occasion of a high temperature. Accordingly, a decreasing time period of the electric charge caused by the above described temperature change is prolonged and therefore the counterelectric field deviating the polarization in the plate 4 is applied for a longer period of time as compared with that on the occasion of a high temperature. However, as in the case of the above described embodiment, by electrically connecting the comb shaped electrodes and the hermetic base of the ground potential by means of a resistor, presumably the electric charge generated due to the pyroelectric effect is discharged through the resistor and as a result no counterelectric field is generated and degradation of the piezoelectric characteristic can be prevented.

As the resistor used for that purpose, one having a value lower than the resistance value of the ceramic plate itself is preferably used. The reason therefor will be described in the following. More specifically, a relation between the resistance value of the ceramic plate of various materials and a change of the electric characteristic due to the heat shock test was sought and it was observed that when the resistance value of the ceramic plate becomes smaller than a predetermined value a change in the electric characteristic due to the heat shock test becomes small. The reason is presumed to be that the electric charge of the counterelectric field which is reversed to the electric field direction on the occasion of polarization is not stored on the electrode sided opposed to the ferroelectric ceramic plate but is naturally discharged through the inner portion of the ceramic plate. However, it has been observed that as the resistance value of the ceramic plate decreases as described previously degradation of the piezoelectric characteristic and diversion of the electric characteristic increases, which means that the manner of the other natural discharge need be considered. In other words, the electric charge may be discharged through an external circuit rather than a discharge through the inner portion of the ceramic plate. Accordingly, this means that it would be better to connect a resistor of a lower resistance value (including a case of the resistance value being zero) than that in the inner portion of the ceramic plate between the electrodes where the electric charge occurs.

In the above described embodiment the conductive member where an electric charge is stored constitutes the input interdigital transducer 5 and the output interdigital transducer 6, wherein the polarization direction is perpendicular to the plane of the ceramic plate where these interdigital transducers are formed; however, there are different examples as set forth in the following.

Figure 11:
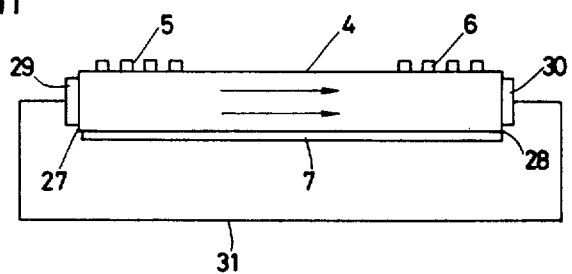
FIG. 11 is an outline side view of another embodiment of a surface acoustic wave filter in accordance with one embodiment of the present invention.

FIG. 11 is a view showing another example of a surface acoustive wave filter, wherein the polarization direction is in parallel with the plane of the ferroelectric ceramic plate 4. The example shown employed the ceramic plate 4 which was 10 mm long, 3 mm wide and 0.5 mm thick and is of the resistance value of $5 \times 10^{13} \Omega$ between the planes 27 and 28 in the perpendicular to the polarization direction. The input interdigital transducer 5 and the output interdigital transducer 6 serving as one of the conductive members are formed on one main surface of the ceramic substrate 4. The ground electrode 7 serving as another conductive member is formed on the other main surface of the ceramic plate 4. The electrodes 29 and 30 serving also as a conductive member are formed on the side surfaces 27 and 28 of the ceramic plate 4. In the FIG. 11 example it is mainly the electrodes 29 and 30 and not the input interdigital transducer 5 and the output interdigital transducer 6 where the electric charge is stored due to a temperature change.

Accordingly, in applying the present invention to the FIG. 11 example, the electrodes 29 and 30 may be electrically connected by a lead wire 31, as shown. Although not shown in the figure, electrical connection between the electrodes 29 and 30 through the lead wire 31 may be further through a resistance. Furthermore, instead of forming the electrodes 29 and 30 with an electrically conductive material on the surfaces 27 and 28, a resistive material having a resistance value lower than the resistance value of the ceramic plate 4 between the surfaces 27 and 28 may be formed to complete the electrical connection with the lead wire 31. Alternatively, the electrodes made of a resistive material may be electrically connected to the ground potential. Alternatively, the resistive material may also have a property of a damping material, i.e. a surface acoustic wave absorbing material, in which case the resistive material can also serve to prevent reflection of the surface acoustic wave by the side surface of the plate 4.

Although the above described embodiments show a hermetic seal type surface acoustic wave filter, it is pointed out that the present invention can also be applied to a so-called dip type surface acoustic wave filter having the filter dipped with a coating resin material. Such embodiment will be described with reference to FIGS. 12A and 12B.

Figure 12A:
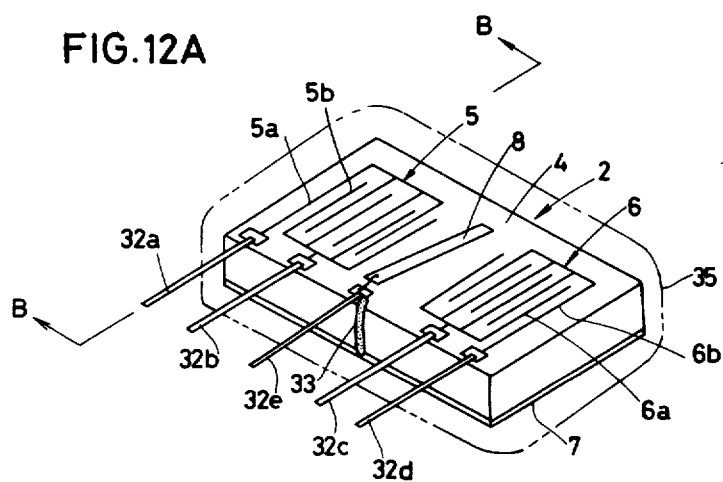
FIG. 12A is a perspective view of the same and FIG. 12B is a sectional view taken along the line B—B in FIG. 12A.
Figure 12B:
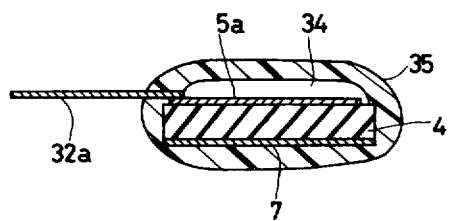

Referring to FIGS. 12A and 12B, the ferroelectric ceramic plate 4 has the polarization axis in the thickness direction and the input interdigital transducer 5 and the output interdigital transducer 6 are formed on one main surface of the plate 4, while the ground electrode 7 is formed on the other main surface. A shield electrode 8 is formed between the input interdigital transducer 5 and the output interdigital transducer 6. Withdrawing terminals 32a and 32b are electrically connected to the comb shaped electrodes 5a and 5b, respectively, of the input interdigital transducer 5. The withdrawing terminals 32c and 32d are electrically connected to the comb shaped electrodes 6a and 6b, respectively, of the output interdigital transducer 6. The withdrawing terminal 32e is connected to the shield electrode 8. The shield electrode 8 and thus the withdrawing terminal 32e and the ground electrode 7 are electrically connected through the resistor 33 baked on the side surface of the ceramic plate 4. The surface acoustic wave filter thus structured is covered with the coating resin material 35 with a spacing 34 on one main surface of the ceramic plate 4 where the input interdigital transducer 5 and the output interdigital transducer 6 are formed. The coating resin material 35 may be of a highly insulating material. Alternatively of the illustration, the coating resin material 35 may be of a material having a resistance value lower than that of the ceramic plate 4. In such a case, by covering with the coating resin material 35 to include the vicinity of the respective withdrawing terminals 32a and 32e and the ground electrode 7, the resistor 33 can be dispensed with. More specifically, the electric charge stored on the electrode where the electric charge is stored due to a temperature change can be discharged through the resin coating 35 made of a resistive material.

In the above described embodiments, the resistor was embodied as a baked resistor, a fixed resistor element and the like and the coating resin was embodied as serving also as a resistor; however, alternatively the same may be of a semiconductor glass material, a semiconductor resin material and the like. A point is that a resistance may be formed not in the plate 4 per se but may be formed as inserted in the electrical circuit.

In addition to the above described embodiments, FIG. 13 shows an example where the present invention is applied to a pulse compression apparatus for use in communication equipment among the surface acoustic wave filters. The pulse compression apparatus is adapted such that a chirp signal having the frequency varying in the linear manner as shown in FIG. 13A is applied to the input interdigital transducer 5 of a dispersive delay line shown in FIG. 13B, whereby a pulse compressed signal as shown in FIG. 13C is obtained from the output interdigital transducer 6. In order to apply the present invention to the above described pulse compression apparatus, the input interdigital transducer 5 and the output interdigital transducer 6 are connected to the ground potential through resistors, respectively. The ferroelectric ceramic plate 4 is polarized in the thickness direction and the ground electrode is formed, although not shown in the figure, on the other main surface opposing to the main surface where the input interdigital transducer 5 and the output interdigital transducer 6 are formed. Furthermore, those structured described in conjunction with the above described embodiments may be employed in the pulse compression apparatus.

In the foregoing, the present invention was described as embodied in the surface acoustic wave filter; however, it is pointed out that the present invention can also be applied to a surface acoustic wave delay line, a surface acoustic wave resonator, a surface acoustic wave convolver, a surface acoustic wave amplifier, an acoustic optical device and so on. In the following, therefore, these surface acoustic wave devices employing the present invention will be described by taking typical examples.

FIGS. 14 and 15 show a surface acoustic wave delay line, wherein FIG. 14 shows a long time period delay line using a reflecting trackchanger and FIG. 15 is a delay line having a tap.

Referring to FIG. 14, the ferroelectric ceramic plate 4 as polarized in the thickness direction is provided with the input interdigital transducer 5 and the output interdigital transducer 6. Furthermore, multistrip couplers 36 and 37 are formed to propagate the surface acoustic wave from the input interdigital transducer 5 so as to be reflected from one end to the other end. The input interdigital transducer 5 and the output interdigital transducer 6 are electrically connected through the respective resistors to the ground electrode, not shown, formed on the other main surface of the ceramic plate 4.

Now the structure shown in FIGS. 15A and 15B will be described in the embodiment shown in FIGS. 15A and 15B, the input interdigital transducer 5 is formed on one main surface of the ferroelectric ceramic plate 4 as polarized in the thickness direction and the tap electrode (the output interditial transducer) 6 is formed spaced apart from the input interdigital transducer 5, whereby the output is obtained with respect to the input in the relation as shown. In the embodiment shown, the input interdigital transducer 5 and the tap electrode 6 are electrically connected through the respective resistors to the ground electrode, not shown, formed on the other main surface, or the ground potential.

Figure 16:
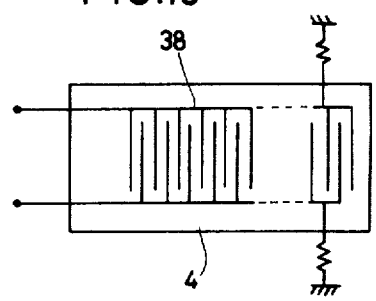
FIG. 16 is an outline plan view showing one example of a surface acoustic wave resonator in accordance with one embodiment of the present invention.

FIG. 16 shows a surface acoustic wave resonator. In the embodiment shown, the interdigital transducer 38 is formed on one main surface of the ferroelectric ceramic plate 4 as polarized in the thickness direction and the interdigital transducer 38 is electrically connected through a resistor to the ground potential. Although not shown in the figure, the interdigital transducer 38 may be electrically connected through a resistor to the ground electrode of the other main surface of the ceramic plate 4.

Figure 17:
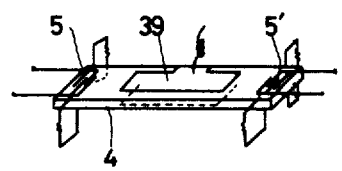
FIGS. 17 and 18 are outline perspective views showing one example of a structure of a surface acoustic wave device convolver in accordance with one embodiment of the present invention.
Figure 18:
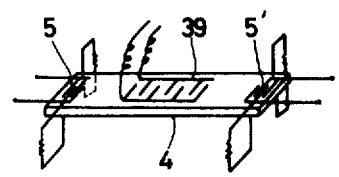

FIGS. 17 and 18 show a surface acoustic wave convolver employing the present invention. FIG. 17 shows an embodiment for a degenerated mode and FIG. 18 shows an embodiment utilizing the interdigital transducer as an output electrode. In either case the input interdigital transducers 5 and 5' are formed on one main surface of the ferroelectric ceramic plate 4 polarized in the thickness direction and these interdigital transducers 5 and 5' are electrically connected to the ground electrode, not shown, formed on the opposite main surface through a resistor. Meanwhile, the reference numeral 39 denotes an output electrode for withdrawing the convolution output.

Figure 19:
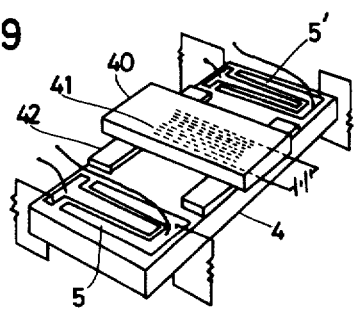
FIG. 19 is an outline perspective view showing a structure of a surface acoustic wave amplifier in accordance with one embodiment of the present invention.

FIG. 19 shows a surface acoustic wave amplifier embodying the present invention. The embodiment shown is a medium separated type surface acoustic wave amplifier. In the embodiment shown, the interdigital transducers 5 and 5' are formed on one main surface of the ferroelectric ceramic plate 4 polarized in the thickness direction and these interdigital transducers 5 and 5' are electrically connected to the ground electrode, not shown, formed on the opposite main surface through a resistor. Meanwhile, referring to FIG. 19, the reference numeral 40 denotes a sapphire substrate, the reference numeral 41 denotes an epitaxial semiconductor thin film, and the reference numeral 42 denotes a spacer.

Figure 20:
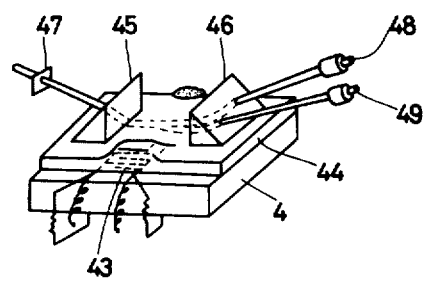
FIG. 20 is an outline perspective view showing one example of a monolithic type surface acoustic optical device in accordance with one embodiment of the present invention.

FIG. 20 shows a monolithic type acoustic optical device embodying the present invention. Specifically, the embodiment shown is a ZnO thin film monolithic type. Referring to FIG. 20, the interdigital transducer 43 is formed on one main surface of the ferroelectric ceramic plate 4 polarized in the thickness direction and the ZnO thin film 44 is further formed thereon. Prism couplers 45 and 46 are formed on the ZnO thin film 44. The reference numerals 47 denotes a polarizer, and the reference numerals 48 and 49 denote photomultipliers. In the embodiment shown, the interdigital transducer 43 is electrically connected through a resistor to the ground electrode, not shown, formed on the other main surface of the ceramic plate 4.

It is pointed out that those depicted in conjunction with FIGS. 1 to 3, 11 and 12 can be also applied to the embodiment shown in FIGS. 13 to 20.

Figure 21:
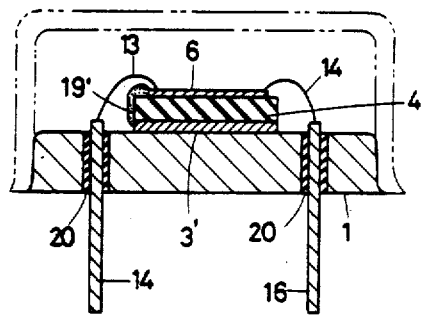
FIG. 21 is a view showing another example of a surface acoustic wave filter in accordance with one embodiment of the present invention and particularly showing a portion corresponding to the FIG. 1B illustration.

FIG. 21 shows an outline sectional view of another example of a surface acoustic wave filter in accordance with one embodiment of the present invention. FIG. 21 corresponds to FIG. 1B. However, the FIG. 21 embodiment is different from the previously described embodiment, in that the FIG. 21 embodiment fails to comprise the ground electrode 7, shown in FIG. 1B. Furthermore, the ceramic plate 4 is fixed to the hermetic base 1 by means of an adhesive agent 3'. The adhesive agent 3' is of a resistive material having the resistance value smaller than that of the ferroelectric ceramic plate 4 constituting the plate of the surface acoustic wave filter 2, as to be described subsequently. Since the remaining portions are substantially the same as those in the FIG. 1 embodiment, a more detailed description thereof will be omitted.

A characteristic feature of the surface acoustic wave filter of the embodiment shown resides in the adhesive agent 3' made of a resistive material serving and electrical connection of the output interdigital transducer 6 serving as a conductive material to the comb shaped electrode 6a with a connecting member 19'.

Furthermore, although not shown, the comb shaped electrodes 5a and 5b of the input interdigital transducer 5 and the comb shaped electrode 6b of the output interdigital transducer 6 may also be electrically connected with the adhesive agent 3' made of a resistive material.

Alternatively, the connection member 19' may be of a material having a resistance component. In such a case, it is necessary that the total resistance value of those of the adhesive agent 3' and the connection member 19' both made of a resistive material be smaller than the resistance value of the ferroelectric ceramic plate 4. According to the embodiment in discussion, it follows that a resistor is electrically connected in series between the adhesive agent 3' made of a resistive material and the input interdigital transducer 5 and/or the output interdigital transducer 6.

A heat shock test was conducted as a special test to evaluate the characteristic of the surface acoustic wave filter thus structured. The surface acoustic wave filter of the following structure was employed to that end. As the ceramic plate 4, the ceramic material of a lead titanate zirconate group including as a main constituent 0.05 $Pb(Sn_1Sb_1)O_3$-0.35$PbTiO_3$-0.60$PbZrO_3$ and as an additive $MnO_2$ of 0.6 wt% was used. The size of the ceramic plate was selected to be 10 mm long, and 3 mm wide, and 0.5 mm thick and the resistance value of the ceramic plate per se was selected to be $5 \times 10^{11}$ Ω, with the polarization axis direction being the thickness direction of the ceramic plate. The input interdigital transducer 5 was formed as a weighted electrode in accordance with the apodizing method and the output interdigital transducer 6 was formed as a normal type electrode, as shown in FIG. 4. The wave length of the surface acoustic wave was selected to be 56 μm and the central frequency was selected to be 45 MHz.

Described further with reference to FIG. 1, the comb shaped electrodes 5a and 5b of the input interdigital transducer 5 were electrically connected through the connection member 19' to the adhesive agent 3' made of a resistive material and the comb shaped electrodes 6a and 6b of the output interdigital transducer 6 were electrically connected through the connection member 19' to the adhesive agent 3' made of a resistive material. As the adhesive agent 3' made of a resistive material, a resistive paste having carbon uniformly dispersed in phenol resin was used with different resistant values of 1 kΩ, 100 kΩ and 10 MΩ and 1000 MΩ. These resistive pastes were coated on the other main surface of the ceramic plate 4. As the connection material 19', a resistive paste of a metal oxide group was employed and the resistive pastes of different resistance values of 1 kΩ, 100 kΩ and 1000 MΩ were prepared and coated in place. The ceramic plate 4 thus prepared or placed on the hermetic base 1, and the composite was heat treated and baked. Thus, the ceramic plate 4 was adhered to the hermetic base 1. Those composite using the silver paste (the resistance value is approximately 0Ω) as the connection material 19' and a fixed resistor element of 10 MΩ instead of a coated and fired thick resistor were also used as samples.

Then the heat shock test was conducted with respect to the thus obtained samples. The conditions and the circuit connection of the heat shock test and the measuring circuit were the same as the previous ones.

Table 2 shows the measurement result of the surface acoustic wave filter characteristic (the insertion loss and the center frequency) with respect to the number of test cycles obtained by the heat shock test, wherein the mean value ($\overline{X}$) and the diversification (R) are shown with respect to ten samples.

Meanwhile, the center frequency in Table 2 shows the value of the center frequency in the band width where the same has decreased by 10 dB as compared with the minimum attenuated value of the surface acoustic wave filter.

Figure 22:
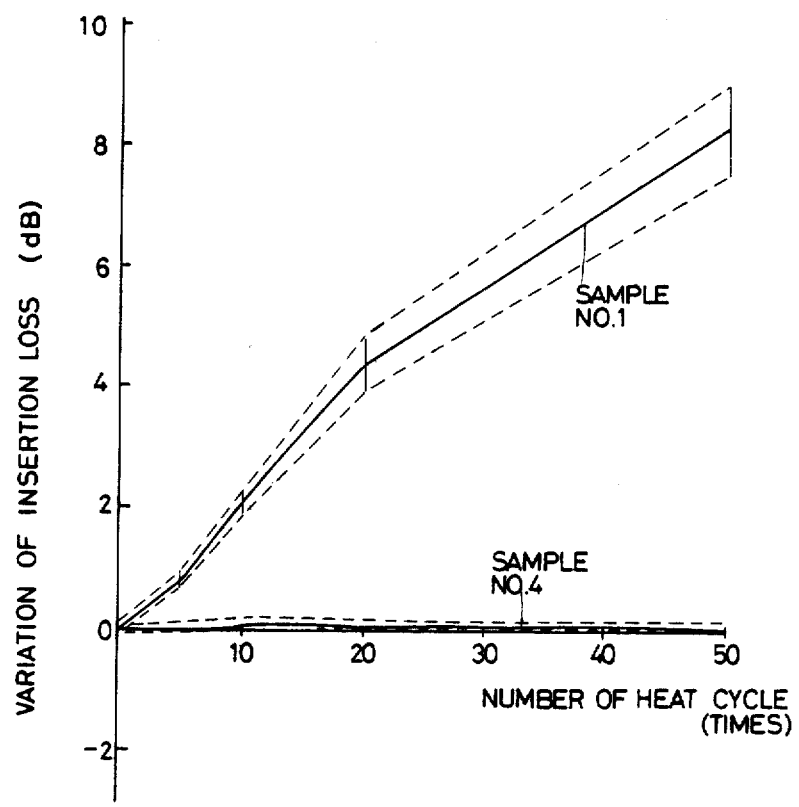
FIG. 22 is a graph showing a variation amount of the insertion loss of the surface acoustic wave filter of the FIG. 21 embodiment and the conventional surface acoustic wave filter.
Figure 23:
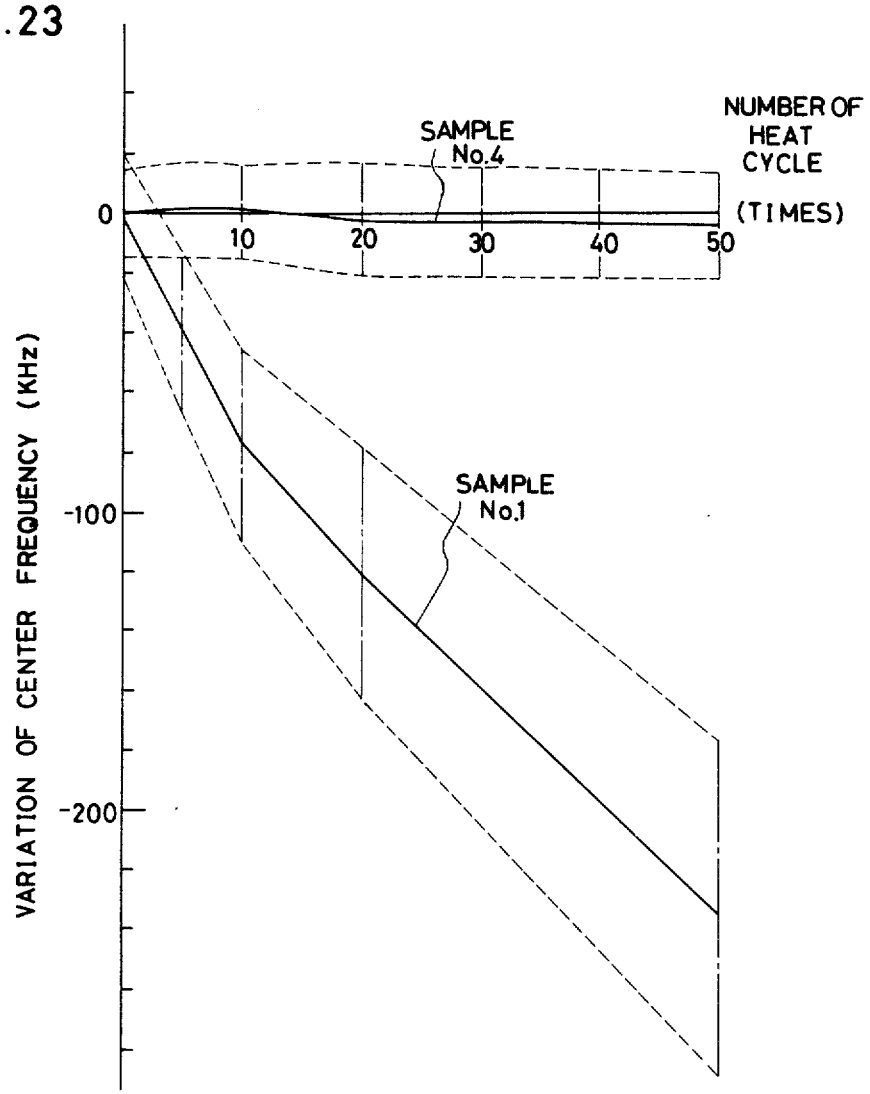
FIG. 23 is a graph showing a variation of the center frequency of the surface acoustic wave filter of the FIG. 21 embodiment and the conventional surface acoustic wave filter.

FIGS. 22 and 23 show a variation of the insertion loss (ΔLoss) and a variation of the center frequency (Δf0) when the heat shock test was conducted with respect to the sample Nos. 1-1 to 1-5 and 4-1 to 4-5.

As apparent from Table 2 and FIGS. 22 and 23, those having the respective comb shaped electrodes 5a, 5b, 6a and 6b of the input interdigital transducer 5 and the output interdigital transducer 6 connected to the adhesive agent 3' made of a resistive material with the connection member 19' exhibit a characteristic feature of the small diversification of the respective characteristic values obtained by the heat shock test.

Figure 24:
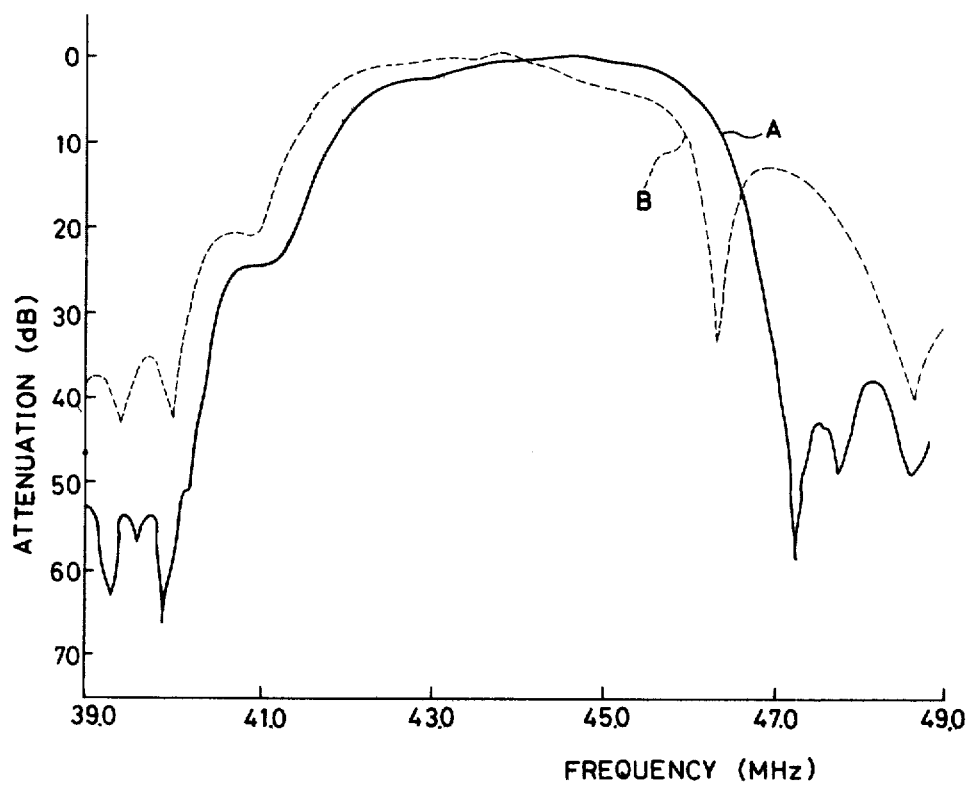
FIG. 24 is a graph showing the frequency response before and after the heat shock test of a conventional surface acoustic wave filter.
Figure 25:
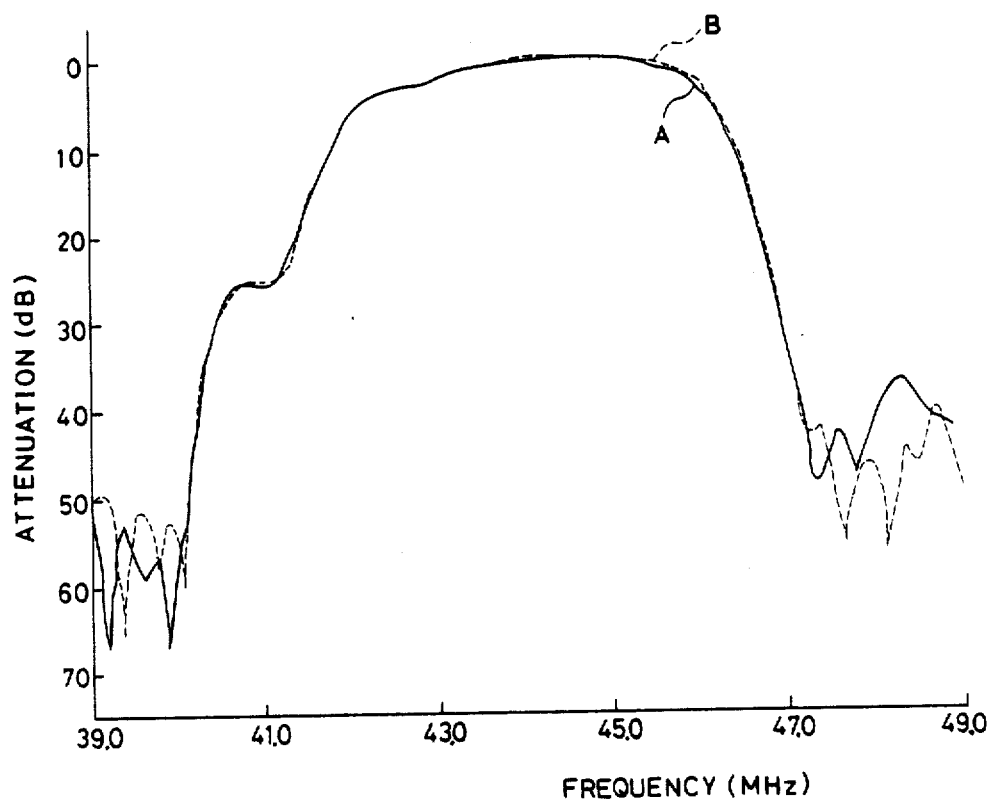
FIG. 25 is a graph showing the frequency response before and after the heat shock test of the FIG. 21 embodiment.

The frequency response of the surface acoustic wave filter before and after the heat shock test are shown in FIGS. 24 and 25. FIG. 24 shows that of a conventional example which corresponds to the sample Nos. 1—1 and 1-5. More specifically, referring to FIG. 24, the curve A shows the frequency response before the test and the curve B shows the frequency response after the test. On the other hand, FIG. 25 shows the characteristic of the surface acoustic wave filter embodying the present invention, which corresponds to the sample Nos. 4-1 and 4-5. More specifically, referring to FIG. 25, the curve A shows the frequency response before the test and the curve B shows the frequency response after the test. As apparent from a comparison of FIGS. 24 and 25, the embodiment shown exhibits little change in the frequency response of the surface acoustic wave filter before and after the heat shock test. Thus, it would be appreciated that by electrically connecting the comb shaped electrodes and the adhesive agent made of a resistive material by means of the connection member, i.e. by electrically connecting the conductive member comprising the interdigital electrode and the conductive member made of a resistive member having the resistance value smaller than that of the ferroelectric ceramic substrate, a stabilized characteristic with respect to the heat shock test is attained. The reason may be presumably explained as follows. An electric charge is generated on the electrode and the adhesive agent due to the pyroelectric effect and the electric charge thus generated serves as a counterelectric field for deviating the polarization opposite to the direct current electric field direction on the occasion of the polarizing treatment. However, by electrically connecting the comb shaped electrodes and the conductive member formed with the adhesive agent made of a resistive material by means of the connection material, as done in the above described embodiments, the electric charge generated due to the pyroelectric effect is discharged through the resistor, whereby the above described influence is rapidly decreased to eliminate the resultant counterelectric field, with the result that degradation of the piezoelectric characteristic can be prevented.

The resistance used for that purpose is selected to have a resistance value smaller than that of the ceramic plate per se, as described previously.

In the above described embodiments, the conductive member where the electric charge is stored is constituted by the input interdigital transducer 5, the output interdigital transducer 6, and the adhesive agent 3' made of a resistive material contiguous to the opposite surface and on the other hand the polarization axis direction is perpendicular to the plane of the ceramic plate where these interdigital transducers are formed; however, the polarization axis may be oriented in an oblique direction. Apart from the foregoing embodiments, those embodiments described in the following may be practiced.

Figure 26:
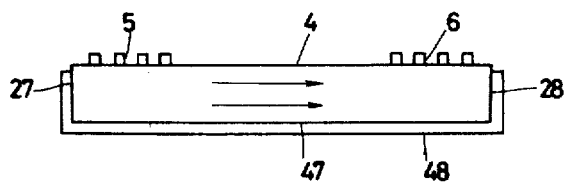
FIG. 26 is an outline side view showing another example of a surface acoustic wave filter in accordance with one embodiment of the present invention.

FIG. 26 shows another structural example of a surface acoustic wave filter in accordance with one embodiment of the present invention. The polarization direction of the ferroelectric ceramic plate 4 is parallel with the plane of the plate 4. In this case, the ceramic plate was 10 mm long, 3 mm wide and 0.5 mm thick and the resistance value between the planes 27 and 28 perpendicular to the polarization direction was $5 \times 10^{13} \Omega$. The input interdigital transducer 5 and the output interdigital transducer 6 serving as one of the conductor members are formed on one main surface of the ceramic plate 4. The conductive member 48 made of a resistive material having the resistance value smaller than that of the ceramic plate 4 is formed on the other main surface 47 and the side surfaces 27 and 28 of the ceramic plate 4. The conductive member 48 may also be of a damping material property. In such a case, reflection of the surface acoustic wave from the side surfaces can be prevented at the same time. Meanwhile, although not shown, the polarization direction may be in parallel with the ceramic plate 4 and the conductive member may be formed perpendicularly to the polarization direction as shown in FIG. 26 and on the surfaces perpendicular to the polarization direction and on the other main surface 47.

Figure 27A:
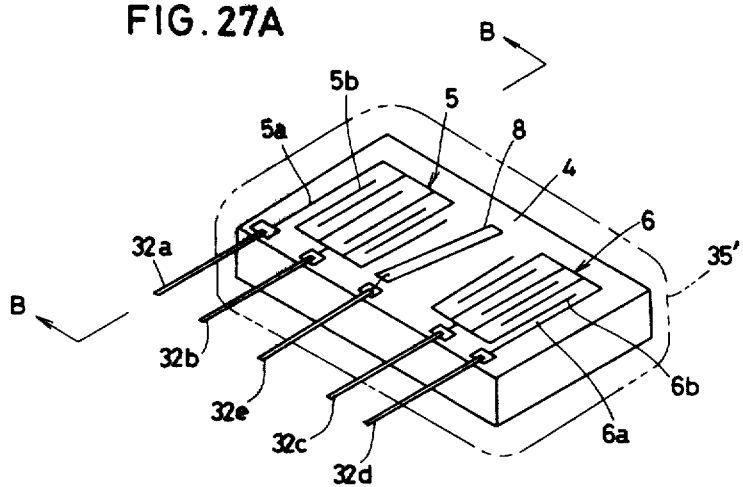
FIG. 27A is an outline perspective view of the same and FIG. 27B shows an outline sectional view taken along the line B—B in FIG. 27A.
Figure 27B:
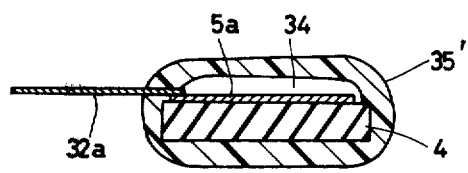

Now another embodiment embodying the present invention in a surface acoustic wave filter of a dip type having the filter dipped in a coating resin material will be described with reference to FIG. 27. Referring to FIGS. 27A and 27B, the ferroelectric ceramic plate 4 has the polarization axis in the thickness direction and the input interdigital transducer 5 and the output interdigital transducer 6 are formed on one main surface of the plate 4. The shield electrode 8 is formed between the input interdigital transducer 5 and the output interdigital transducer 6. The withdrawing terminals 32a and 32b are electrically connected to the comb shaped electrodes 5a and 5b of the input interdigital transducer 5. The withdrawing terminals 32c and 32d are electrically connected to the comb shaped electrodes 6a and 6b of the output interdigital transducer 6. Furthermore, the withdrawing terminal 32e is electrically connected to the shield electrode 8. The surface acoustic wave filter thus structured is further coated with the coating resin material 35' with a spacing 34 on one main surface of the ceramic plate 4 where the input interdigital transducer 5 and the output interdigital transducer 6 are formed, as more fully depicted in FIG. 27B.

As the coating resin material 35', one having a resistance value smaller than that of the ceramic plate 4, one having carbon powder, metal oxide powder, semiconductor ceramic powder or the like dispersed in an insulating coating resin material, for example, or a resin material having a resistance value smaller than that of the ceramic plate 4 may be used. The coating resin material 35' is coated to cover the vicinity of the respective withdrawing terminals 32a to 32e, a portion of the main surface where the input interdigital transducer 5 and the output interdigital transducer 6 are formed and the other main surface opposing thereto. According to the embodiment shown, the coating resin material 35' functions both as the conductive material 3' made of a resistive material depicted in conjunction with the hermetic seal type and as the connection material 19', and the electric charge with respect to the electrode where the electric charge is stored due to a temperature change can be discharged, with the resultant advantage that a diversification of the characteristics with respect to a temperature change is decreased. In the case where the insulation of the coating resin material 35' becomes a problem, one or more additional layers of good insulation may be further covered on the coating resin material 35', although not shown, thereby to solve the problem of the insulation. Incidentally described, the coating resin material 35' need have an insulating property which does not hinder propagation of the surface acoustic wave between the withdrawing terminals 32a and 32b, for example.

In the foregoing, the present invention was described as embodied in a surface acoustic wave filter; however, it is pointed out that the present invention can be employed in any other types of piezoelectric devices, such as a surface acoustic wave delay line, a surface acoustic wave resonator, a surface acoustic wave convolver, a surface acoustic wave amplifier, an acoustic optical device, and the like. In the following, therefore, a surface acoustic wave delay line and a surface acoustic wave resonator embodying the present invention will be described.

Figure 28:
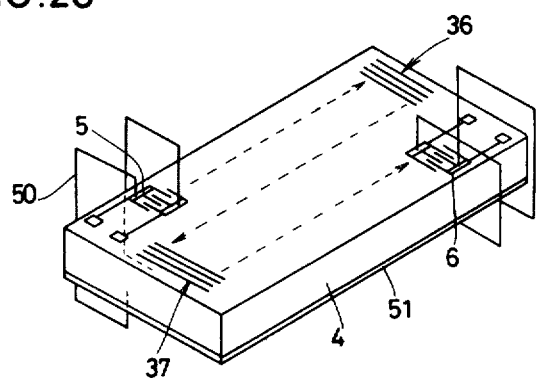
FIG. 28 is a perspective view showing another example of a surface acoustic wave delay line in accordance with one embodiment of the present invention.

FIG. 28 shows a surface acoustic wave delay line using reflecting trackchanger, which is adapted for attaining a longer delay time. Referring to FIG. 28, the input interdigital transducer 5 and the output interdigital transducer 6 are formed on the ferroelectric ceramic plate 4 as polarized in the thickness direction. The multistrip couplers 36 and 37 are formed to propagate the surface acoustic wave from the input interidigital transducer 5 by reflecting from one end to the other end. The input interdigital transducer 5 and the output interdigital transducer 6 are electrically connected to the conductive member 51 formed on the other main surface of the ceramic plate through the respective lead wires 50. The conductive member 51 may be formed with a resistive material having the resistance value smaller than that of the ceramic plate 4 and as a specific example may be a baked resistor. Even in the case of the FIG. 28 embodiment, the coating resin material 35' may be coated thereon, just as described in conjunction with the FIG. 27 embodiment, as is needless to say.

Figure 29:
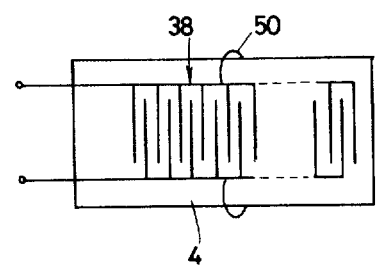
FIG. 29 is an outline plan view showing another example of a surface acoustic wave resonator in accordance with one embodiment of the present invention.
Figure 30:
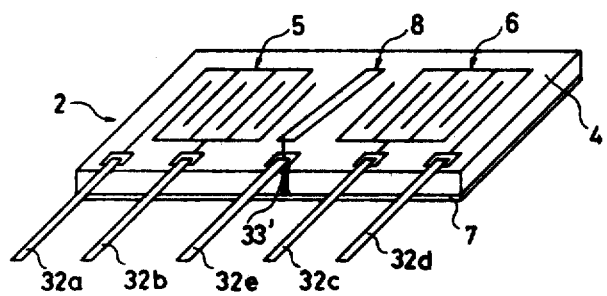
FIGS. 30 to 34 show in succession the steps of the manufacturing process of one example of a surface acoustic wave device in accordance with one embodiment of the present invention.

FIG. 29 shows a surface acoustic wave resonator. In the embodiment shown, the interdigital transducer 38 is formed on one main surface of the ferroelectric ceramic plate 4 as polarized in the thickness direction. The interdigital transducer 38 is electrically connected to the conductive member, (not shown and corresponding to the member 51 in FIG. 28) formed on the other main surface of the ceramic plate 4 through the lead wire 50. In this case as well, the coating resin material 35' may be coated thereon, as depicted in conjunction with FIG. 27, as is needless to say.

As is apparent from the foregoing description, the conductive member may comprise not only the interdigital transducers but also the ground electrode and other electrodes. Furthermore, as the kind of the conductive member, ones that may be adhered to the surface of the ferroelectric ceramic plate, such as a baked conductive film, an evaporated conductive film, a sputtered conductive film, a plated conductived film, a paste like conductive film and so on are included.

Figure 31A:
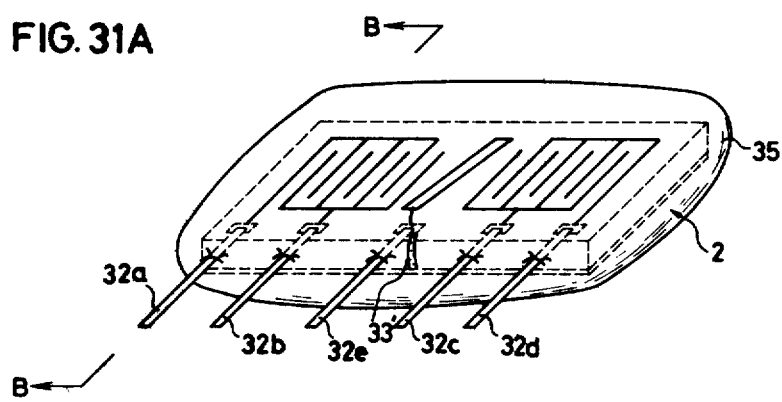
Figure 31B:
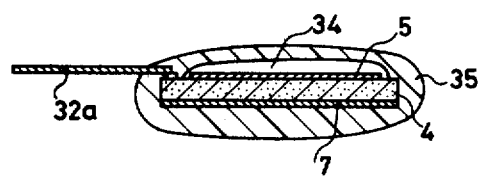

FIGS. 30 to 34 show in succession the steps of a method for manufacturing another example of a surface acoustic wave device in accordance with one embodiment of the present invention. First referring to FIG. 30, a piezoelectric unit 2 is prepared. The piezoelectric unit 2 comprises a ferroelectric ceramic plate 4 of a lead titanate zirconate group, for example. The input interdigital transducer 5 and the output interdigital transducer 6 are formed using a conductive material on one main surface of the plate 4 and the shield electrode 8 is further formed thereon between the transducers 5 and 6, as necessary. The ground electrode 7 is formed, as necessary, on the other main surface of the ferroelectric ceramic plate 4. The pair of comb shaped electrodes of the input interdigital transducer 5 are separately connected to the withdrawing terminals 32a and 32b, respectively. The pair of comb shaped electrodes of the output interdigital transducer 6 are separately connected to the withdrawing terminals 32c and 32d, respectively. The shield electrode 8 is electrically connected to the withdrawing terminal 32e. The ground electrode 7 formed on the rear surface of the plate 4 is electrically connected to the shield electrode 8, i.e. the withdrawing terminal 32e, through a conductive paste or a resistive paste 33'. The piezoelectric unit 2 is known as a unit constituting a surface acoustic wave device. Then, as shown in FIG. 31, the resin layer 35 is coated to cover the piezoelectric unit 2 and a portion of the respective withdrawing terminals 32a, 32b, 32c, 32d and 32e. The resin layer 35 is made of an insulating epoxy resin material, for example, and may be formed by a dipping process. In forming the resin layer 35, a concavity 34 is formed on one main surface of the plate 4, i.e. on the surface where the interdigital electrodes are formed, so as not to hinder propagation of the surface acoustic wave. Formation of such concavity 34 is well-known to those skilled in the art.

Figure 32:
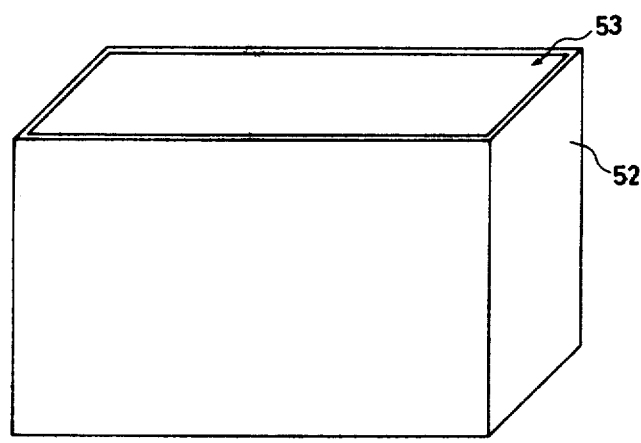

FIG. 32 shows one example of a metallic case for use in the present invention. The metallic case 52 is provided with an aperture or a space 53 large enough to accommodate the piezoelectric unit as shown in FIG. 31. The metallic case 52 is used to enhance wetproofness and a magnetic shielding property, thereby to provide the high quality of the product.

Figure 33:
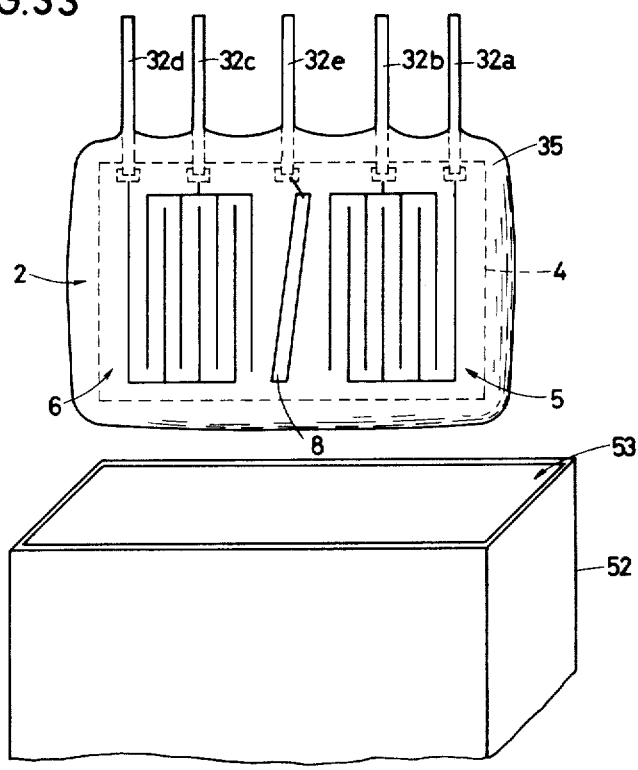
Figure 34:
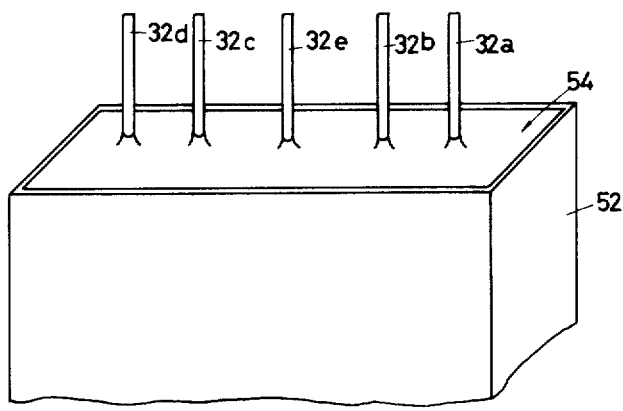

Then, as shown in FIG. 33, the piezoelectric unit 2 covered with the resin layer 35 is inserted into the space 53 of the metallic case 52 in the direction as shown. Then, as shown in FIG. 34, a filler or a potting material 54 is filled into the space formed between the metallic case 52 and the resin layer 35 and the respective withdrawing terminals. The filler 55 is aimed to fix the piezoelectric unit 2 with respect to the metallic case 52. As the filler 54, a resistive paste may be used, wherein the resistance value thereof is selected such that the same is smaller than that of the resistance value of the unit (the ferroelectric ceramic plate 4) appearing between the terminals before the filler 54 is filled and is connected in parallel between the terminals. Meanwhile, by "between the terminals", a portion between the terminals where the positive and negative electric charges are stored due to a temperature change of the ferroelectric ceramic plate is meant, as to be described subsequently. As such filler 54, one having carbon dispersed in epoxy resin, one having metal oxide dispersed in phenol resin, one having semiconductor powder dispersed in phenol resin, one having metallic powder dispersed in silicone resin, or any proper combination thereof may be used. As is seen from FIG. 34, the respective withdrawing terminals 32a to 32e are electrically connected to each other by the filler 54 (the resistive paste).

With such structure, the device exhibits a less change of the insertion loss and the central frequency with respect to the heat shock test and the reason why such a stabilized characteristic can be attained is presumably explained in the following manner.

More specifically, a surface acoustic wave device including a ferroelectric ceramic of such as barium titanate, lead titanate zirconate, lead titanate or the like exhibits a pyroelectric effect due to spontaneous polarization at the electrode portions when the same is subjected to a change of the ambient temperature, thereby to generate an electric charge on the electrodes. Such electric charge serves as a counterelectric field for causing polarization in the direction opposite to the direct current electric field direction on the occasion of the polarizing treatment, with the result that the piezoelectric characteristic of the plate is degraded. However, if and when the withdrawing terminals being connected to the conductive member formed on the surface of the plate are electrically connected by the filler material such as a resistive paste, as done in the above described embodiment, then the electric charge generated by the pyroelectric effect is discharged through the resistive paste and as a result no counterelectric field is caused and the piezoelectric characteristic of the plate is prevented from being degraded. Accordingly, as the resistive paste used for that purpose need be selected to have a resistance value smaller than that of the plate per se.

Meanwhile, in the above described embodiment, the electrodes formed on both main surfaces of the plate 4 were depicted as formed with a conductive material; however, the same may be formed as a resistive film of such as a resistive paste, a semiconductive film, and an evaporated resistor, a sputtered resistor and so on. In such a case, it is necessary that the resistance value of the resistive paste or the thin film as a filler material be selected in consideration of the relation with the resistance value of the electrodes. Furthermore, an outer package of the piezoelectric unit may be a casing obtained by molding an insulating resin material, or any other well-known structure.

Figure 35:
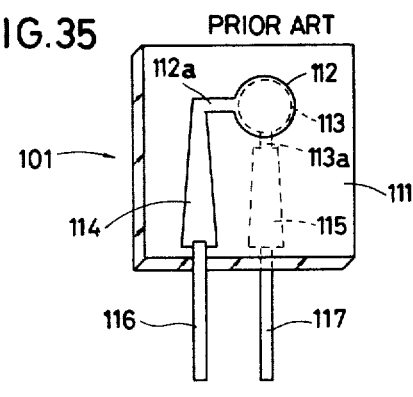
FIG. 35 is a view showing one example of a conventional energy trapped piezoelectric ceramic resonator wherein the present invention can be employed.

Now a bulk wave piezoelectric resonator embodying the present invention will be described. FIG. 35 is a view showing one example of a conventional piezoelectric resonator employing an energy trapped thickness longitudinal vibration mode in accordance with the present invention. Such a piezoelectric resonator itself is well-known to those skilled in the art and therefore only an improvement in association with the present invention will be described. The piezoelectric resonator 101 comprises a piezoelectric plate 111 of a square of 5 mm by 5 mm and 0.2 mm thick. The piezoelectric plate 111 is made of ferroelectric ceramic of a lead titanate zirconate group, for example, and is polarized in the thickness direction. The vibrating electrodes 112 and 113 of 1 mm in diameter are formed on the piezoelectric ceramic plate 111 so as to be faced to each other to excite the plate 101 on that portion. The vibrating electrode 112 is electrically connected to the withdrawing electrode 114 by the lead electrode 112a. The vibrating electrode 113 on the rear surface of the plate is electrically connected to the withdrawing electrode 115 by means of the lead electrode 113a. These withdrawing electrodes 114 and 115 are connected to the input and output terminals, i.e. the withdrawing terminals 116 and 117, respectively, by soldering, for example. The composite thus obtained is subjected to a coating process using an insulating resin material, not shown, in accordance with a method as disclosed in Japanese Patent Publication No. 22384/1970, whereby a piezoelectric resonator having the resonance frequency of 10.7 MHz is completed.

FIGS. 36, 37, 38, 39A and 39B are views showing further embodiments of the present invention. The size of the piezoelectric plate 111 and the size of the vibrating electrode 112 and so on are the same. In these embodiments, as the composition of the piezoelectric plate 111, the ceramics of a lead titanate zirconate group of such as $(Pb_{0.95}Sr_{0.05})(Ti_{0.48}Zr_{0.52})O_3 + 0.75$ wt% $Nb_2O_5 + 0.15$ wt% $Cr_2O_3$ was employed. When such ceramics is used, the resistance value between the withdrawing terminals 116 and 117 in a conventional structure before the present invention is employed was $5 \times 10^{12} \Omega$.

Figure 36:
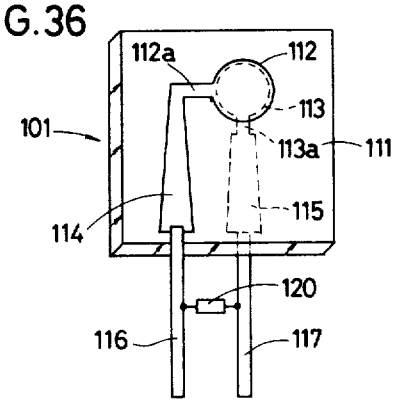
FIGS. 36 to 39 are views showing different embodiments of an energy trapped piezoelectric ceramic resonator in accordance with one embodiment of the present invention.

In the FIG. 36 embodiment, a discrete resistor 120 was connected between the withdrawing terminals 116 and 117. The resistance value of the resistor 120 may be 1 kΩ, 100 kΩ, 10 MΩ or 1000 MΩ; however, in the embodiment shown a resistor of 100 kΩ was used. The resistor 120 may be connected in any suitable place, as far as the same is suited for the purpose of the present invention, such as between the withdrawing electrodes 114 and 115, between the lead electrodes 112a and 113a or the like. In the FIG. 37 embodiment, the resistive paste 121 is formed over both surfaces of the piezoelectric ceramic plate 111 and is baked, whereby a given resistance value is established between the withdrawing electrodes 114 and 115. As the resistive paste 121, one having carbon powder dispersed in phenol resin is employed and the resistance value is selected to be 1 kΩ, 100 kΩ, 10 MΩ, 1000 MΩ and the like; however, in the experiment the resistive paste 121 of 1 kΩ and 10 MΩ was baked. The resistive paste 121 is formed at the position as shown as "122" in FIG. 38, whereby the withdrawing electrodes 114 and 115 are connected. In other words, the connection position may be arbitrarily determined insofar as the same is suited for the purpose of the present invention.

In the previously described embodiments shown in FIGS. 36 and 37 and the embodiments to be described with reference to FIGS. 39A and 39B, the vibrating electrodes 112 and 113, the lead electrodes 112a and 113a and the withdrawing electrodes 114 and 115 are formed as a silver electrode by means of an evaporation process or a sputtering process so that the resistance value thereof may be approximately zero, whereas in the FIG. 38 embodiment these electrodes are formed as a resistive metal (such as tantalum, titanium and the like) by means of an evaporation process or a sputtering process, or a resistive metal oxide (such as tin oxide). In the latter mentioned embodiment, a silver paste 122 of the resistance value being approximately zero is formed on both surfaces of the piezoelectric ceramic plate 111 and is baked, whereby the withdrawing electrodes 114 and 115 are directly connected rather than through a resistor. As a matter of course, a short-circuiting lead wire, not shown, may be used in place of the silver paste 122 and such connection position may be arbitrarily determined, insofar as the same is suited for the purpose of the present invention. Furthermore, the silver paste 122 or the short-circuiting lead wire may be of a resistive component. The resultant resistance value of these vibration electrodes 112 and 113, the lead electrodes 112a and 113a, or the withdrawing electrodes 114 and 115, and the silver paste 122 or the short-circuiting lead wire need be selected to be smaller than the resistance value of the piezoelectric ceramic plate 111 per se.

Figure 39A:
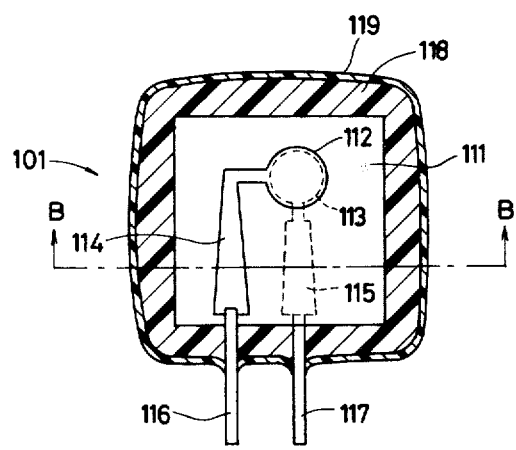
Figure 39B:
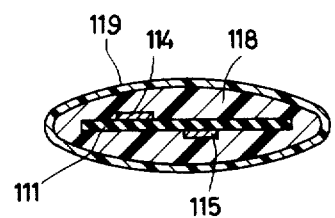

In the embodiment shown in FIGS. 39A and 39B, a resistive or semiconductive resin material was used as the resin layer 118 for covering the element. As such a material of the resin layer 118, one having powder of carbon, metal, metal oxide, semiconductor oxide or semiconductor glass dispersed in epoxy resin can be used. The resistance value thereof may be selected to be 1 kΩ, 100 kΩ, 10 MΩ and 1000 MΩ. In the experiment, however, the resistance values of 10 MΩ and 1000 MΩ were employed. As in the case of the unit dipped in the resistive resin material 118, as done in the embodiments shown, a highly insulating and/or wetproof resin layer 119 is preferably further coated. Meanwhile, the insulating resin layer 119 may be of a conventional epoxy resin material. In the embodiment shown, as better seen in FIG. 39B, it follows that the withdrawing electrodes 114 and 115 are electrically connected to each other by the resistive resin 118 and as a result the electrodes 114 and 115 are connected through the resistance of the resin layer 118.

Figure 37:
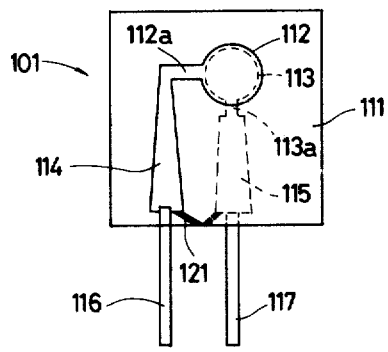
Figure 38:
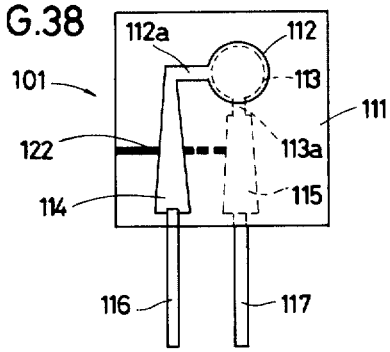

Meanwhile, in the embodiments shown in FIG. 36, 37 and 38, the unit is dipped with a resin material which is the same as the resin layer 119 used in the embodiment shown in FIGS. 39A and 39B or the ordinary resin where the resistive component has been removed, as previously described.

Now the heat shock test was conducted using the thus fabricated piezoelectric resonator. The conditions of the heat shock test were as follows. More specifically, the unit was maintained for 60 minutes at each of the temperatures of −50° C. and +100° C. and a temperature shift was made from −55° C. to +100° C. in one cycle and the same operation of one cycle was repeated for 100 cycles. The temperature shift from −55° C. to +100° C. and the reversed temperature shift were each made within few seconds.

The result of the heat shock test is shown in Table 3. Meanwhile, in Table 3, the embodiments shown in FIGS. 36, 37, 39A and 39B were employed as sample Nos. 2 to 6 and the conventional one shown in FIG. 35 was employed as sample No. 1. In the case of any of the embodiments, a point is that the electric charge generating electrodes are electrically connected with a resistance value smaller than that of the piezoelectric ceramic plate. In the case of any of the embodiments the heat shock test was conducted with the previously described conditions. Table 3 shows the result thereof.

Table 3 shows the result of measurement of the characteristic of the piezoelectric resonator (the thickness Δf; the frequency difference of the minimum and maximum frequencies, i.e. the resonance and the antiresonance at the impedances on the occasion of resonances of the element) with respect to the number of test cycles by the heat shock test and the mean value ($\overline{X}$) and the diversification (R) with respect to ten samples are shown.

As seen from Table 3, in the case of a conventional one as shown in FIG. 35, i.e. in the case of no insertion resistance value, the more the number of cycles of the heat shock test the larger a change of the thickness Δf and the diversification becomes. By contrast, in the case of the FIG. 37 embodiment, referring to the data of the sample No. 2 in the case of the resistive paste 121 being 1 kΩ, the unit exhibits little change in the thickness Δf and a diversification within an allowed range. Similarly, the sample No. 3 shows a case wherein the fixed resistor element 120 is selected to be 100 kΩ in the FIG. 36 embodiment. The sample No. 4 shows a case of the embodiment shown in FIGS. 39A and 39B, wherein the resistance value of the resistive resin layer 118 is selected to be 10 MΩ. The FIG. 37 embodiment having the resistance value selected to be 10 MΩ is shown by the sample No. 5. The embodiment shown in FIGS. 39A and 39B having the resistance value selected to be 1000 MΩ is shown by the sample No. 6. It would be appreciated that a variation and diversification of the thickness Δf of the sample Nos. 2 to 6 in Table 3 have been clearly and assuredly improved as compared with such a conventional one as the sample No. 1 shown in FIG. 35.

Figure 40:
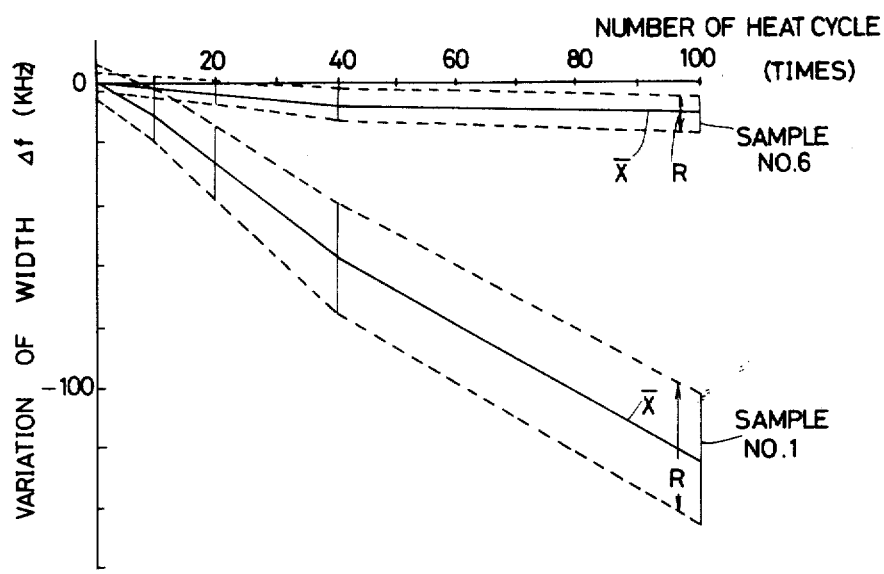
FIG. 40 is a graph showing a variation of the thickness $\Delta f$ of the FIG. 37 embodiment and the FIG. 35 conventional one.

FIG. 40 is a graph prepared based on the data shown in Table 3 and showing a variation of the thickness Δf of the sample No. 6, i.e. the embodiment shown in FIGS. 39A and 39B having the resistance value of the resin layer 118 selected to be 1000 MΩ and the sample No. 1, i.e. the conventional one shown in FIG. 35.

Meanwhile, it is important that the resistance value of the fixed resistive element 120 of the FIG. 36 embodiment, the resistance value of the resistive paste 121 of the FIG. 37 embodiment, and the resistance value of the resin layer 118 of the embodiment shown in FIGS. 39A and 39B are all smaller than the resistance value of the piezoelectric ceramic plate 111. Furthermore, it is also important that in the FIG. 38 embodiment the sum of the resistance value of the respective electrodes 112, 113, 112a, 113a, 114 and 115 formed with the resistive paste and the resistance value of the silver paste 122 be selected to be smaller than the resistance value of the piezoelectric ceramic plate 111. In other words, by evaluating a relation between the resistance value of the ceramic plate of various materials and the variation of the electric characteristic by the heat shock test, it was observed that the variation of the electric characteristic due to the heat shock test becomes smaller when the resistance value of the ceramic plate becomes smaller than a given value. The reason is presumed to be that the electric charge of the counterelectric field opposite to the electric field direction on the occasion of polarization due to the pyroelectric effect is not stored on the electrode facing to the ferroelectric ceramic plate but is naturally discharged through the internal resistance of the ceramic plate.

However, as described previously, it has been observed that as the resistance of the ceramic plate decreases the piezoelectric characteristic is decreased and a diversification of the electric characteristic is increased and therefore it is necessary to consider another natural discharge way. In other words, this means that it would be better to discharge the electric charge through an external circuit rather than a discharge through the internal path of the ceramic plate per se and accordingly this means that the electrodes where the electric charge is generated may be connected through a resistance which is smaller than the resistance value of the internal path of the ceramic plate (including a case of the resistance being zero). However, in the case of the structure wherein the vibrating electrode surface and the polarization direction intersect each other, it should be adapted such that the inherent operation as the resonator should not be hindered, which naturally results in a limitation to decreasing the resistance value. The lower limit value of the resistance value can not be generally determined and such need be determined on a case by case basis.

In the case of the heat shock test, when the temperature is shifted from the low temperature (−55° C.) to the high temperature (+100° C.), an electric field is caused in the forward direction with respect to the polarization direction between the electrodes on both sides of the plate 111 due to the pyroelectric effect, whereas an electric field is generated in the opposite direction due to the pyroelectric effect when the temperature is shifted from the high temperature to the lower temperature. It is presumed that the polarization of the plate 111 reverts due to the alternating electric field, thereby to decrease the piezoelectric characteristic. Therefore, according to the present invention, the electrodes on both surfaces of the plate 111 are electrically connected with a given resistance value, thereby to mitigate such alternating current electric field.

Figure 41A:
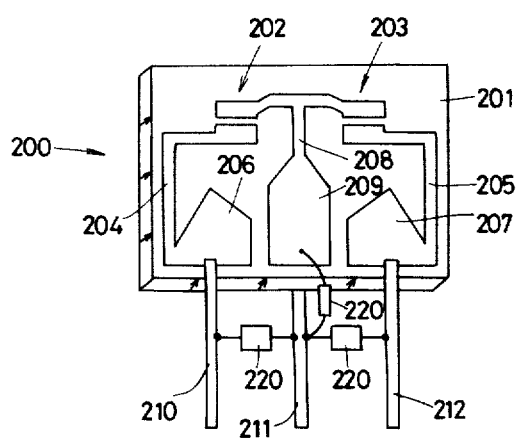
FIGS. 41 to 44 are views showing different embodiments of a piezoelectric ceramic filter in accordance with one embodiment of the present invention.
Figure 41B:
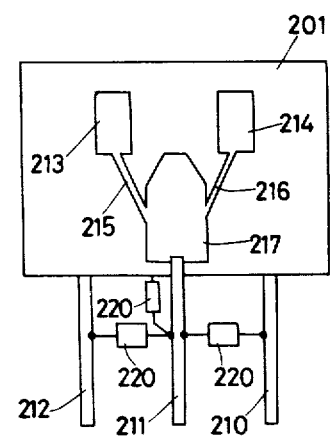

FIGS. 41A and 41B are views showing one example of an energy trapped 3-terminal piezoelectric filter in accordance with another embodiment of the present invention, wherein FIG. 41A shows one surface of the filter and FIG. 41B shows the other surface of the filter. Since a fundamental structure of such piezoelectric filter itself is well-known to those skilled in the art, only a portion associated with the present invention will be briefly described in the following.

The filter element 200 comprises a piezoelectric ceramic plate 201, which may be of ceramics of a barium titanate group, a lead titanate group, or a lead titanate zirconate group. Two pairs of electrods 202 and 203 are formed on one main surface of the piezoelectric ceramic plate 201 and the common electrodes 214 and 213 are formed to be faced to these electrodes 202 and 203. One of the electrodes 202 and 203 is connected to the withdrawing electrodes 206 and 27 through the lead electrodes 204 and 205. The other of the electrodes 202 and 203 is commonly connected to the electrode 209 through the lead electrode 208. The electrode 217 is formed on the rear surface of the plate 201 so as to be opposed to the electrode 209. The electrode 217 is connected to the common electrodes 214 and 213 by means of the lead electrodes 216 and 215. The electrodes 202 and 214 faced to each other with the plate 201 therebetween constitute a single vibrating portion and the electrodes 203 and 213 opposing to each other constitute a single vibrating portion. The electrodes 209 and 217 faced to each other with the plate 201 therebetween constitute a capacitor and accordingly the electrodes 209 and 217 function as capacitor electrodes. The lead electrode 206, the capacitor electrode 217 and the lead electrode 207 are connected to the withdrawing electrodes 210, 211 and 212, respectively, by soldering. The element thus fabricated is coated with a resin layer, not shown, whereby a 3-terminal filter element is completed.

In the embodiment shown in FIGS. 41A and 41B, the withdrawing terminals 210, 212 and 209 are connected to the withdrawing terminal 211 through the discrete resistor elements 220. FIGS. 42, 43, 44A and 44B are views showing 3-terminal filter elements in accordance with a further embodiment of the present invention.

Figure 42:
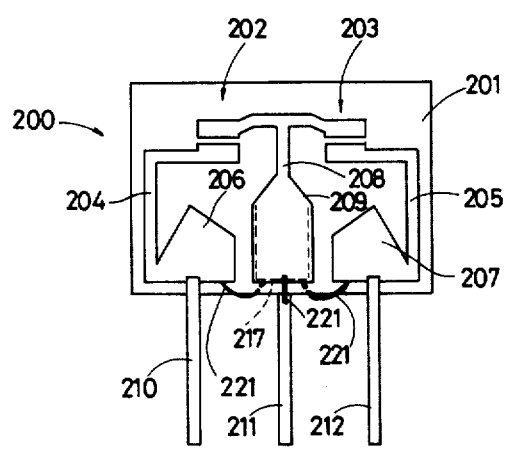

In the FIG. 42 embodiment, the resistive pastes 221 are formed on both surfaces of the plate 201, whereby the withdrawing electrode 206 and the capacitor electrode 217, the withdrawing electrode 207 and the capacitor electrode 217, and the electrode 209 and the capacitor electrode 217 are electrically connected, respectively. Meanwhile, the resistive pastes 221 may be formed at the positions as shown as 222 in FIG. 43, whereby the withdrawing electrodes 206 and 207 and the electrode 209 may be connected to the capacitor electrode 217. In other words, the connection positions may be arbitrarily determined, insofar as the same is suited for the purpose of the present invention.

Figure 43:
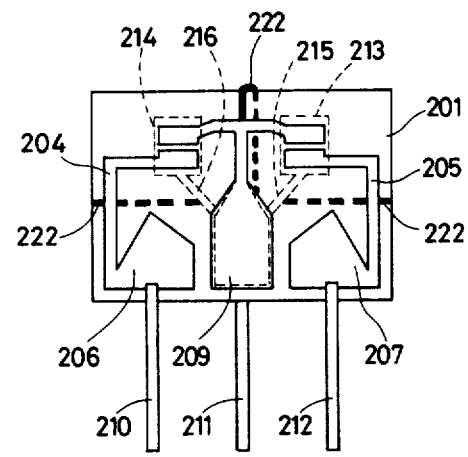

In the FIG. 43 embodiment, the electrodes 202 to 209 and 213 to 217 are formed not as a silver electrode by means of an evaporation process or a sputtering process but rather formed as a resistive metal such as a tantalum or titanium or metal oxide such as tin oxide by means of an evaporation process or a sputtering process. Then the silver pastes 222 (the resistance value is approximately zero) are formed on both surfaces of the plate 201, whereby the electrodes 204 and 216, the electrodes 215 and 205, and the electrodes 209 and 217 are directly connected, respectively. Although not shown, short-circuiting lead wires may be used in place of the silver paste 222, as a matter of course, and such connection portions may be determined arbitrarily, insofar as the same is suited for the purpose of the present invention. Furthermore, the silver pastes 222 and the short-circuiting lead wires may be of a resistive component.

Figure 44A:
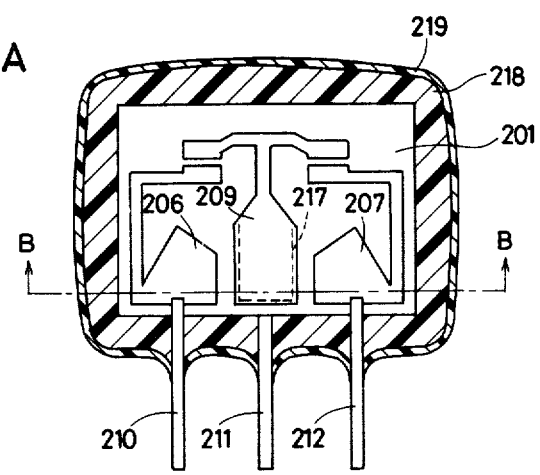
Figure 44B:
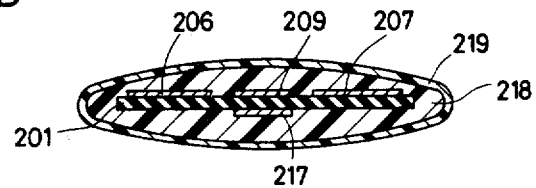

In the embodiment shown in FIGS. 44A and 44B, the resin coating layer 218 is formed with a resistive or semiconductive resin. Then the resin layer 218 is further covered with a highly insulating and/or wetproof resin layer 219. In either embodiment, a point is that the electric charge generating electrodes are connected with a resistance value smaller than that of the piezoelectric ceramic plate between such electric charge generating electrodes. In the case of any of the embodiments, the heat shock test was conducted with the previously described conditions. The result is shown in Table 4.

Table 4 shows the result of measurement of the characteristic (insertion loss and center frequency) of the 3-terminal filter element by the heat shock test with respect to the number of test cycles, wherein mean value ($\overline{X}$) and the diversification (R) are shown with respect to ten samples.

Sample No. 1 is a conventional one with the resistor 220 removed from the embodiment shown in FIGS. 41A and 41B. Sample No. 2 is the embodiment shown in FIGS. 44A and 44B, with the resistance value selected to be 1 k$\Omega$. Sample No. 3 is the FIG. 42 embodiment, with the resistance value selected to be 100 k$\Omega$. Sample No. 4 is the embodiment shown in FIGS. 44A and 44B, with the resistance value selected to be 10 M$\Omega$. Sample No. 5 is the embodiment shown in FIGS. 41A and 41B, with the resistance value of the fixed resistor element selected to be 10 M$\Omega$. Sample No. 6 is the FIG. 42 embodiment, with the resistance value selected to be 1000 M$\Omega$.

As seen from Table 4, in the absence of the insertion resistance in a conventional one, the more the number of cycles the larger a variation of the diversification loss and the center frequency and the more the diversification becomes. By contrast, as seen from the data in conjunction with sample Nos. 2 to 6, according to the present invention a variation of the insertion loss and the center frequency is not so large even if the number of cycles increases and the diversification is within the allowed range.

Figure 45:
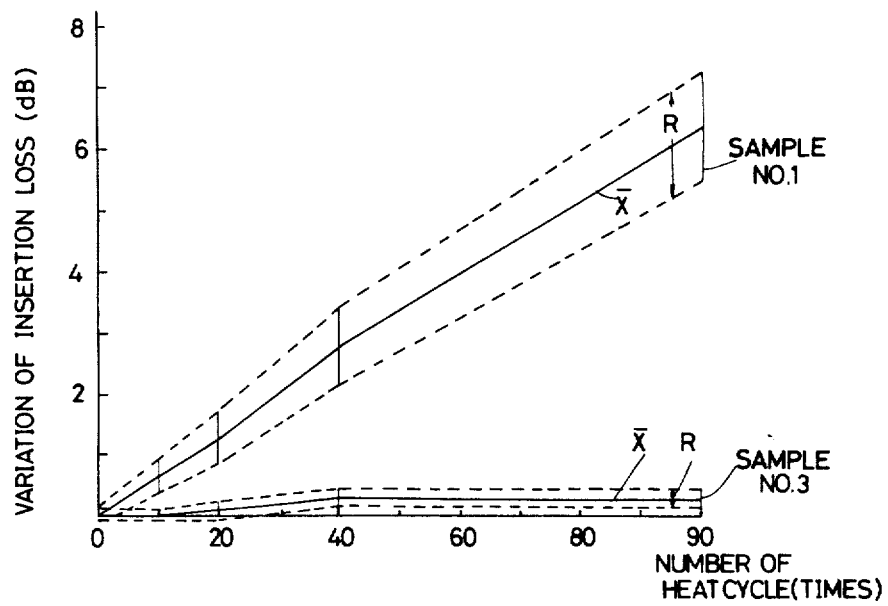
FIG. 45 is a graph showing a variation of the insertion loss of the FIG. 42 embodiment and a conventional piezoelectric ceramic filter.
Figure 46:
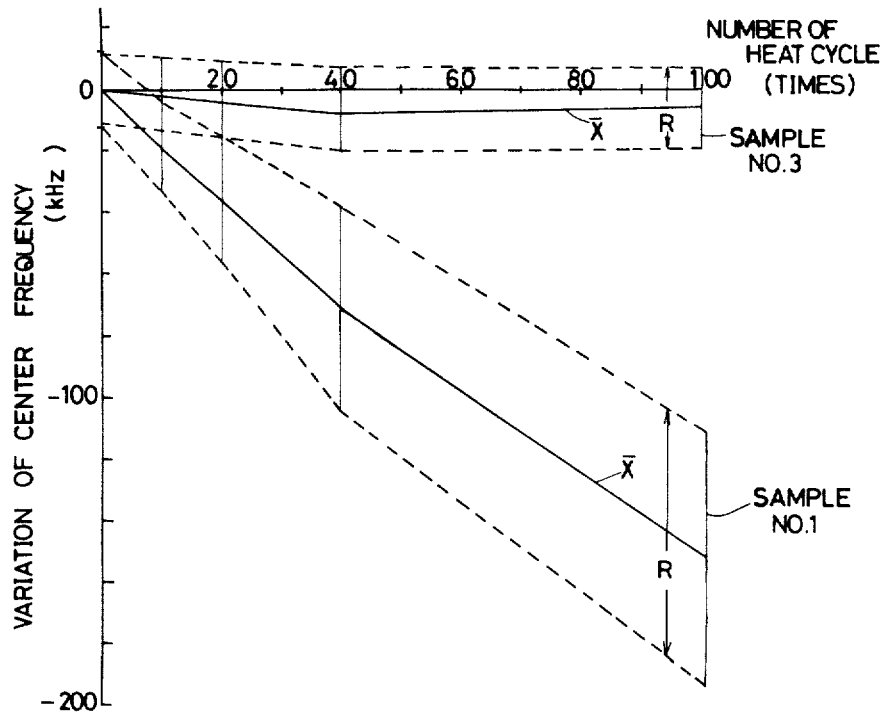
FIG. 46 is a graph showing a variation of the center frequency of the FIG. 42 embodiment and a conventional piezoelectric filter.

FIG. 45 is a graph showing a variation of the insertion loss with respect to the number of cycles for sample Nos. 1 and 3. FIG. 46 is a graph showing a variation of the center frequency with respect to the number of cycles for the same samples.

Figure 47:
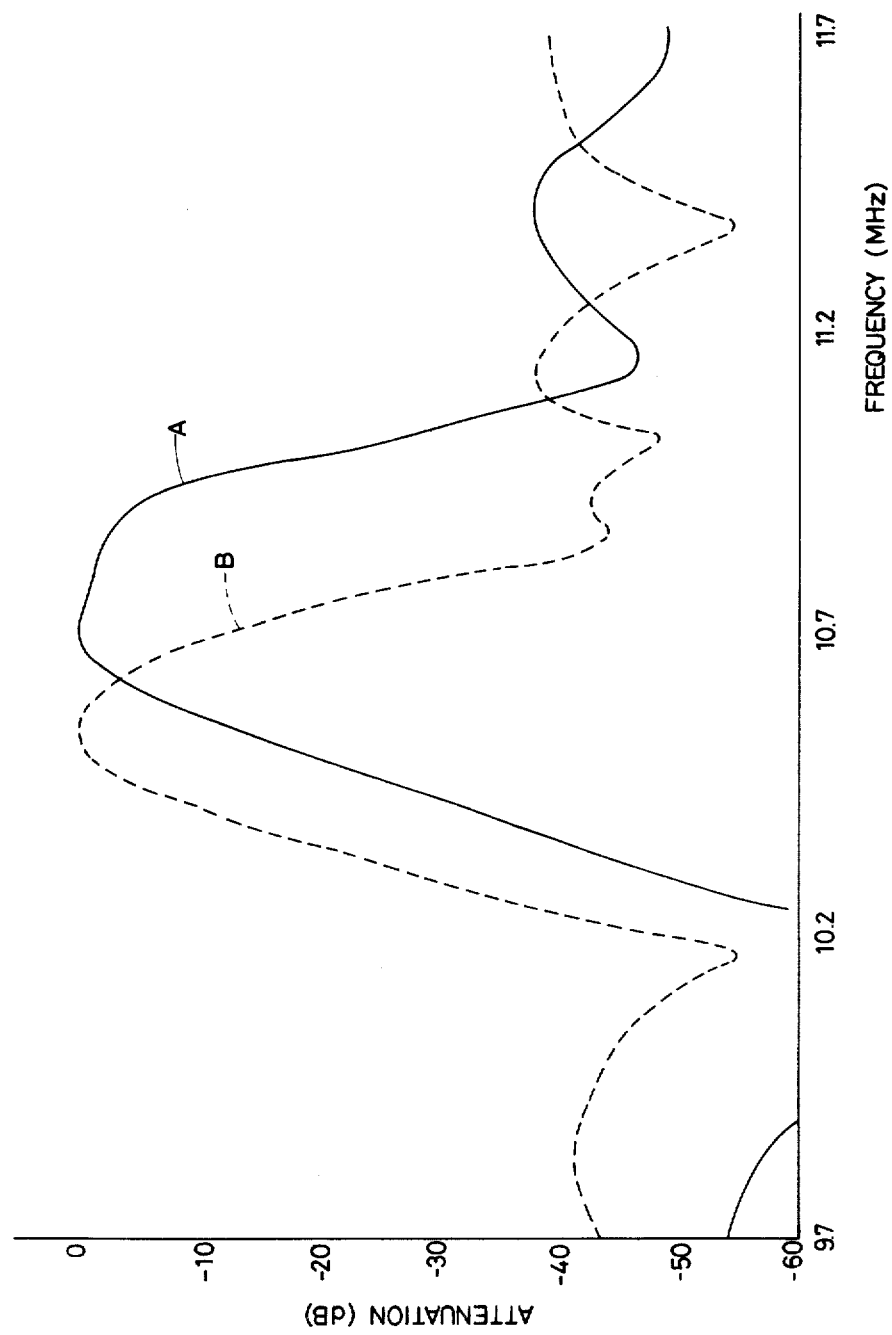
FIG. 47 is a graph showing the frequency response before and after the heat shock test of a conventional piezoelectric ceramic filter.
Figure 48:
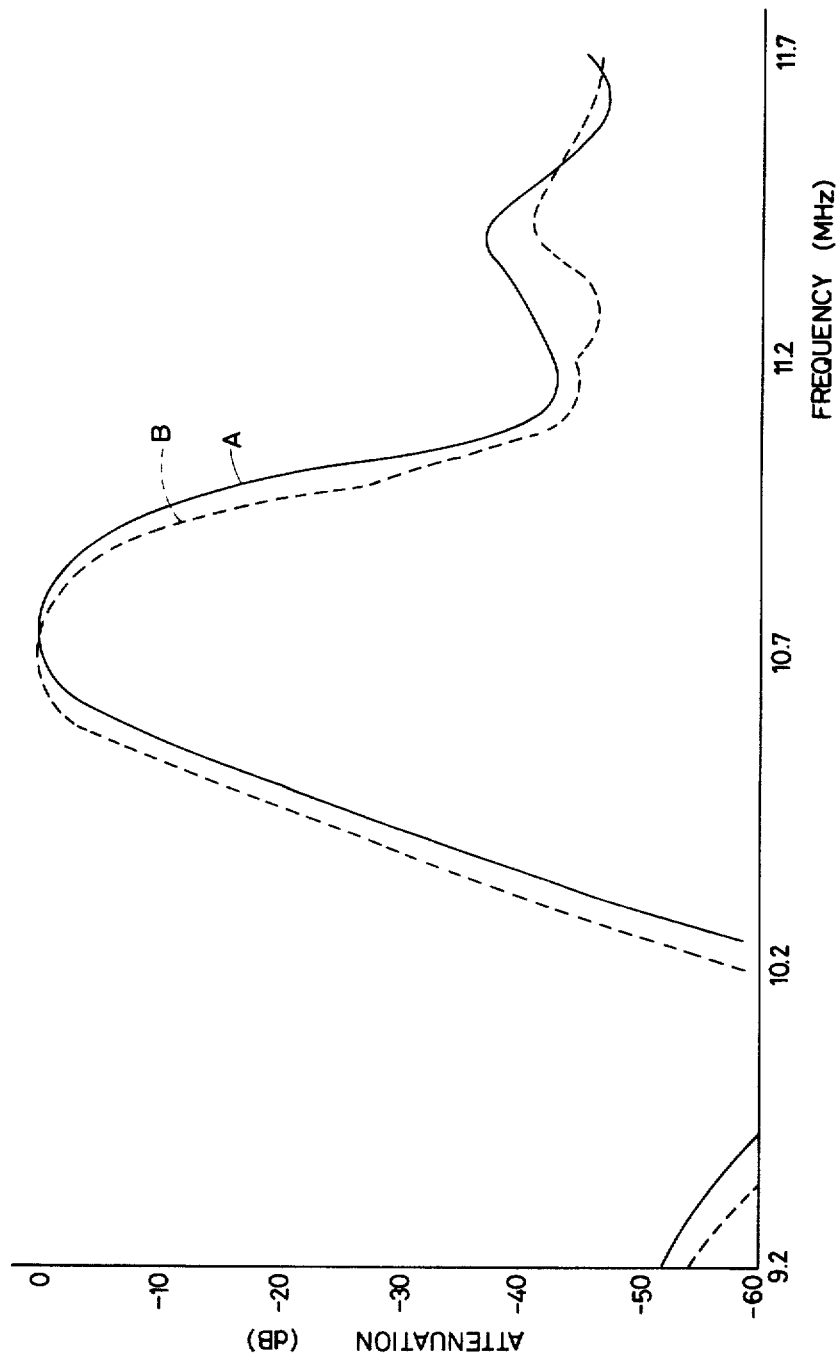
FIG. 48 is a graph showing the frequency response before and after the heat shock text of the piezoelectric ceramic embodying ceramic present invention, such as the FIG. 42 embodiment.

FIG. 47 is a graph showing a variation of the filter characteristic of sample Nos. 1 and FIG. 48 is a graph showing a variation of the filter characteristic of sample No. 3. Referring to FIGS. 47 and 48, the solid curve A shows the characteristic of the filter before the heat shock test and the curve B shows the characteristic of the filter after the heat shock test of 100 cycles. As seen from FIG. 47, the conventional one exhibits a largely changed central frequency characteristic and also exhibits a remarkable change in the attenuation characteristic, after the heat shock test of 100 cycles was conducted. By contrast, the filter embodying the present invention exhibits little shift of the central frequency and little change of the attenuation characteristic, even after the heat shock test of 100 cycles was conducted.

In the foregoing, the embodiments were shown as employing, as a resistor, a baked resistor, a fixed resistor element and the like. Furthermore, an example was shown in which resin serving as a resistive element was employed. However, semiconductor glass, paste, semiconductor oxide powder, paste like semiconductor resin and the like may be used for the purpose of the present invention and a point is that a resistor inserted state need be established from the standpoint of circuitry.

Furthermore, in the previously described embodiments, an electric connection was established such that a resistance is substatially inserted between the electrodes formed on both surfaces of the piezoelectric plate; however the respective electrodes may be separately connected to the ground potential with a given resistance value and a point is that a positive charge and a negative charge generated by the pyroelectric effect are mitigated instantaneously.

In the above described embodiment, the conductive member where the electric charge is stored constitute a vibrating electrode and other incidental electrode provided on the piezoelectric ceramic plate and the polarization axis direction is perpendicular to the plane of the piezoelectric ceramic plate where these electrodes are formed; however, further different examples to be described in the following may be considered.

Figure 49:
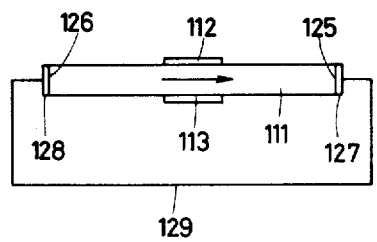
FIG. 49 is an outline side view showing another example of a piezoelectric ceramic resonator in accordance with one embodiment of the present invention.

FIG. 49 shows another structure of the piezoelectric resonator, which is primarily used as a trap element, wherein the polarization direction of the ferroelectric ceramic plate 111 is in parallel with the plane of the plate and is used in the so-called thickness shear vibration mode. In such a case, the ceramic plate 111 is of a square of 5 mm by 5 mm and 0.2 mm thick and the resistance value between the surfaces 125 and 126 in the polarization direction is $1 \times 10^{14} \Omega$. The vibrating electrodes 112 and 113 of 2 mm in diameter serving as one of the conductive members and other incidental electrodes (although not shown), are formed on the opposing main surfaces of the ceramic plate 111. The electrodes 127 and 128 serving as the conductive members are also formed on the side surfaces 125 and 126 of the ceramic plate 111 by means of the conventional well-known method. The resonance frequency is selected to be approximately 50 MHz.

With such a structure, the conductive member on the side where the electric charge is stored due to the temperature change mainly comprises the electrodes 127 and 128 and does not comprise the vibrating electrodes 112 and 113. Accordingly, in order to apply the present invention to such structure, the electrodes 127 and 128 may be electrically connected through a resistor by means of the short-circuiting lead wire 129, as shown in the figure. In such a case, the electrodes 127 and 128 may be made of a material having a resistivity by itself, such as a resistive metal oxide. Furthermore, the electrodes 127 and 128 may be electrically connected to the ground potential without being connected to each other.

Figure 50:
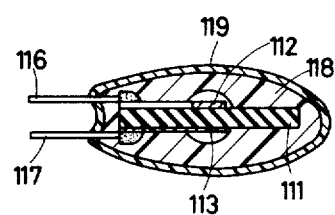
FIG. 50 is an outline sectional view showing a further example of a piezoelectric ceramic resonator in accordance with one embodiment of the present invention.

Furthermore, the structure shown in FIGS. 39A and 39B may be applied as one example of the package structure of the piezoelectric resonator. In such a case, the electrodes 127 and 128 may be dispensed with, as shown in FIG. 50. Even in the case of the embodiments of FIGS. 49 and 50, a point is that a circuit for discharging the generated electronic charge is formed. Thus, the generated electric charge discharging structure as depicted with reference to FIG. 47 can be applied not only to the 2-terminal type resonator but also to such a filter as shown in FIGS. 41A and 41B employing a thickness shear vibration mode.

Although the above described embodiments are mainly examples employing a thickness expansion or a thickness shear vibration mode it is pointed out that the present invention can be equally applied to those examples employing a thickness twist vibration mode or an electric field parallel type thickness shear vibration mode. In the lower frequency region, not a thickness vibration mode but a split ring vibration mode, a bending vibration mode, an expansion vibration mode, a radial directional vibration mode, an edge vibration mode and the like may be employed. It is pointed out that the present invention can be equally applied to those devices employing such vibration mode. In the following, a typical structure of a bulk wave resonator will be described.

Figure 51:
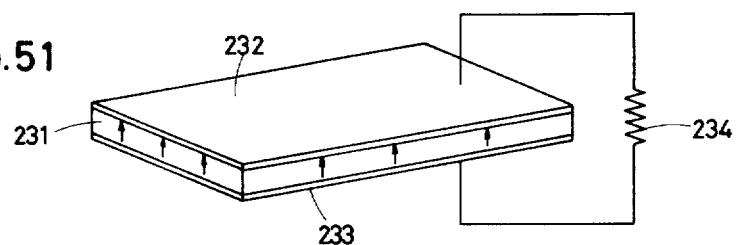
FIG. 51 is an outline perspective view of a rectangular plate type resonator in accordance with one embodiment of the present invention.

FIG. 51 is a so-called rectangle plate type resonator having the electrodes 232 and 233 formed on both main surfaces of a rectangular ceramic plate 231. Since the polarization direction is selected to be in the thickness direction, any suitable structure employed in the previously described embodiments may be employed in electrically connecting the electrodes 232 and 233 by the resistor 234, as shown.

Figure 52:
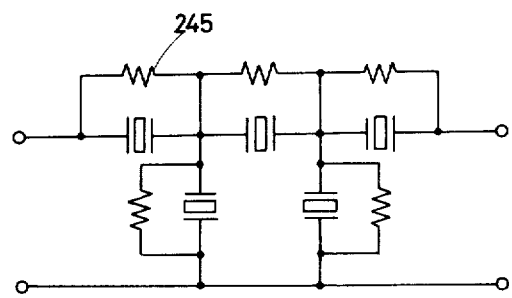
FIG. 52 is a schematic diagram of a ladder type filter.
Figure 53:
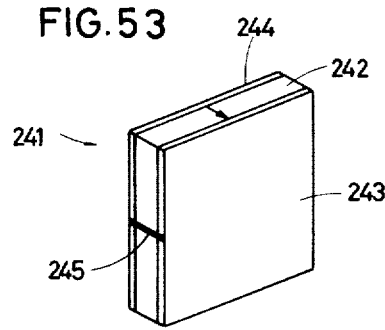
FIG. 53 is an outline perspective view of a resonator in accordance with one embodiment of the present invention which can be employed in the FIG. 52 ladder type filter.

FIG. 52 shows a schematic diagram of a ladder type filter embodying the present invention and FIG. 53 shows a rectangular plate type piezoelectric resonator 241 employing an edge vibration mode for use in such filter. In such a case as well, since the polarization direction is the thickness direction, the whole surface electrodes 243 and 244 are formed on both main surfaces of the ceramic plate 242, as shown and both electrodes 243 and 244 are connected by the resistor paste 245. Alternatively, any suitable structure employed in the previously described embodiments may be employed.

Figure 54:
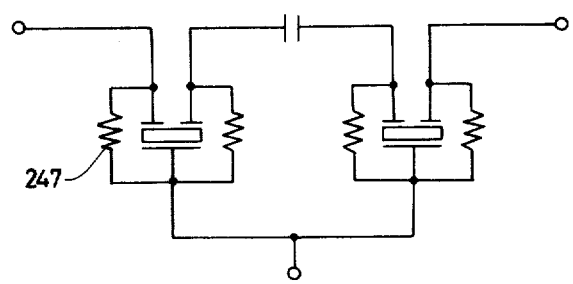
FIG. 54 is a schematic diagram of a 3-terminal type filter.
Figure 55:
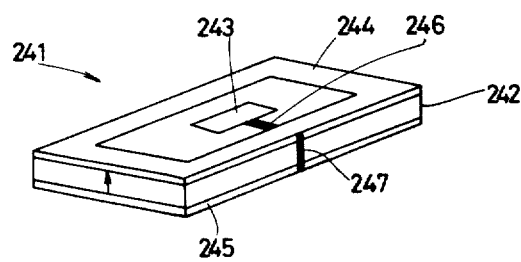
FIG. 55 is an outline perspective view showing a 3-terminal type filter element for use in the FIG. 54 embodiment.

FIG. 54 shows a schematic diagram of the so-called 3-terminal type filters employing an edge vibration mode connected by a series coupling capacitance and employing the present invention and FIG. 55 shows a 3-terminal type filter 241 employing the FIG. 54 filter. Even in such a case, the polarization direction is the thickness direction and therefore a dot electrode 243 and a ring electrode 244 are formed in a concentric manner on one main surface of the ceramic plate 242, as shown, and the whole surface electrode 245 is formed on the other main surface of the ceramic plate 242. The electrodes 243 and 244 are connected by the resistive paste 246 and the electrodes 244 and 245 are connected by the resistive paste 247. Alternatively, any suitable structure employed in the previously described embodiments may be employed in the embodiment shown.

Figure 56:
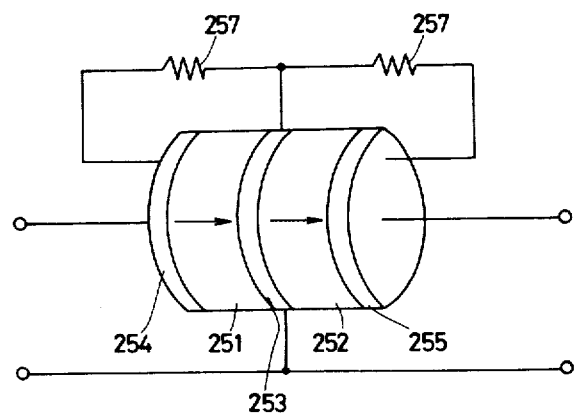
FIG. 56 is an outline perspective view of a disc composite type filter in accordance with one embodiment of the present invention.

FIG. 56 shows the so-called disc composite type filter wherein the common electrode 253 is formed on the junction surface of the disc ceramic plates 251 and 252, the input or output electrode 254 is formed on the ceramic plate 251, and the output or input electrode 255 is formed on the ceramic plate 252. The polarization direction is the thickness direction and therefore the electrodes 253 and 254 and the electrodes 253 and 255 are electrically connected, as shown, wherein any suitable structure as described in conjunction with the previously described embodiments may be employed.

Meanwhile, in the case where the polarization axis direction is oblique with respect to the plate surface, the embodiment in the case where the polarization axis direction is orthogonal to the plane of the plate and the embodiment in the case where the polarization axis direction is in parallel with the plane of the plate may be suitably combined depending on the magnitude of the electric charge generated due to the temperature change.

FIGS. 57 to 61 show in succession the steps of a process for manufacturing another example of a piezoelectric resonator in accordance with one embodiment of the present invention.

First referring to FIG. 57, a piezoelectric unit 101 is prepared. The piezoelectric unit 101 comprises a ferroelectric ceramic plate 111 of a lead titanate zirconate, for example. The vibrating electrodes 112 and 113 are formed to be faced to each other on the plate 111. The vibrating electrode 112 is connected to the withdrawing electrode 114 by means of the lead electrode 112a. The vibrating electrode 113 on the rear surface of the plate is connected to the withdrawing electrode 115 by means of the lead electrode 113a. The lead electrodes 114 and 115 are connected to the withdrawing terminals 116 and 117 by soldering. In such a state, the element is covered with the insulating resin layer 119' using a well-known process as disclosed in Japanese Patent Publication No. 22384/1970, for example, as shown in FIGS. 58A and 58B, thereby to complete the piezoelectric unit 101.

FIG. 59 is a view showing one example of a metallic case for use in the present invention. The metallic case 52' is provided with a space 53' large enough to accommodate the piezoelectric unit 101 in a state as shown in FIG. 58. The metallic case 52' is used to enhance the wetproofness and the magnetic shielding property and provide the product with a feeling of the high quality.

Figure 60:
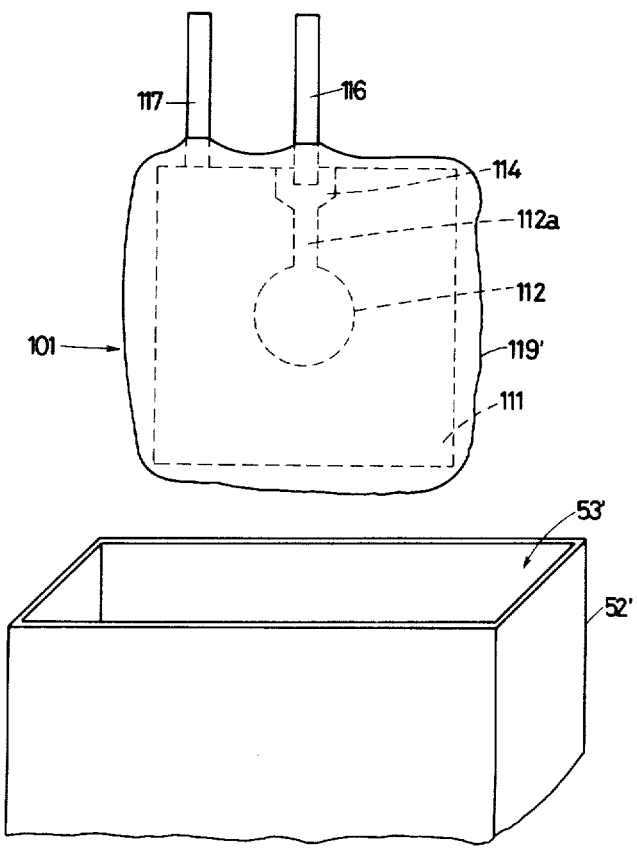

Then, as shown in FIG. 60, the piezoelectric unit 101 covered with the resin layer 119' is inserted into the space 53' of the metallic case 52' in the direction as shown.

Figure 61:
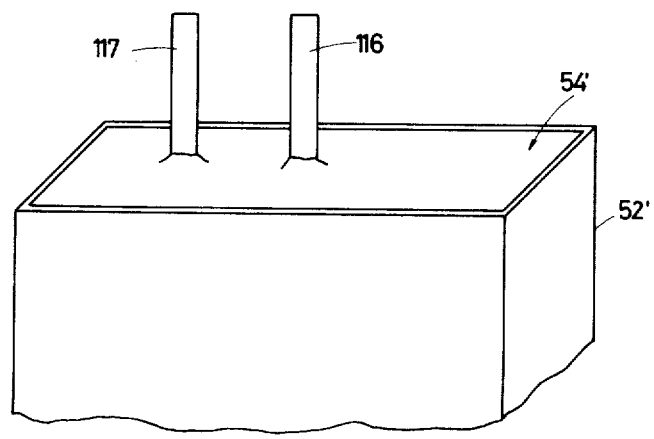

Then, as shown in FIG. 61, a filler or a potting meterial is filled between the metallic case 52' and the resin layer 119' and between the respective withdrawing terminals 116 and 117. The filler 54' is aimed to fix the piezoelectric unit 101 to the metallic case 52'. At that time, a resistive paste is used as the filler 54', wherein the resistance value thereof is selected such that the resistance value smaller than that of the unit (the ferroelectric ceramic plate 101) appearing between the terminals before the filler 54' is filled is connected in parallel between the terminals. Meanwhile, by "between the terminals", is meant a portion between the terminals where the positive and negative electric charges are stored due to a temperature change of the ferroelectric ceramic plate, as to be described subsequently. As such filler 54', one having carbon powder dispersed in epoxy resin, one having metal oxide powder dispersed in phenol resin, one having semiconductor powder dispersed in phenol resin, one having metal powder dispersed in silicone resin, or any suitable combination thereof may be utilized. As seen from FIG. 61, it follows that the respective withdrawing terminals 116 and 117 are electrically connected by means of the filler 54' (the resistive paste). By employing such a structure, the insertion loss and the central frequency of the device are likely to be less changeable with respect to the heat shock test. The reason why such stabilized characteristic can be attained may be presumably explained in the following manner. More specifically, a piezoelectric resonator comprising a ferroelectric ceramic of such as a barium titanate group, a lead titanate zirconate group, a lead titanate group and the like is responsive to a change of the ambient temperature, thereby to cause a pyroelectric effect due to a change of a spontaneous polarization at the electrode portions, whereby an electric charge is generated on the electrodes. Such electric change serves as a counterelectric filed causing a polarization in the direction opposite to the direction of the direct current electric field on the occasion the polarizing treatment, with the result that the piezoelectric characteristic of the plate is degraded. However, if and when the withdrawing terminals connected to the conductive members formed on the surface of the plate are electrically connected by means of a filler material or a potting material such as a resistive paste, as done in the above described embodiment, the electric charge generated by the pyroelectric effect is discharged through the resistive paste and as a result no counterelectric field is caused and degradation of the piezoelectric characteristic of the plate can be prevented. Accordingly, it is necessary that the resistive paste being used have a resistance value smaller than that of the plate itself.

Although the foregoing embodiment was an example wherein the electrodes formed on both main surfaces of the plate 101 are formed with a conductive member, the same may be formed with a resistive film or a semiconductive film of such as a resistive paste, for example. In such a case, the resistance value of the resistive paste serving as a filler material need be selected in consideration of a relation with the resistance value of the electrodes.

Although the above described embodiments were directed to an energy trapped 2-terminal type piezoelectric resonator, the present invention can also be applied to an energy trapped dual mode filter, a non-energy trapped type resonator and filter, in addition to the above described embodiments. Furthermore, an outer package of the piezoelectric unit may be not only a structure for covering with an insulating resin material but also a case, as molded, made of an insulating resin material. A point is that the present invention can be clearly applied to all of the ones having the terminals where the positive and negative electric charges are stored due to a temperature change of the ferroelectric ceramic plate withdrawn externally of an outer package made of such an insulating resin material (the ones which are naturally considered from the inherent structure of the piezoelectric unit or the ones having the terminals where the electric charge intentionally provided for withdrawal externally of the outer package).

Figure 62:
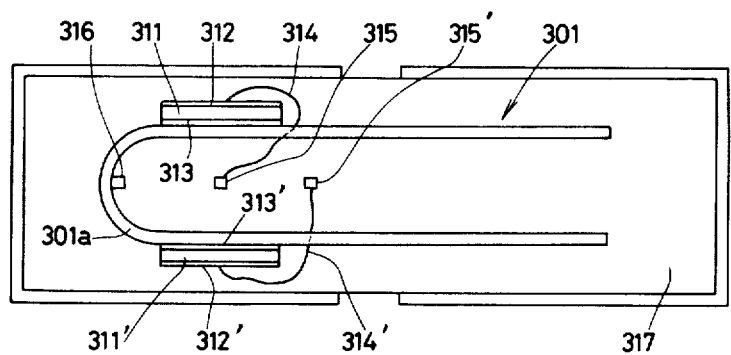
Figure 63:
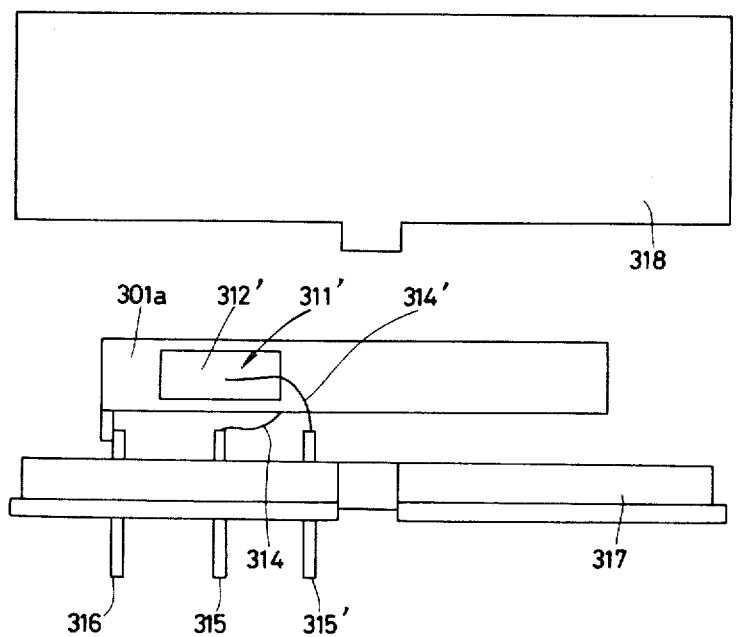

FIGS. 62 and 63 are views showing a piezoelectric tuning fork as one example of a mechanical resonator using a piezoelectric transducer embodying the present invention. Since the fundamental structure of such piezoelectric tuning fork is well-known to those skilled in the art, only those portions associatecd with the present invention will be briefly described. The piezoelectric tuning fork 301 is provided with opposing electrodes and comprises piezoelectric plates 311 and 311' of rectangular plates of $1.7 \times 7 \times 0.2$ mm adhered to the node portion of vibration of the tuning fork fingers or to the vicinity thereof. More specifically, the piezoelectric plate 311 (since the piezoelectric plate 311' is the same, the piezoelectric plate 311' will not be explained in the following. Likewise, those reference characters with a prime are the same as those without a prime and will not be explained) is made of a ferroelectric ceramic of a lead titanate zirconate group, for example, and has been polarized in the thickness direction. The electrodes 312 and 313 are formed to be faced to each other on the piezoelectric ceramic plate 311. The electrode 312 is connected to the withdrawing terminal 315 by means of the lead 314. A protrusion integrally formed on the edge portion of the base portion 301a of the tuning fork 301 is fixed to the common withdrawing terminal 316. The withdrawing terminals 315 and 315′ and the common withdrawing terminal 316 are maintained in a state of penetration through the resin base 317 and the inside has been shielded with the base 317 and the conductive case 318.

Figure 64:
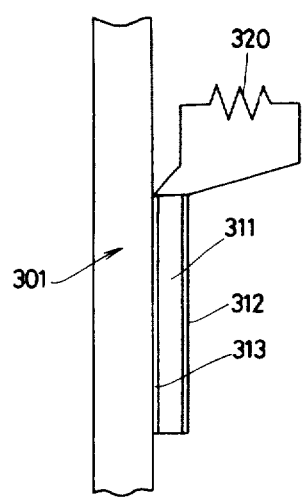
FIGS. 64 and 66 are outline side views of major portions of different examples of a piezoelectric tuning fork in accordance with one embodiment of the present invention.

FIG. 64 and further figures show different embodiments of the present invention, wherein only major portions are shown. It is self-evident that an actual piezoelectric tuning fork being practiced is not limited to such a structure as shown in FIGS. 62 and 63. The size of the piezoelectric plate 311 and the size of the electrodes 312 and 313 are the same as those in FIGS. 62 and 63. In these embodiments, the ceramics of a lead titanate zirconate group of a composition such as $(Pb_{0.95}Sr_{0.05})(Ti_{0.48}Zr_{0.52})O_3 + 0.75$ wt% $Nb_2O_5 + 0.15$ wt% $Cr_2O_3 + 0.5$ wt% $MnO_2$ was employed for the piezoelectric plate, as in the case of the embodiment shown in FIGS. 62 and 63. In the case where the above described ceramics is utilized, the resistance value between the electrodes 312 and 313 in a conventional structure without employing the present invention was $7 \times 10^{11} \Omega$.

In the FIG. 64 embodiment, a fixed resistor 320 was connected between the electrodes 312 and 313. Although a resistor of any value such as 1 k$\Omega$, 100 k$\Omega$, 10 M$\Omega$ or 1000 M$\Omega$ may be used, the embodiment employed the resistive element of 100 k$\Omega$. The connection portion of the resistor 320 may be arbitrarily determined between the electrodes 312 and 313, insofar as the same is suited for the purpose of the present invention.

Figure 65:
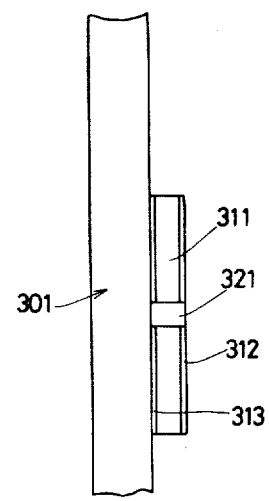

In the FIG. 65 embodiment, the resistive paste 321 is baked on the side surface and between both surfaces of the piezoelectric ceramic plate 311, whereby the electrodes 312 and 313 were connected with a given resistance value. As the resistive paste 321, one having carbon powder dispersed in phenol resin, for example, was employed, and the resistor paste 321 of 1 k$\Omega$ or 10 M$\Omega$ was baked in the experiment, although the resistance value may be such as 1 k$\Omega$, 100 k$\Omega$, 10 M$\Omega$ and 1000 M$\Omega$. Meanwhile, the resistive paste 321 is formed at the position as shown as "322" in FIG. 66, whereby the electrodes 312 and 313 are connected. In other words, the connection portion may be arbitrarily selected, insofar as the same is suited for the purpose of the present invention.

Figure 66:
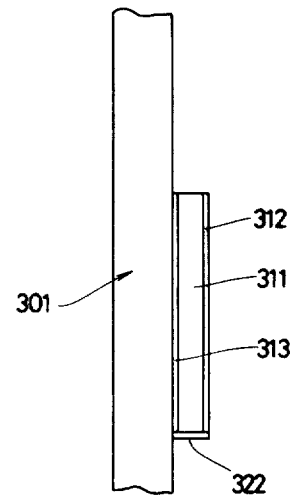

Although in the embodiments previously described or to be described subsequently in conjunction with FIGS. 64, 65 and 67, the electrodes were implemented as a silver electrode having a resistance value being approximately zero formed in accordance with an evaporation process or a sputtering process, in the FIG. 66 embodiment these electrodes are formed with a resistive metal (such as tantalum or titanium) or resistive metal oxide (such as tin oxide) in accordance with an evaporation process or a sputtering process. In the embodiment shown, the silver paste 322 having the resistance value being approximately zero is baked to be formed on the side surface and between both surfaces of the piezoelectric plate 311, whereby the electrodes 312 and 313 are directly connected rather than through a resistor. Of course, the electrodes may be short-circuited using a lead wire, not shown, in place of the silver paste 322 and the connection portion thereof may be arbitrarily selected, insofar as the same is suited for the purpose of the present invention. Furthermore, the silver paste 322 or the shortcircuiting lead wire may be of a resistance component. The resultant resistance value of these electrodes and the silver paste 322 or the short-circuiting lead wire must be selected to be smaller than the resistance value between the electrodes 312 and 313 of the piezoelectric ceramic plate 311 per se.

Figure 67:
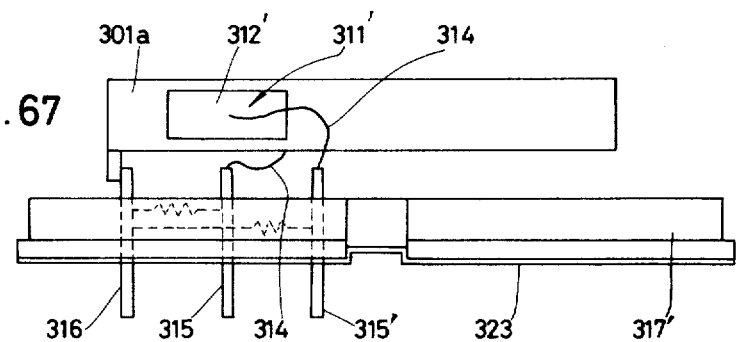
FIG. 67 is a view showing another example of a tuning fork in accordance with one embodiment of the present invention.

In the FIG. 67 embodiment, a resistive or a semiconductive resin material was used as a material for forming the base 317′. As the material for the base 317′, one having powder of carbon, metal, metal oxide, or semiconductor oxide or powder of semiconductor glass dispersed in epoxy resin may be used. Although the resistance value may be selected to be 1 k$\Omega$, 100 k$\Omega$, 10 M$\Omega$ or 100 M$\Omega$, in the experiment the resistance values of 10 M$\Omega$ and 1000 M$\Omega$ were employed. In the case where the resistive paste 317′ is used as in the embodiment shown, the base 317′ is further coated with a highly insulating and/or wetproof resin layer 323. The insulating resin layer 323 may be of a conventional epoxy resin material. In the embodiment shown, when the electrode 313 is electrically conductive to the tuning fork base 301a, it follows that the withdrawing terminal 315 and the common withdrawing terminal 316 are connected to each other by means of the resistive base 317′ and accordingly the electrodes 312 and 313 are connected through a resistance value of the resistive paste 317′.

The piezoelectric tuning fork thus formed was then subjected to the heat shock test. The conditions of the heat shock test were selected as follows. More specifically, the tuning fork was maintained for 60 minutes at each of the temperatures of $-55°$ C. and $+100°$ C., while a temperature was shifted from $-55°$ C. to $+100°$ C. and such cycle was repeated for 100 times or for 100 cycles. The temperature shift from $-55°$ C. to $+100°$ C. or the reversed temperature shift were made within few seconds.

The result of the heat shock test is shown in Table 5. Meanwhile, in Table 5 those embodiments shown in FIGS. 64, 65 and 67 were used as sample Nos. 2 to 6, and a conventional one shown in FIG. 62 was used as sample No. 1. In the case of any of the embodiments, a point is that the charge generating electrodes are connected with a resistance value smaller than the resistance value of the piezoelectric ceramic plate between the electric charge generating electrodes. In case of any of the embodiments, the heat shock test was conducted with the previously described conditions. The result is shown in Table 5.

Table 5 shows the result of measurement of the characteristic (the insertion loss and the resonance frequency) of the piezoelectric resonator due to the heat shock test with respect to the number of test cycles.

As seen from Table 5, in the case of the conventional ones shown in FIGS. 62 and 63 without an inserted resistor, the more the number of cycles of the heat shock the larger the change of the insertion loss and the change of the resonance frequency. By contrast, referring to the FIG. 65 embodiment, the example where the resistive paste 321 was selected to 1 k$\Omega$, i.e. sample No. 2 exhibits little change in the insertion loss and a variation of the resonance frequency fr within the allowed range. Likewise, the FIG. 64 embodiment with the fixed resistive element 320 selected to be 100 k$\Omega$ is shown as sample No. 3. The FIG. 67 embodiment with the resistive resin paste 317′ selected to be 10 M$\Omega$ is shown as sample No. 4. Furthermore, FIG. 66 embodiment with the resistance value selected as 10 M$\Omega$ is shown as sample No. 5 and the FIG. 67 embodiment with the resistance value selected to be 1000 MΩ is shown as sample No. 6. Thus it would be appreciated that the change of the insertion loss and the change of the resonance frequency of sample Nos. 2 to 6 in Table 5 have been clearly and assuredly improved as compared with the conventional one as shown in FIGS. 62 and 63, i.e. sample No. 1.

Figure 68:
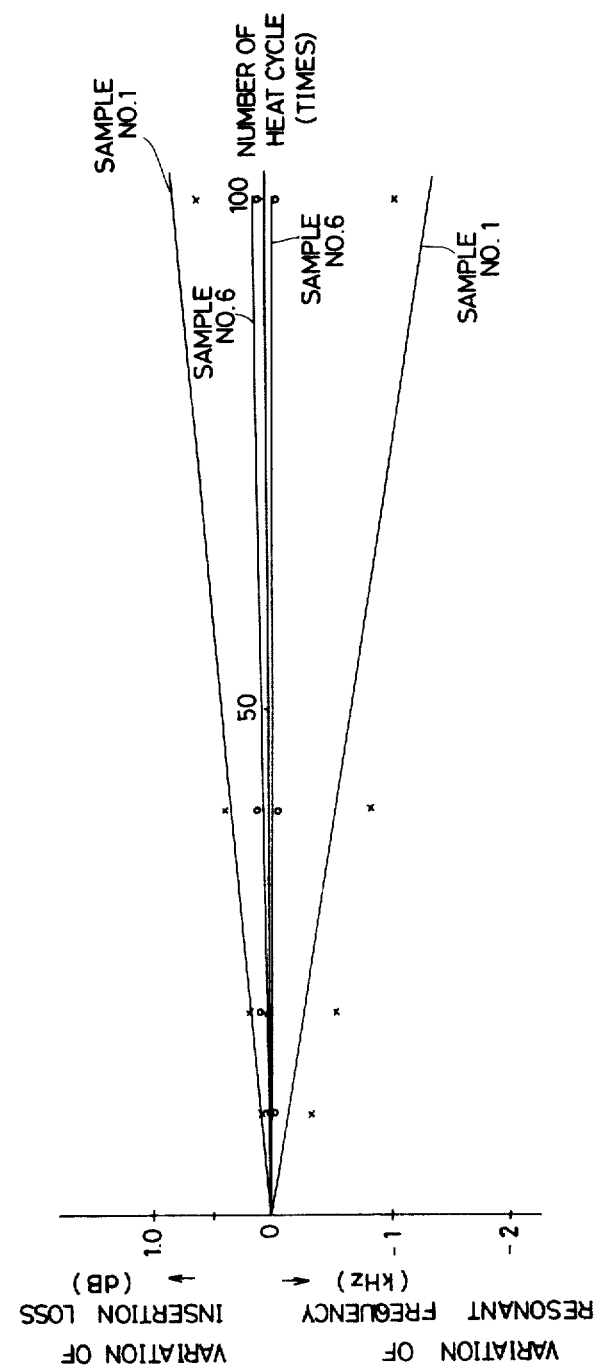
FIG. 68 is a graph showing a variation of the insertion loss and the resonance frequency of a tuning fork in accordance with one embodiment of the present invention and a conventional tuning fork.

FIG. 68 is a graph prepared based on the data shown in Table 5 and shows the variations of the insertion loss and the resonance frequency between sample No. 6, i.e. the FIG. 67 embodiment with the resistance value of the resin base 317′ selected to be 1000 MΩ and sample No. 1, i.e. the FIG. 62 conventional one.

Meanwhile, it is required that the resistance value of the fixed resistor element 320 in the FIG. 64 embodiment, the resistance value of the resistive paste 321 in the FIG. 65 embodiment, and the resistance value of the resin base 317′ of the FIG. 67 embodiment are all smaller than the resistance value between the electrodes 311 and 312 of the piezoelectric ceramic plate 311. Furthermore, in the case of the FIG. 66 embodiment, the total sum of the resistance value of the respective electrodes 312 and 313 formed with the resistive paste and the resistance value of the silver paste 322 must be selected to be smaller than the resistance value between the electrodes 311 and 312 of the piezoelectric ceramic plate 311. In other words, by evaluating a relation between the resistance value of the ceramic plate of various materials and the change of the electric characteristic due to the heat shock test, it was uncovered that as the resistance value of the ceramic plate becomes small the change of the electric characteristic due to the heat shock test becomes small. The reason is presumed to be that the electric charge of the counterelectric field opposite to the direction of the electric field on the occasion of polarization due to the pyroelectric effect is not stored on the electrodes facing each other on the ferroelectric ceramic plate and is naturally discharged through the internal path of the ceramic plate.

However, it was also uncovered that as the resistance of the ceramic plate decreases as described above the piezoelectric property decreases and a diversification of the electric characteristic decreases. Therefore, another natural discharge path for decreasing the resistance value of the piezoelectric ceramic plate per se must be considered. In other words, this means that it would be better to discharge the electric charge through an external circuit rather than a discharge through an internal path of the ceramic plate and accordingly the electrodes where the electric charge are generated are connected with a resistance smaller than the resistance value inside the ceramic plate, including a case of the resistance being zero. However, in the case of the structure where the electrode plane intersects the polarization direction, it is necessary that the inherent operation as the piezoelectric transducer may not be hindered, which means that there is a limitation to the decrease of the resistance value. Since such lower limit cannot be generally determined, the lower limit must be determined on a case by case basis.

In the case of the heat shock test, when the temperature is shifted from the low temperature (−55° C.) to the high temperature (+100° C.), an electric field is generated in the forward direction of the polarization direction between the electrodes on both sides of the plate 311 and when the temperature shift is from the high temperature to the low temperature an electric field is generated in the reversed direction. It is presumed that the polarization of the plate 311 is lost by such alternating electric field and a decrease of the piezoelectric property results. Therefore, according to the present invention, for the purpose of mitigating instantaneously such alternating electric field, the electrodes on both surfaces intersecting the polarization direction of the plate 311 are electrically connected with a given resistance value.

In the above described embodiments, a baked resistor, a fixed resistor and the like were employed as a resistance. Furthermore, an example of using resin serving as a resistor at the same time was also described. However, for the purpose of the present invention, a semiconductor glass paste, semiconductor oxide powder paste, semiconductor resin and the like may be used and a point is that a state of a resistance being inserted from the standpoint of circuitry is to be established.

Furthermore, although in the above described embodiments the electrodes formed on both surfaces of the piezoelectric plate were electrically connected with a resistance being inserted, the same situation may be established such that the respective electrodes are separately connected to the ground potential with a given resistance value, including zero, and a point is that the positive and negative electric charges generated due to the pyroelectric effect need be promptly decreased.

Although in the foregoing there were depicted the embodiments having the conductive members where the electric charges are stored being formed as the electrodes with the polarization axis direction being perpendicular to the plane of the piezoelectric ceramic plate where these electrodes are provided, the following examples may be further considered.

Figure 69:
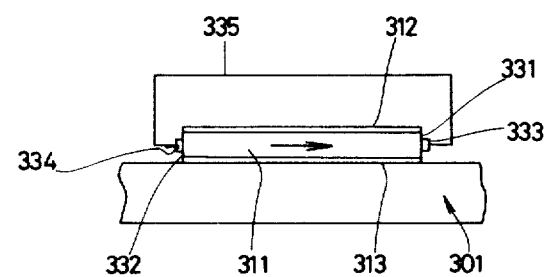
FIG. 69 is a view showing another example of a piezoelectric tuning fork in accordance with one embodiment of the present invention.

FIG. 69 shows another structure of the piezoelectric transducer, wherein the polarization direction of the ferroelectric ceramic plate 311 is in parallel with the plane of the plate. In this case, the ceramic plate 311 comprises a rectangular plate of 1.7 mm×7 mm and of 0.2 mm thick, and the resistance value between the planes 331 and 332 perpendicular to the polarization direction was 5×10$^{13}$Ω. The electrodes 312 and 313 serving as one of the conductive members are formed on the opposing main surfaces of the ceramic plate 311. Furthermore, the electrodes 333 and 334 serving as the conductive members are also formed on the side surfaces 331 and 332 of the ceramic plate 311 in accordance with a well-known process. With such structure, the conductive members on the side where the electric charges are stored due to the temperature change mainly comprises the electrodes 333 and 334 and not the electrodes 312 and 313. Accordingly, for the purpose of applying the present invention, the electrodes 333 and 334 are connected with the short-circuiting lead wire 335, as shown. The electrodes 333 and 334 may be electrically connected through a resistor. In such a case, the electrodes 333 and 334 may be formed of a material having a resistivity itself such as a resistive metal oxide. Alternatively, the electrodes 333 and 334 are not connected to each other but instead are electrically connected to the ground potential.

Thus, the present invention can be applied not only to a piezoelectric tuning fork as in the case of the above described embodiments but also to any type of mechanical filter wherein a piezoelectric transducer is combined with a mechanical resonator. In the following a typical mechanical filter will be described.

Figure 70:
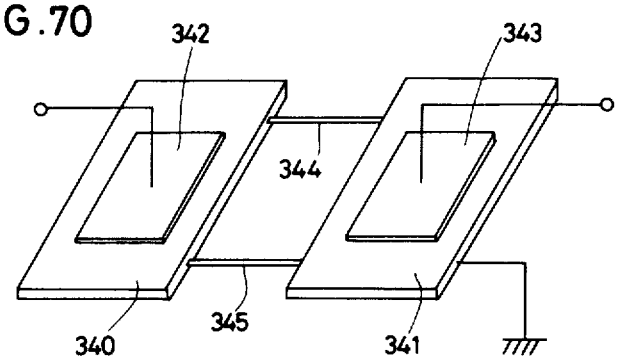
FIG. 70 is an outline perspective view of a tuning reed filter in accordance with one embodiment of the present invention.

FIG. 70 shows a tuning reed filter wherein the piezoelectric transducers 342 and 343 are fixed to the resonators 340 and 341 to cause a lateral vibration and which are coupled by means of twisted couplers 344 and 345.

Figure 71:
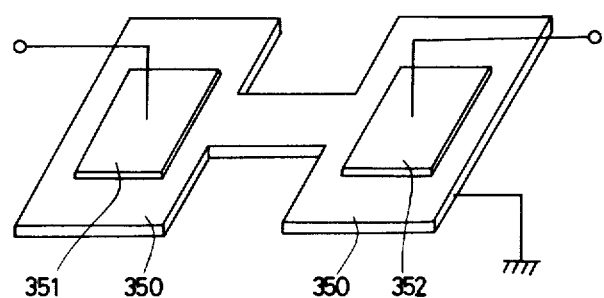
FIG. 71 is an outline perspective view of an H type filter in accordance with one embodiment of the present invention.

FIG. 71 shows one wherein the piezoelectric transducers 351 and 352 are fixed to the H shaped resonator 350 to cause an expansion vibration.

Figure 72:
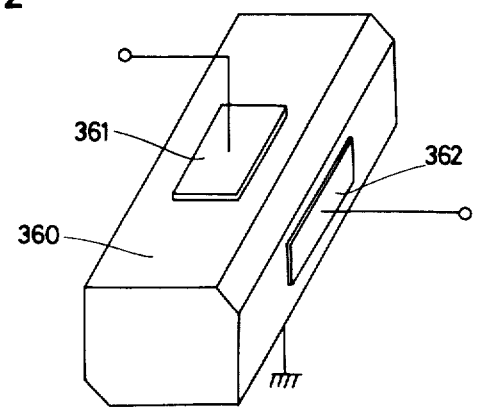
FIG. 72 is an outline perspective view of a multiple mode filter in accordance with one embodiment of the present invention.

FIG. 72 is one example of a mechanical filter utilizing a multiple vibration mode, wherein the piezoelectric transducers 361 and 362 are fixed to two adjacent side surfaces of a resonator 360 of approximately a square prism.

As a matter of course, the present invention is not limited to the above described structures and a point is that the present invention can be applied to any type of structures wherein the piezoelectric transducer is combined with a mechanical resonator.

Meanwhile, in the case where the polarization axis direction is oblique with respect to the plane of the plate, the embodiment in the case where the polarization axis direction is orthogonal to the plane of the plate and the embodiment in the case where the polarization axis direction is in parallel with the plane of the plate may be suitably combined depending upon the magnitude of the electric charge generated due to a temperature change.

Figure 73:
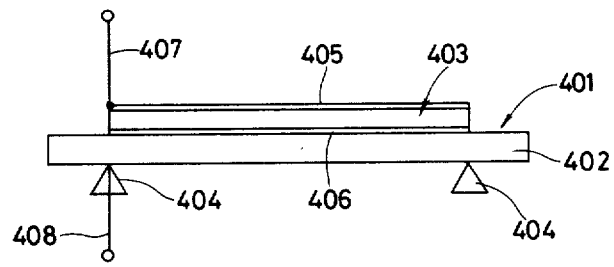
FIG. 73 is a view showing one example of a conventional 2-terminal type piezoelectric buzzer wherein the present invention can be employed.

FIG. 73 shows a conventional piezoelectric buzzer which is an example of an electroacousic transducer using a piezoelectric transducer wherein the present invention can be practiced. Since a fundamental structure of such piezoelectric buzzer is well-known to those skilled in the art, only those portions associated with the present invention will be described in the following. The piezoelectric buzzer 401 for generating the vibration frequency of 3.160 kHz comprises a piezoelectric plate 403 of 25 mm in diameter and 0.23 mm in thickness fixed concentrically on one main surface of a metallic disc 402 of 35 mm in diameter and 0.48 mm in thickness, while the metallic disc 402 is supported on the other surface thereof by the support 404 at the position opposing to the vicinity of the peripheral edge of the piezoelectric plate 403. The piezoelectric plate 403 is made of ferroelectric ceramic of a lead titanate zirconate group, for example, as polarized in the thickness direction. The electrodes 405 and 406 of 25 mm in diameter for exciting the plate 403 thereat are formed faced to each other on the piezoelectric ceramic plate 403. The electrodes 405 and 406 are connected to the respective withdrawing leads 407 and 408, respectively, by soldering.

FIGS. 74, 75, 76 and 77 are views showing piezoelectric buzzers of another embodiments of the present invention. Referring to these figures, the same portions as those in FIG. 73 are denoted by the same reference numerals and a detailed description thereof will be omitted. In these embodiments, as a composition of the piezoelectric plate 403, ceramics of a lead titanate zirconate group of such as $(Pb_{0.95}Sr_{0.05})(Ti_{0.48}Zr_{0.5\text{-}2})O_3 + 0.75$ wt% $Nb_2O_5$ was employed as in the case of the FIG. 73 embodiment. In the case where such ceramics is employed, the resistance value between the withdrawing leads 407 and 408 in a conventional state without embodying the present invention, i.e. the resistance value between the electrodes 405 and 406 were $3 \times 10^{10} \Omega$.

Figure 74:
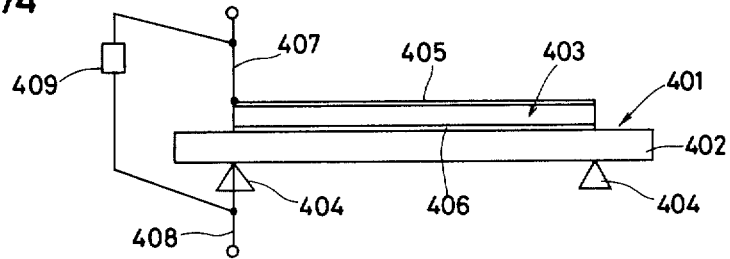
FIGS. 74 to 77 are views for showing different examples of a piezoelectric buzzer in accordance with another embodiment of the present invention.

In the FIG. 74 embodiment, a fixed resistor 409 was connected between the withdrawing leads 407 and 408. The resistance value thereof can be selected to be 1 kΩ, 100 kΩ, 10 MΩ or 1000 MΩ, for example, the embodiment shown employed the resistor element of 100 kΩ. The connection portion of the resistor 409 may be selected arbitrarily such as between the electrodes 405 and 406, between the withdrawing leads 407 and 408, and the like, insofar as the same is suited for the purpose of the present invention.

Figure 75:
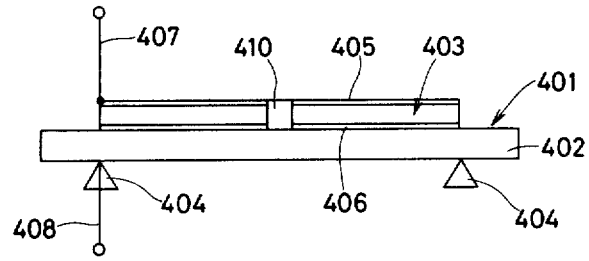

In the FIG. 75 embodiment, the resistive paste 410 was baked on the side surface and between both surfaces of the piezoelectric ceramic plate 403, whereby a given resistance value was established between the electrodes 405 and 406. As the resistive paste 410, one having carbon dispersed in phenol resin was employed and, although the resistance value may be selected to be 1 kΩ, 100 kΩ, 10 MΩ or 1000 MΩ, in the experiment the resistive paste 410 of 1 kΩ and 10 MΩ were baked. The resistive paste 410 is formed at the position as shown as "411" in FIG. 76, whereby the electrodes 405 and 406 are connected. In other words, the connection portion and the width of the paste may be arbitrarily determined, insofar as the same are suited for the purpose of the present invention. Accordingly, a further structure for covering the peripheral surface with the resistive paste can also be considered, for example.

Figure 76:
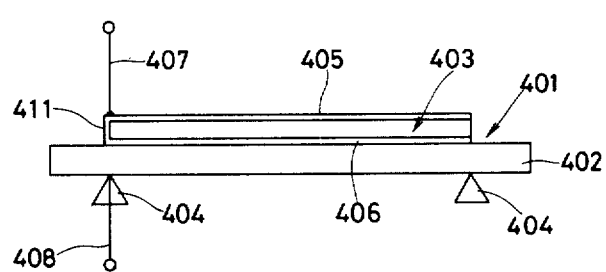
Figure 77:
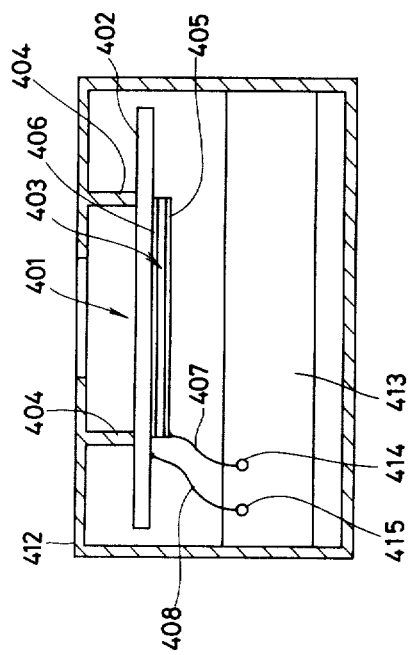

Although in the embodiments described in conjunction with FIGS. 74 and 75 and to be described in conjunction with FIG. 77 a silver electrode is used having a resistance value being approximately zero as electrodes in accordance with an evaporation process or a sputtering process, for example, in the FIG. 76 embodiment these electrodes are formed with resistive metal (such as tantalum or titanium) or resistive metal oxide (such as tin oxide) in accordance with an evaporation process or a sputtering process. In the embodiment shown, the silver pastes 411 having the resistance value being approximately zero are baked over both surfaces of the piezoelectric ceramic plate 403, whereby the electrodes 405 and 406 are directly connected without through a resistance. As a matter of course, the electrodes may be short-circuited by means of a lead wire, not shown, in place of the above described silver paste 411 and a connection portion thereof may be arbitrarily determined, insofar as the same is suited for the purpose of the present invention. Furthermore, the silver paste 411 or the short-circuiting lead wire may be of a resistive component. It is required that the resultant resistance value of the electrodes and these silver paste 411 and the short-circuiting lead be selected smaller than the resistance value between the electrodes 405 and 406 of the piezoelectric ceramic plate 403 per se.

The FIG. 77 embodiment comprises a buzzer apparatus comprising a buzzer 401 and a driver circuit for the buzzer 401 both housed in a resonance case 412, wherein the present invention was employed. Predetermined terminals 414 and 415 of the plate 413 (illustration of the components was omitted) for incorporating the driver circuit are connected to the withdrawing leads 407 and 408, respectively. Accordingly, for the purpose of embodying the present invention, a resistive or semiconductive resin material was used for the case 412 and/or the plate 413. As a material for the case 412 and/or the plate 413, one having powder of carbon, metal, metal oxide, semiconductor oxide or powder of semiconductor glass dispersed in epoxy resin may be employed. Although the resistance value thereof may be selected to be 1 kΩ, 100 kΩ, 10 MΩ and 1000 MΩ, in the experiment the resistance value was selected to be 10 MΩ and 1000 MΩ. Furthermore, the case 412 and/or the plate 413 may be coated with a highly insulating and/or wetproof resin material. The above described insulating resin material may be a conventional epoxy resin material. In the embodiment shown, it follows that the electrodes 405 and 406 are connected to each other by means of the above described resistive case 412 and/or plate 413 and accordingly the electrodes 405 and 406 are connected through a resistance value of the case 412 and/or the plate 413.

The piezoelectric buzzer 401 thus structured was then subjected to the heat shock test. The conditions of the heat shock test were selected as follows. More specifically, in one cycle the buzzer was maintained at −55° C. and +100° C. each for 60 minutes, wherein the temperature shift was made from −55° C. to +100° C., and such cycle was repeated 100 times or for 100 cycles. The temperature shift from −55° C. to +100° C. or the temperature shift in the reversed direction was made within few seconds.

The result of the heat shock test is shown in Table 6. Meanwhile, in the experimentation for Table 6, the embodiments shown in FIGS. 74, 75 and 77 were employed as sample Nos. 2 to 6 and the conventional one shown in FIG. 73 was employed as sample No. 1. In case of any of the embodiments, a point is that the electric charge generating electrodes may be connected with a resistance value smaller than the resistance value of the piezoelectric ceramic plate between the electric charge generating electrodes. In case of any of the embodiments, the heat shock test was conducted under the previously described conditions. The result is shown in Table 6.

Table 6 shows the result of measurement of the characteristic of the piezoelectric buzzer 401, i.e. the sound pressure as measured at a predetermined distance (10 cm) due to the heat shock test with respect to the number of test cycles. Measurement was made with the buzzer element 401 housed in the resonance case 412.

As seen from Table 6, the conventional device shown in FIG. 73, i.e. the one without an inserted shunt resistance value, exhibits the result that the more the number of cycles of the heat shock the smaller the sound pressure. By contrast, the FIG. 75 embodiment exhibits little change of the sound pressure, according to the data of the sample No. 2 standing for the example wherein the resistive paste 410 is selected to be 1 kΩ. Likewise, the FIG. 74 embodiment with the fixed resistive element 409 selected to be 100 kΩ is shown as sample No. 3. In the FIG. 77 embodiment, the example with the resistance value between the terminals 414 and 415 of the resistive plate 413 selected to be 10 MΩ is shown as sample No. 4. The FIG. 75 embodiment with the resistance selected to be 10 MΩ is shown as sample No. 5 and the FIG. 77 embodiment with the resistance value between the terminals 414 and 415 of the resistive plate 413 selected to be 1000 MΩ is shown as sample No. 6. It would be appreciated that a change of the sound pressure of these sample Nos. 2 to 6 in Table 6 has been clearly and assuredly improved as compared with that of the conventional one shown in FIG. 73, i.e. sample No. 1.

Figure 78:
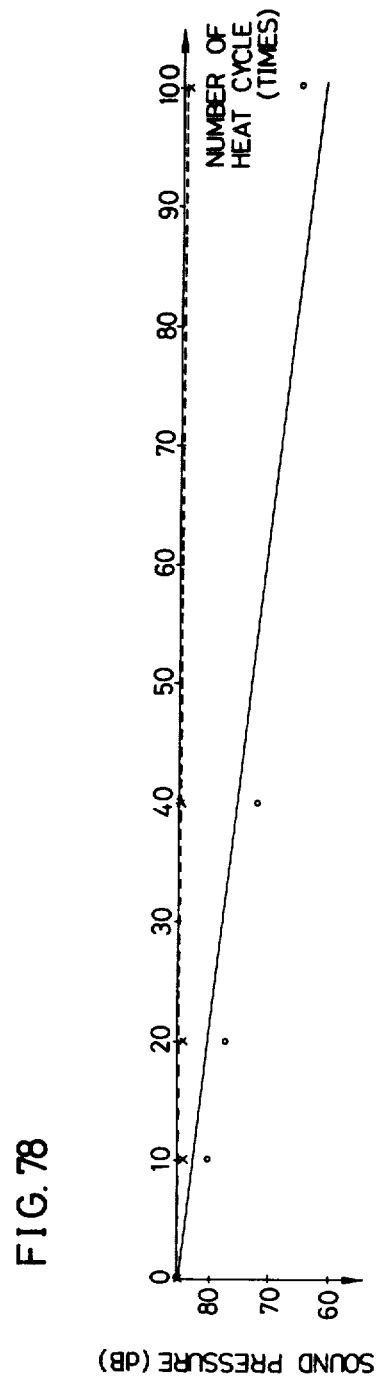
FIG. 78 is a graph showing a sound pressure variation of a 2-terminal type piezoelectric buzzer in accordance with one embodiment of the present invention and a conventional 2-terminal type piezoelectric buzzer.

FIG. 78 is a graph prepared based on the data shown in Table 6 and showing a change of the sound pressure between sample No. 6, i.e. the FIG. 77 embodiment with the resistance value between the terminals 414 and 415 of the resistive plate 413 selected to be 1000 MΩ (shown by the dotted curve) and sample No. 1, i.e. the conventional one shown in FIG. 73 (shown by the solid curve).

It is important that the resistance value of the fixed resistor 409 in the FIG. 74 embodiment, the resistance value of the resistive paste 410 in the FIG. 75 embodiment, and the resistance value between the terminals 414 and 415 of the resistive plate 413 of the FIG. 77 embodiment are all selected to be smaller than the resistance value between the electrodes 405 and 406 of the piezoelectric ceramic plate 411. Furthermore, in the case of the FIG. 76 embodiment, it is important that the total sum of the resistance value of the respective electrodes 405 and 406 formed with the resistive paste and the resistance value of the silver paste 411 is selected to be smaller than the resistance value between the electrodes 405 and 406 of the piezoelectric ceramic plate 411. By evaluating the relation between the resistance value of the ceramic plate of various materials and the change of the electrical characteristic due to the heat shock test, it was uncovered that as the resistance value of the ceramic plate becomes smaller than a predetermined value the change of the electric characteristic due to the heat shock test becomes smaller. The reason is presumed to be that the electric charge of the counterelectric field opposite to the direction of the electric field on the occasion of polarization due to the pyroelectric effect is not stored on the electrodes opposed to each other on the ferroelectric ceramic plate but is naturally discharged through the internal path of the ceramic plate.

However, it has also been uncovered that as the resistance of the ceramic plate decreases as described above the piezoelectric property decreases and a diversification of the electric characteristic increases and accordingly it is required that another natural discharge way be considered without decreasing the resistance value of the piezoelectric ceramic plate itself. In other words, this means that it would be better to discharge the electric charge through the external path without discharging the electric charge through the internal path of the ceramic plate and accordingly the electrodes wherein the electric charge is generated may be connected by a resistance smaller than the resistance value of the internal path of the ceramic plate, including a case of the resistance being zero. However, in case of a structure wherein the vibrating electrode plane intersects the polarization direction, it is required that an inherent operation as the piezoelectric transducer is not hindered and there is a limitation to the decrease of the resistance value. Such lower limit value cannot be generally determined and need be determined on a case by case basis.

In the case of the heat shock test, when the temperature is shifted from the lower temperature (−55° C.) to the high temperature (+100° C.) an electric field is generated in the forward direction with respect to the polarization direction between the electrodes 405 and 406 on both sides of the plate 403 and when the temperature is shifted from the high temperature to the low temperature an electric field is generated in the reversed direction. It is presumed that the polarization of the plate 403 is lost due to such alternating electric field, whereby a decrease of the piezoelectric characteristic is caused. Therefore, in the above described embodiments, in order to decrease instantaneously such alternating electric field, the electrodes 405 and 406 on both surfaces intersecting the polarization direction of the plate 403 are electrically connected with a given resistance value.

Figure 79:
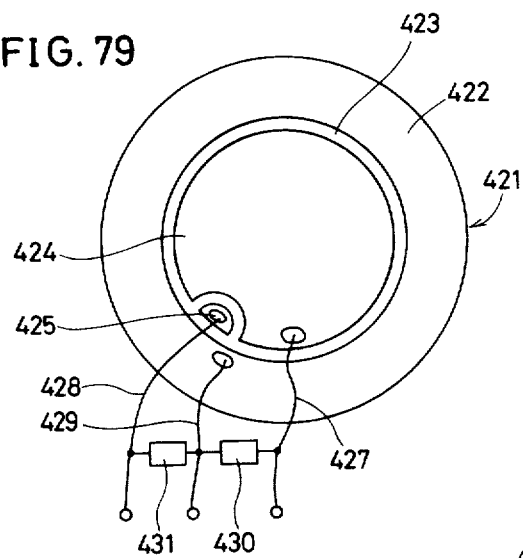
FIGS. 79 to 82 are views showing different examples of a 3-terminal type piezoelectric buzzer in accordance with another embodiment of the present invention.

FIG. 79 shows one example of a 3-terminal type piezoelectric buzzer in accordance with another embodiment of the present invention. Since such piezoelectric buzzer 421 itself is well-known to those skilled in the art, only those portions associated with the present invention will be briefly described in the following. The piezoelectric buzzer 421 is adapted for the vibration frequency of 3.050 kHz and comprises a piezoelectric ceramic plate 423 of 25 mm in diameter and 0.23 mm in thickness adhered concentrically on one surface of a metallic disc 422 of 35 mm in diameter and 0.48 mm in thickness. The electrode 424 of an approximately circular shape with a portion notched and another electrode 425 being positioned at the above described notched portion are formed on one main surface of the piezoelectric plate 423. The whole surface electrode 426 is formed on the other surface of the piezoelectric plate 423. The withdrawing leads 427, 428 and 429 are connected to the electrodes 424 and 425 and the metallic disc 422, respectively, by soldering. In the FIG. 79 embodiment, fixed resistors 430 and 431 are connected between the withdrawing leads 427 and 429 and between the withdrawing leads 428 and 429, respectively.

Figure 80:
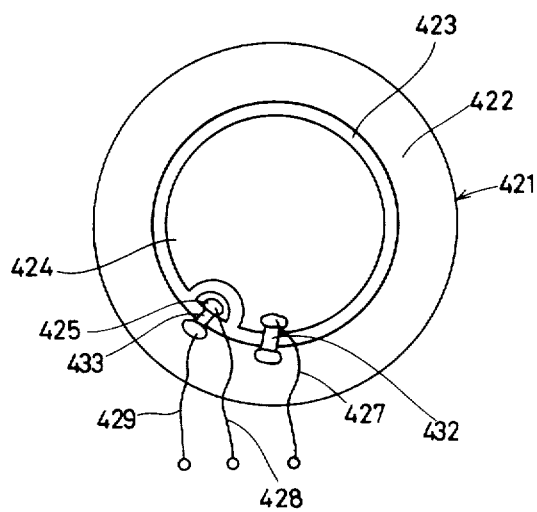
Figure 81:
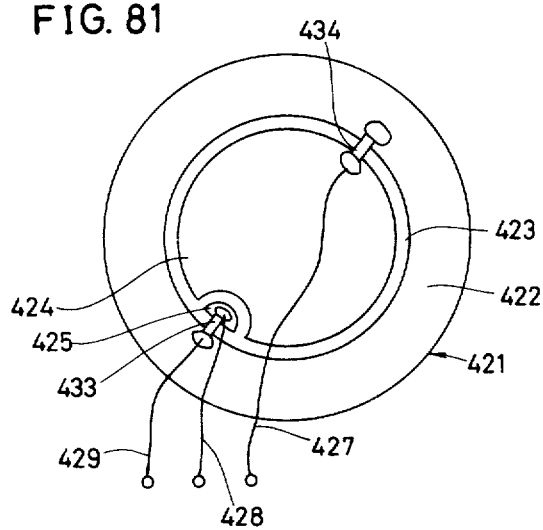
Figure 82:
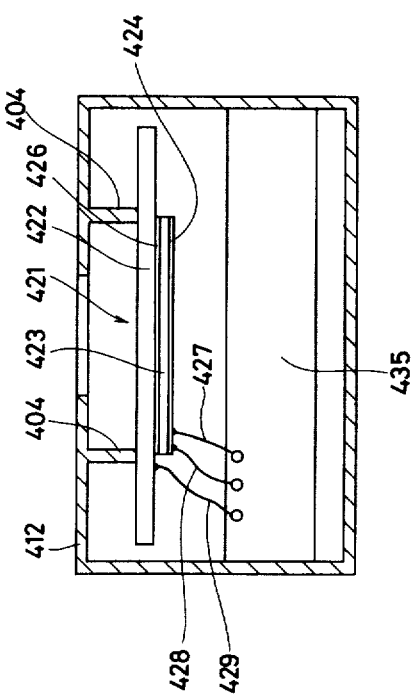

FIGS. 80, 81 and 82 show piezoelectric buzzers of another embodiment of the present invention.

In the FIG. 80 embodiment, the resistive paste 432 and 433 are formed over both surfaces of the plate 423, whereby the electrode 424 and the metallic disc 422 and thus the electrode 426, and the electrode 425 and the metallic disc 422 and thus the electrode 426 are electrically connected. Meanwhile, the resistive paste 432 is formed at the position shown as "434" in FIG. 81, whereby the electrodes 424 and 426 are connected by the resistive paste 434. In other words, the connection portion may be arbitrarily determined, insofar as the same is suited for the purpose of present invention. Accordingly, alternatively an example may be considered wherein the resistive paste is formed to cover the peripheral side surface.

In the embodiment shown in FIGS. 80 and 81, the electrodes 424 and 426 may be formed not as a silver electrode in accordance with an evaporation process or a sputtering process but may be formed with resistive metal (such as tantalum and titanium) or metal oxide (such as tin oxide and the like) in accordance with an evaporation process or a sputtering process. The silver paste (the resistance value being approximately zero) 432 and 433 or 434 and 433 are formed over both surfaces of the plate 423, whereby the electrode 424 and the metallic discs 422 and 425 and the metallic disc 422 are directly connected. As a matter of course, the electrodes may be short-circuited by means of the lead wires, not shown, in place of the silver pastes 432 and 433 or 434 and 433. These connection portions may be selected arbitrarily, insofar as the same are suited for the purpose of the present invention. Furthermore, the silver pastes 432 and 433 or 434 and 433, and the short-circuiting lead wires may be of a resistive component.

In the FIG. 82 embodiment, as in the case of the FIG. 77 embodiment, the case 412 and/or the plate 435 are formed using a resistive or semiconductive resin material. Furthermore, the case 412 and/or the plate 435 may be covered with a highly insulating and/or wet-proof resin material. In case of any of the embodiments, a point is that the electric charge generating electrodes need be connected with a resistance value smaller than the resistance value of the piezoelectric ceramic plate between the electric charge generating electrodes. In case of any of the embodiments, the heat shock test was conducted under the previously described conditions. The result of the test is shown in Table 7.

Table 7 shows the result of measurement of the characteristic of the 3-terminal type piezoelectric buzzer, i.e. the sound pressure, due to the heat shock test with respect to the number of test cycles. The measurement was made in such a state wherein the buzzer element is housed in the resonance case 412.

Sample No. 1 is the conventional device shown in FIG. 79 with the resistors 430 and 431 removed. Sample No. 2 is the FIG. 82 embodiment, with the resistance value selected to be 1 k$\Omega$. Sample No. 3 is the FIG. 80 embodiment, with the resistance value selected to be 100 k$\Omega$. The sample No. 4 is the FIG. 82 embodiment, with the resistance value selected to be 10 M$\Omega$. Sample No. 5 is the FIG. 79 embodiment, with the resistance value of the fixed resistive element selected to be 10 M$\Omega$. Sample No. 6 is the FIG. 80 embodiment, with the resistance value selected to be 1000 M$\Omega$.

As seen from Table 7, in the case where no shunt resistance is inserted at all, as conventionally, the greater the number of cycles the larger the change of the sound pressure. By contrast, as shown by samples Nos. 2 to 6, according to the present invention, an increase of the number of cycles does not entail so large a change of the sound pressure.

Figure 83:
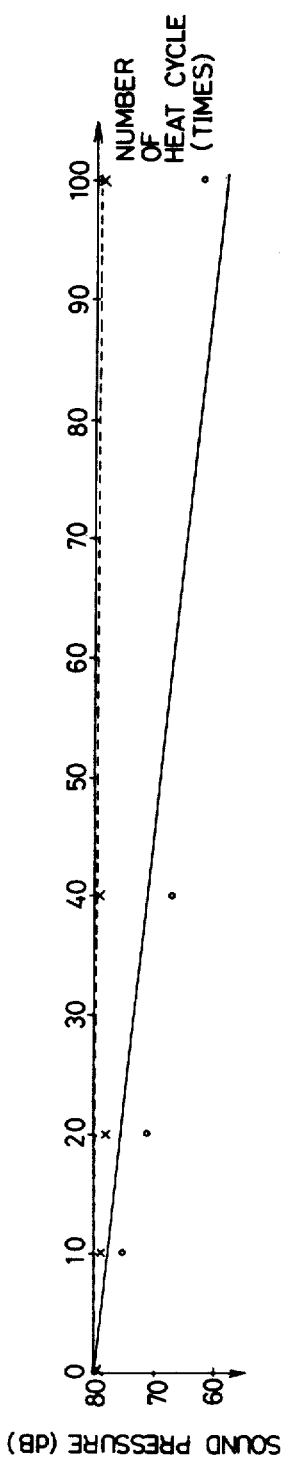
FIG. 83 is a graph showing a variation of a sound pressure of a 3-terminal type piezoelectric buzzer in accordance with another embodiment of the present invention and a conventional 3-terminal type piezoelectric buzzer.

FIG. 83 is the graph showing a change of the sound pressure with respect to the number of cycles, sample No. 1 and sample No. 3. As seen from FIG. 84, the conventional device (solid curve) exhibits a large change of the sound pressure after being subjected to the heat shock test for 100 cycles. By contrast, the present invention (shown by the dotted curve) exhibits little change of the sound pressure even after the same is subjected to the heat shock test for 100 cycles.

In the foregoing, the examples employing the baked resistor, discrete fixed resistive elements and so on as the resistance were shown. Furthermore, the example employing the resin serving as the resistance was also shown. However, it is pointed out that according to the present invention semiconductor glass, paste, semiconductor oxide powder paste, semiconductor resin and so on may be used as the resistance, and a point is that a resistance inserted state need be established from the standpoint of circuitry.

Furthermore, although in the above described embodiments the electrodes formed on both surfaces of the piezoelectric plate were electrically connected such that a resistance is substantially inserted therebetween, alternatively the respective electrodes may be electrically connected separately to the ground potential with a given resistance value, and the point is that the positive and negative electric charges generated due to the pyroelectric effect need be promptly decreased.

Although in the foregoing description there was shown the examples wherein the conductive members where the electric charge is stored are electrodes and the polarization axis direction is perpendicular to the plane of the piezoelectric ceramic plate where these electrodes are formed, further examples as described in the following may be considered.

Figure 84:
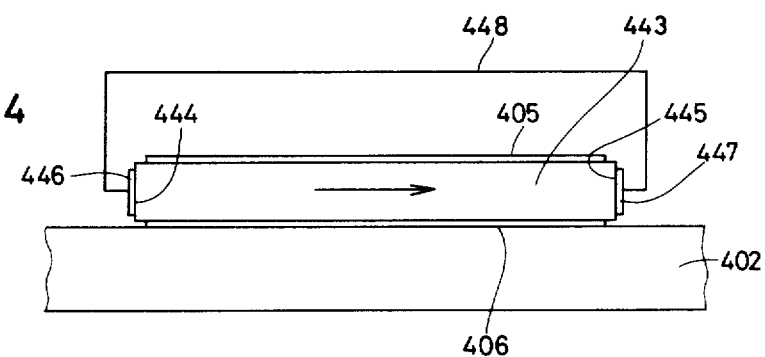
FIG. 84 is an outline side view of a piezoelectric transducer in accordance with another embodiment of the present invention.

FIG. 84 shows another structure of the electroacoustic transducer, wherein the polarization direction of the ferroelectric ceramic plate 443 is in parallel with the plane of the plate. In such a case, the ceramic plate 443 comprises a disc of 25 mm in diameter and 0.23 mm in thickness, and the resistance value between the surfaces vertical to the polarization direction, i.e. between the side surfaces 444 and 445 was $1\times10^{10}\Omega$. The electrodes 405 and 406 serving as one of the conductive members are formed on the opposing main surfaces of the ceramic plate 443. Furthermore, the electrodes 446 and 447 serving as the conductive members are also formed on the side surfaces 444 and 445 of the ceramic plate 443 in accordance with a conventionally well-known process. According to such structure, the conductive members where the electric charge due to a temperature change is stored mainly comprise the electrodes 446 and 447 and not the electrodes 405 and 406. Accordingly, for the purpose of applying the present invention, the electrodes 446 and 447 are connected by means of the short-circuiting lead wires 448, as shown, for example. The electrodes 446 and 447 may be electrically connected through a resistive component. In such a case, the electrodes 446 and 447 may be made of a material having a resistivity such as a resistive metal oxide material. Alternatively, the electrodes 446 and 447 may be electrically connected to the ground potential without being connected to each other.

It is pointed out that the present invention can be applied not only to a piezoelectric buzzer as in the above described embodiments but also to any type of electroacoustic transducer using a piezoelectric ceramic transducer. In the following, therefore, an application of the present invention to a typical electroacoustic transducer will be described.

Figure 85:
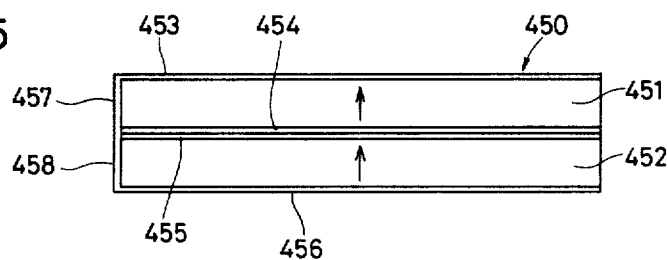
FIG. 85 is an outline side view of a bimorph vibrator in accordance with another embodiment of the present invention.

FIG. 85 shows a bimorph vibrator 450, which comprises two piezoelectric ceramic plates 451 and 452, wherein the electrodes 453 and 454 and the electrodes 455 and 456 formed on both main surfaces are connected by the resistive pastes 457 and 458, respectively. Of course, the previously described other embodiments may be employed.

Figure 86:
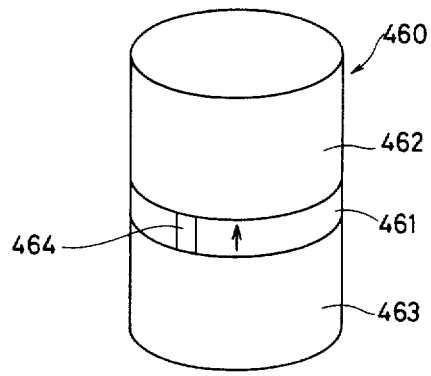
FIG. 86 is an outline perspective view of a Langevin type vibrator in accordance with another embodiment of the present invention.

FIG. 86 shows a Langevin type vibrator 460, wherein metallic posts 462 and 463 fixed to both main surfaces of the disc type piezoelectric ceramic plate 461 are connected by the resistive paste 464. Of course, the previously described other embodiments may also be employed. The Langevin type vibrator may be of a liquid-tight molded structure using rubber, resin or the like, and in such a case rubber, resin and the like may be preferably of a resistive component.

According to the present invention, a point is that the electric charge caused due to the pyroelectric effect in the piezoelectric transducer used in an electroacoustic transformer is to be discharged and therefore the present invention can be naturally applied to any other types of electroacoustic transducer not mentioned in the specification.

Meanwhile, in the case where the polarization axis direction is oblique with respect to the plane of the plate, the embodiment wherein the polarization axis direction is perpendicular to the plane of the plate and the embodiment wherein the polarization axis direction is in parallel with the plane of the plate may be suitably combined depending upon the magnitude of the electric charge generated due to a temperature change.

Meanwhile, in the above described embodiment, in the case that the potential difference decreasing means comprises a grounding means, both the first and second members were connected to the ground potential portion. However, the grounding means may comprise only one of the first and second members (such as an interdigital electrode, a ground electrode, a vibrating electrode or the like) connected to the ground potential portion.

Although the present invention has been described and illustrated in detail, it is clearly understood that the same is by way of illustration and example only and is not to be taken by way of limitation, the spirit and scope of the present invention being limited only by the terms of the appended claims.

TABLE 1

| Sample No. | Inserted Resistance Value | Number of Cycles | Insertion Loss $\overline{X}$ (dB) | R (dB) | Center Frequency $\overline{X}$ (MHz) | R (kHz) |
|---|---|---|---|---|---|---|
| 1 | None | 0 | 20.4 | 0.2 | 44.137 | 43 |
| 2 | | 5 | 21.1 | 0.2 | 44.110 | 48 |
| 3 | | 10 | 22.0 | 0.3 | 44.085 | 57 |
| 4 | | 20 | 23.5 | 0.5 | 44.028 | 71 |
| 5 | | 50 | 28.0 | 1.1 | 43.961 | 104 |
| 2-1 | Baked Resistor 1 k$\Omega$ | 0 | 20.7 | 0.2 | 44.097 | 40 |
| 2 | | 5 | 20.6 | 0.2 | 44.103 | 38 |
| 3 | | 10 | 20.6 | 0.2 | 44.105 | 35 |
| 4 | | 20 | 20.7 | 0.1 | 44.098 | 33 |
| 5 | | 50 | 20.8 | 0.2 | 44.090 | 36 |
| 3-1 | Baked Resistor 100 k$\Omega$ | 0 | 20.5 | 0.1 | 44.116 | 30 |
| 2 | | 5 | 20.5 | 0.2 | 44.110 | 37 |
| 3 | | 10 | 20.6 | 0.2 | 44.078 | 39 |
| 4 | | 20 | 20.6 | 0.2 | 44.083 | 40 |
| 5 | | 50 | 20.5 | 0.2 | 44.105 | 35 |
| 4-1 | Baked Resistor 10 M$\Omega$ | 0 | 20.8 | 0.2 | 44.103 | 28 |
| 2 | | 5 | 20.7 | 0.2 | 44.115 | 34 |
| 3 | | 10 | 20.7 | 0.2 | 44.119 | 24 |
| 4 | | 20 | 20.7 | 0.1 | 44.112 | 24 |
| 5 | | 50 | 20.7 | 0.1 | 44.109 | 26 |
| 5-1 | Fixed Resistor 10 M$\Omega$ | 0 | 20.3 | 0.2 | 44.128 | 40 |
| 2 | | 5 | 20.2 | 0.1 | 44.132 | 35 |
| 3 | | 10 | 20.4 | 0.1 | 44.120 | 39 |
| 4 | | 20 | 20.3 | 0.1 | 44.125 | 32 |
| 5 | | 50 | 20.3 | 0.1 | 44.126 | 33 |
| 6-1 | Baked Resistor 1000 M$\Omega$ | 0 | 20.6 | 0.1 | 44.124 | 26 |
| 2 | | 5 | 20.8 | 0.1 | 44.096 | 31 |
| 3 | | 10 | 20.7 | 0.2 | 44.105 | 34 |
| 4 | | 20 | 20.6 | 0.1 | 44.120 | 30 |
| 5 | | 50 | 20.6 | 0.2 | 44.108 | 37 |

TABLE 2

| Sample No. | Resistance Value of Adhesive Agent 3' | Resistance Value of Connection Material | Number of Cycles | Insertion Loss $\overline{X}$ (dB) | $\overline{R}$ (dB) | Center Frequency $\overline{X}$ (MHz) | R (kHz) |
|---|---|---|---|---|---|---|---|
| 1-1 | 1000 M$\Omega$ | None | 0 | 20.2 | 0.2 | 44.135 | 41 |
| 2 | | | 5 | 21.0 | 0.2 | 44.093 | 53 |
| 3 | | | 10 | 22.3 | 0.4 | 44.057 | 65 |
| 4 | | | 20 | 24.6 | 0.9 | 44.014 | 87 |
| 5 | | | 50 | 28.5 | 1.5 | 43.901 | 114 |
| 2-1 | 1 k$\Omega$ | Baked Resistor 1 $\Omega$ | 0 | 20.5 | 0.1 | 44.110 | 35 |
| 2 | | | 5 | 20.5 | 0.1 | 44.115 | 38 |
| 3 | | | 10 | 20.6 | 0.2 | 44.108 | 42 |
| 4 | | | 20 | 20.8 | 0.2 | 44.097 | 44 |
| 5 | | | 50 | 20.7 | 0.2 | 44.103 | 40 |
| 3-1 | 100 k$\Omega$ | Baked Resistor | 0 | 20.4 | 0.1 | 44.119 | 40 |
| 2 | | | 5 | 20.6 | 0.2 | 44.108 | 37 |

TABLE 2-continued

| Sample No. | Resistance Value of Adhesive Agent 3' | Resistance Value of Connection Material | Number of Cycles | Insertion Loss X̄ (dB) | Insertion Loss R (dB) | Center Frequency X̄ (MHz) | Center Frequency R (kHz) |
|---|---|---|---|---|---|---|---|
| 3 | | 100 kΩ | 10 | 20.6 | 0.2 | 44.111 | 35 |
| 4 | | | 20 | 20.7 | 0.2 | 44.102 | 42 |
| 5 | | | 50 | 20.8 | 0.2 | 44.110 | 41 |
| 4-1 | 10 MΩ | Baked | 0 | 20.3 | 0.1 | 44.126 | 29 |
| 2 | | Resistor | 5 | 20.3 | 0.1 | 44.127 | 33 |
| 3 | | 1000 MΩ | 10 | 20.4 | 0.2 | 44.127 | 31 |
| 4 | | | 20 | 20.4 | 0.1 | 44.124 | 38 |
| 5 | | | 50 | 20.4 | 0.2 | 44.122 | 36 |
| 5-1 | 10 MΩ | Fixed | 0 | 20.1 | 0.1 | 44.141 | 43 |
| 2 | | Resistor | 5 | 20.3 | 0.1 | 44.133 | 40 |
| 3 | | 10 MΩ | 10 | 20.3 | 0.2 | 44.130 | 37 |
| 4 | | | 20 | 20.5 | 0.2 | 44.125 | 36 |
| 5 | | | 50 | 20.7 | 0.2 | 44.114 | 39 |
| 6-1 | 1000 MΩ | Baked | 0 | 20.2 | 0.1 | 44.132 | 33 |
| 2 | | Silver | 5 | 20.5 | 0.2 | 44.123 | 35 |
| 3 | | 0 Ω | 10 | 20.4 | 0.2 | 44.127 | 39 |
| 4 | | | 20 | 20.4 | 0.1 | 44.128 | 31 |
| 5 | | | 50 | 20.5 | 0.2 | 44.120 | 36 |

TABLE 3

| Sample No. | Insertion Manner and Resistance Value | Number of Cycles | Thickness Δf X̄ (kHz) | Thickness Δf R (kHz) |
|---|---|---|---|---|
| 1-1 | None | 0 | 495 | 9 |
| 2 | (FIG. 35) | 10 | 484 | 15 |
| 3 | | 20 | 468 | 23 |
| 4 | | 40 | 447 | 36 |
| 5 | | 100 | 371 | 44 |
| 2-1 | Baked | 0 | 502 | 5 |
| 2 | Resistor | 10 | 500 | 6 |
| 3 | (FIG. 37) | 20 | 495 | 6 |
| 4 | 1 kΩ | 40 | 494 | 8 |
| 5 | | 100 | 491 | 10 |
| 3-1 | Fixed | 0 | 510 | 8 |
| 2 | Resistor | 10 | 507 | 8 |
| 3 | (FIG. 36) | 20 | 504 | 9 |
| 4 | 100 kΩ | 40 | 500 | 9 |
| 5 | | 100 | 498 | 11 |
| 4-1 | Resin | 0 | 505 | 10 |
| 2 | Coated | 10 | 503 | 10 |
| 3 | (FIG. 39) | 20 | 500 | 9 |
| 4 | 10 MΩ | 40 | 497 | 11 |
| 5 | | 100 | 495 | 12 |
| 5-1 | Baked | 0 | 497 | 7 |
| 2 | Resistor | 10 | 496 | 8 |
| 3 | (FIG. 37) | 20 | 494 | 10 |
| 4 | 10 MΩ | 40 | 491 | 10 |
| 5 | | 100 | 490 | 11 |
| 6-1 | Resin | 0 | 503 | 6 |
| 2 | Coated | 10 | 501 | 8 |
| 3 | (FIG. 39) | 20 | 499 | 9 |
| 4 | 1000 MΩ | 40 | 495 | 11 |
| 5 | | 100 | 492 | 12 |

TABLE 4

| Sample No. | Insertion Manner and Resistance Value | Number of Cycles | Insertion Loss X̄ (dB) | Insertion Loss R (dB) | Center Frequency X̄ (MHz) | Center Frequency R (kHz) |
|---|---|---|---|---|---|---|
| 1-1 | None | 0 | 13.4 | 0.2 | 10.699 | 25 |
| 2 | | 10 | 14.1 | 0.5 | 10.680 | 30 |
| 3 | | 20 | 14.7 | 0.9 | 10.663 | 41 |
| 4 | | 40 | 16.2 | 1.3 | 10.627 | 68 |
| 5 | | 100 | 19.8 | 1.8 | 10.546 | 83 |
| 2-1 | Resin | 0 | 13.7 | 0.3 | 10.693 | 27 |
| 2 | Coated | 10 | 13.8 | 0.3 | 10.690 | 26 |
| 3 | 1 kΩ | 20 | 13.9 | 0.2 | 10.687 | 25 |
| 4 | | 40 | 13.9 | 0.3 | 10.687 | 26 |
| 5 | | 100 | 14.0 | 0.3 | 10.685 | 27 |
| 3-1 | Baked | 0 | 13.5 | 0.2 | 10.697 | 23 |
| 2 | Resistor | 10 | 13.5 | 0.2 | 10.696 | 24 |
| 3 | 100 kΩ | 20 | 13.6 | 0.3 | 10.694 | 26 |
| 4 | | 40 | 13.8 | 0.3 | 10.690 | 26 |
| 5 | | 100 | 13.8 | 0.3 | 10.691 | 26 |
| 4-1 | Resin | 0 | 13.3 | 0.1 | 10.704 | 18 |
| 2 | Coated | 10 | 13.4 | 0.1 | 10.700 | 20 |
| 3 | 10 MΩ | 20 | 13.6 | 0.2 | 10.695 | 23 |
| 4 | | 40 | 13.7 | 0.2 | 10.690 | 22 |
| 5 | | 100 | 13.9 | 0.2 | 10.688 | 25 |
| 5-1 | Fixed | 0 | 13.0 | 0.2 | 10.715 | 23 |
| 2 | Resistor | 10 | 13.2 | 0.2 | 10.707 | 24 |
| 3 | 10 MΩ | 20 | 13.5 | 0.3 | 10.699 | 25 |
| 4 | | 40 | 13.6 | 0.3 | 10.696 | 27 |
| 5 | | 100 | 13.7 | 0.3 | 10.692 | 26 |
| 6-1 | Baked | 0 | 13.2 | 0.2 | 10.708 | 22 |
| 2 | Resistor | 10 | 13.3 | 0.2 | 10.704 | 23 |
| 3 | 1000 MΩ | 20 | 13.5 | 0.3 | 10.700 | 26 |
| 4 | | 40 | 13.7 | 0.2 | 10.696 | 25 |
| 5 | | 100 | 13.8 | 0.2 | 10.690 | 25 |

TABLE 5

| Sample No. | Insertion Manner and Resistance Value | Number of Cycles | Tuning Fork Characteristic Loss (dB) X̄ | Tuning Fork Characteristic fr (kHz) X̄ |
|---|---|---|---|---|
| 1-1 | None | 0 | 8.5 | 900.02 |
| 2 | (FIG. 62) | 10 | 8.6 | 899.72 |
| 3 | | 20 | 8.7 | 899.51 |
| 4 | | 40 | 8.9 | 899.20 |
| 5 | | 100 | 9.1 | 898.97 |
| 2-1 | Baked | 0 | 8.5 | 900.53 |
| 2 | Resistor | 10 | 8.4 | 900.57 |
| 3 | (FIG. 65) | 20 | 8.5 | 900.55 |
| 4 | 1 kΩ | 40 | 8.5 | 900.54 |
| 5 | | 100 | 8.5 | 900.55 |
| 3-1 | Fixed | 0 | 8.5 | 900.24 |
| 2 | Resistor | 10 | 8.5 | 900.20 |
| 3 | (FIG. 64) | 20 | 8.5 | 900.25 |
| 4 | 100 kΩ | 40 | 8.5 | 900.23 |
| 5 | | 100 | 8.6 | 900.18 |
| 4-1 | Resistive | 0 | 8.4 | 899.95 |
| 2 | Resin Base | 10 | 8.4 | 899.97 |
| 3 | (FIG. 67) | 20 | 8.3 | 900.01 |
| 4 | 10 MΩ | 40 | 8.4 | 899.94 |
| 5 | | 100 | 8.4 | 899.93 |
| 5-1 | Baked | 0 | 8.5 | 901.02 |
| 2 | Resistor | 10 | 8.5 | 901.00 |

TABLE 5-continued

| Sample No. | Insertion Manner and Resistance Value | Number of Cycles | Tuning Fork Characteristic Loss (dB) X | Tuning Fork Characteristic fr (kHz) X |
| --- | --- | --- | --- | --- |
| 3 | (FIG. 65) | 20 | 8.4 | 901.06 |
| 4 | 10 MΩ | 40 | 8.4 | 901.07 |
| 5 | | 100 | 8.4 | 901.07 |
| 6-1 | Resistive | 0 | 8.4 | 900.71 |
| 2 | Resin Base | 10 | 8.4 | 900.70 |
| 3 | (FIG. 67) | 20 | 8.5 | 900.65 |
| 4 | 1000 MΩ | 40 | 8.5 | 900.67 |
| 5 | | 100 | 8.4 | 900.69 |

TABLE 6

| Sample No. | Insertion Manner and Resistance Value | Number of Cycles | Buzzer Characteristic Sound Pressure (dB) |
| --- | --- | --- | --- |
| 1-1 | None | 0 | 85 |
| 2 | (FIG. 73) | 10 | 80 |
| 3 | | 20 | 77 |
| 4 | | 40 | 72 |
| 5 | | 100 | 65 |
| 2-1 | Baked | 0 | 87 |
| 2 | Resistor | 10 | 87 |
| 3 | (FIG. 75) | 20 | 86 |
| 4 | 1 kΩ | 40 | 86 |
| 5 | | 100 | 86 |
| 3-1 | Fixed | 0 | 84 |
| 2 | Resistor | 10 | 85 |
| 3 | (FIG. 74) | 20 | 85 |
| 4 | 100 kΩ | 40 | 85 |
| 5 | | 100 | 84 |
| 4-1 | Resistive | 0 | 86 |
| 2 | Plate 13 | 10 | 87 |
| 3 | (FIG. 77) | 20 | 86 |
| 4 | 10 MΩ | 40 | 86 |
| 5 | | 100 | 86 |
| 5-1 | Baked | 0 | 86 |
| 2 | Resistor | 10 | 85 |
| 3 | (FIG. 75) | 20 | 86 |
| 4 | 10 MΩ | 40 | 85 |
| 5 | | 100 | 85 |
| 6-1 | Resistive | 0 | 85 |
| 2 | Plate 13 | 10 | 84 |
| 3 | (FIG. 77) | 20 | 84 |
| 4 | 1000 MΩ | 40 | 85 |
| 5 | | 100 | 84 |

TABLE 7

| Sample No. | Insertion Manner and Resistance Value | Number of Cycles | Buzzer Characteristic Sound Pressure (dB) |
| --- | --- | --- | --- |
| 1-1 | None | 0 | 80 |
| 2 | | 10 | 75 |
| 3 | | 20 | 71 |
| 4 | | 40 | 67 |
| 5 | | 100 | 62 |
| 2-1 | Resistive | 0 | 81 |
| 2 | Plate 35 | 10 | 80 |
| 3 | 1 kΩ | 20 | 80 |
| 4 | | 40 | 81 |
| 5 | | 100 | 81 |
| 3-1 | Baked | 0 | 70 |
| 2 | Resistor | 10 | 79 |
| 3 | 100 kΩ | 20 | 78 |
| 4 | | 40 | 79 |
| 5 | | 100 | 79 |
| 4-1 | Resistive | 0 | 79 |
| 2 | Plate 35 | 10 | 79 |
| 3 | 10 MΩ | 20 | 79 |
| 4 | | 40 | 78 |
| 5 | | 100 | 78 |
| 5-1 | Fixed | 0 | 82 |
| 2 | Resistor | 10 | 81 |
| 3 | 10 MΩ | 20 | 81 |
| 4 | | 40 | 82 |
| 5 | | 100 | 81 |
| 6-1 | Baked | 0 | 81 |
| 2 | Resistor | 10 | 80 |
| 3 | 1000 MΩ | 20 | 80 |
| 4 | | 40 | 80 |
| 5 | | 100 | 80 |

What is claimed is:

1. A surface acoustic wave device, comprising:
   a ferroelectric plate which is polarized in a polarization axis direction and which has first and second opposing surfaces intersecting said polarization axis direction;
   an interdigital electrode formed on said first surface of said ferroelectric plate such that an acoustic wave propagation region is defined on said plate; and
   a resin layer covering said ferroelectric plate, said resin layer being in direct contact with substantially all exposed surfaces of said plate except said acoustic wave propagation region such that a gap is formed between said plate and said resin layer in said propagation region;
   said resin layer including a resistive resin material which shunts an electric charge produced by the pyroelectric effect on said first and second surfaces of said ferroelectric plate.

2. A surface acoustic wave device in accordance with claim 1, wherein the resistance value of said resistive resin layer is smaller than the inherent resistance of said ferroelectric plate in said polarization axis direction.

3. A surface acoustic wave device in accordance with claim 2, which further comprises an anti-humidity insulating resin layer covering said resistive resin layer.

4. A surface acoustic wave device in accordance with any one of claims 1, 2 or 3, which further comprises:
   a ground electrode formed on said second surface of said ferroelectric plate; and
   at least first and second withdrawing terminals connected to said interdigital electrodes and said ground electrode, respectively;
   said ground electrode being covered with said resistive resin layer such that an electric charge caused by the pyroelectric effect on said interdigital electrode is discharged to ground potential through said resistive resin layer and said withdrawing terminals.

5. A surface acoustic wave device, comprising:
   (A) a surface acoustic wave element including:
   (1) a ferroelectric plate which is polarized in a polarization axis direction and which has first and second opposing surfaces intersecting said polarization axis direction;
   (2) an interdigital electrode and a ground electrode formed on said first and second surfaces, respectively, such that an acoustic wave propagation region is defined on said plate;
   (3) at least first and second withdrawing terminals connected to said interdigital electrode and said ground electrode, respectively; and (4) a resin layer covering a portion of said withdrawing terminals and said ferroelectric plate, said resin layer being in direct contact with substantially all exposed surfaces of said piezoelectric plate except said acoustic wave propagation region such that a gap is formed between said plate and said resin layer in said region;

(B) a metallic case receiving said surface acoustic wave element; and (C) a resistive filler material located between said surface acoustic wave element and said metallic case and in electrical contact with said withdrawing terminals such that an electric charge stored on said interdigital electrode due to the pyroelectric effect will be discharged to ground through said withdrawing terminals and said filler material.

6. A surface acoustic wave device in accordance with claim 5, wherein the resistance value of said filler material is smaller than the inherent resistance of said ferroelectric plate in said polarization axis direction.

7. A surface acoustic wave device, comprising:
a ferroelectric plate which is polarized in a polarization axis direction and which has first and second opposed main surfaces which are parallel to said polarization axis direction and which also has first and second opposing side surfaces intersecting said polarization axis direction;
an interdigital electrode formed on at least one of said first and second main surfaces;
first and second members formed in electrical contact with said first and second side surfaces, respectively; and
connecting means for electrically connecting said first and second members such that an electric charge stored in said first and second members due to the pyroelectric effect will be shunted through said connecting means.

8. A surface acoustic wave device in accordance with claim 7, wherein:
said first and second members comprise side electrodes; and
said connecting means is adapted to directly connect said side electrodes.

9. A surface acoustic wave device in accordance with claim 7, wherein:
said first and second members comprise electrodes; and
said connecting means is adapted to connect said side electrodes through a predetermined resistance.

10. A surface acoustic wave device in accordance with claim 7, wherein said connecting means connects said first and second members to ground potential, whereby the electric charge due to said pyroelectric effect flows to said ground potential.

11. A surface acoustic wave device in accordance with claim 7, wherein:
said first and second members comprise respective side electrodes and at least one of said side electrodes comprises a resistive material; and
said connecting means directly connects said side electrodes.

12. A surface acoustic wave device, comprising:
a ferroelectric plate which is polarized in a polarization axis direction and which has first and second opposed surfaces which intersect said polarization axis direction;
an interdigital electrode and a ground electrode formed on said first and second surfaces, respectively, at least one of said interdigital electrode and said ground electrode being formed of a resistive material; and
connecting means for connecting said interdigital electrode and said ground electrode such that an electric charge stored in said interdigital electrode due to the pyroelectric effect will be shunted through said at least one electrode which comprises a resistive material and through said connecting means.

13. A surface acoustic wave device in accordance with claim 12, wherein the resistance of said at least one electrode where said electric charge flows is smaller than the inherent resistance of said ferroelectric plate in said polarization axis direction.

14. A surface acoustic wave device in accordance with claim 13, wherein said connecting means directly connects said interdigital electrode and said ground electrode.

15. A surface acoustic wave device, comprising:
a ferroelectric plate which is polarized in a polarization axis direction and which has first and second opposing surfaces which intersect said polarization axis direction;
an interdigital electrode formed on at least one of said first and second surfaces of said ferroelectric plate;
a hermetic base including a conductive material on which said ferroelectric plate is fixed; and
a resistive paste formed between said hermetic base and said interdigital electrode to shunt the ferroelectric charge formed between said first and second surfaces.

16. A surface acoustic wave device, comprising:
a ferroelectric plate which is polarized in a polarization axis direction and which has first and second opposing surfaces which intersect said polarization axis direction;
an interdigital electrode and a shield electrode formed on said first surface of said ferroelectric plate;
a ground electrode formed on said second surface of said ferroelectric plate; and
a resistive paste formed between said shield electrode and said ground electrode such that an electric charge formed on said two surfaces of said ferroelectric plate due to the pyroelectric effect will be shunted through said resistive paste.

17. A surface acoustic wave device, comprising:
a ferroelectric plate which is polarized in a polarization axis direction and which has first and second opposing surfaces which intersect said polarization axis direction;
an interdigital electrode formed on at least one of said first and second surfaces of said ferroelectric plate;
a hermetic base including a conductive material on which said ferroelectric plate is fixed, said base having a throughhole formed therein;
a conductive terminal which is inserted in said throughhole in said hermetic base, said terminal being electrically connected to said interdigital electrode; and
a resistive material formed between said hermetic base and said terminal inserted in said throughhole to shunt the ferroelectric charge formed between said first and second surfaces.

* * * * *